United States Patent
Hwang et al.

(10) Patent No.: US 12,388,419 B2
(45) Date of Patent: Aug. 12, 2025

(54) BULK ACOUSTIC RESONATOR FILTER AND BULK ACOUSTIC RESONATOR PACKAGE

(71) Applicant: Samsung Electro-Mechanics Co., Ltd., Suwon-si (KR)

(72) Inventors: Hyun Min Hwang, Suwon-si (KR); Jeong Hoon Ryou, Suwon-si (KR); Jae Goon Aum, Suwon-si (KR); Dong Hoe Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 481 days.

(21) Appl. No.: 17/850,960

(22) Filed: Jun. 27, 2022

(65) Prior Publication Data

US 2023/0107650 A1 Apr. 6, 2023

(30) Foreign Application Priority Data

Oct. 5, 2021 (KR) .......................... 10-2021-0131853
Mar. 17, 2022 (KR) .......................... 10-2022-0033164

(51) Int. Cl.
*H03H 9/60* (2006.01)
*H03H 9/13* (2006.01)
*H03H 9/205* (2006.01)

(52) U.S. Cl.
CPC .............. *H03H 9/605* (2013.01); *H03H 9/13* (2013.01); *H03H 9/205* (2013.01)

(58) Field of Classification Search
CPC ........... H03H 9/605; H03H 9/13; H03H 9/205
See application file for complete search history.

(56) References Cited

U.S. PATENT DOCUMENTS

| | | |
|---|---|---|
| 6,909,340 B2 | 6/2005 | Aigner et al. |
| 2007/0120624 A1 | 5/2007 | Milsom et al. |

(Continued)

FOREIGN PATENT DOCUMENTS

| | | |
|---|---|---|
| JP | 2003-536341 A | 12/2003 |
| JP | 5229945 B2 | 7/2013 |

(Continued)

OTHER PUBLICATIONS

S. Kreuzer et al., "Improvement of Non-linear Performance in BAW Filters using Balancing Capacitors," 2017 IEEE International Ultrasonics Symposium (IUS 2017), 2017, pp. 1-3, conference held Sep. 6-9, 2017, Washington, D.C., paper presented on Sep. 8, 2017.

(Continued)

*Primary Examiner* — Samuel S Outten
(74) *Attorney, Agent, or Firm* — NSIP Law

(57) ABSTRACT

A bulk acoustic resonator filter includes a series part including at least one series acoustic resonator electrically connected between a first and second radio frequency ports; and shunt acoustic resonators electrically connected to each other in series between a first node of the series part and a first ground port, wherein each of the shunt acoustic resonators comprises a resonance portion including a first electrode, a piezoelectric layer, and a second electrode; and an overlap region in which the first electrode, the piezoelectric layer, and the second electrode overlap, the overlap region has an aspect ratio equal to a ratio between a longest length of the overlap region in an extension direction of a longest side of the overlap region and a longest length of the overlap region in a direction perpendicular to the extension direction, and the aspect ratios of the shunt acoustic resonators include different aspect ratios.

41 Claims, 35 Drawing Sheets

(56) References Cited

U.S. PATENT DOCUMENTS

| | | |
|---|---|---|
| 2010/0060384 A1 | 3/2010 | Taniguchi et al. |
| 2013/0147678 A1* | 6/2013 | Taniguchi .............. H03H 9/706 |
| | | 343/858 |
| 2018/0006631 A1* | 1/2018 | Kida ...................... H03H 9/205 |
| 2020/0119716 A1 | 4/2020 | Kim et al. |
| 2021/0036683 A1 | 2/2021 | Han et al. |
| 2021/0098683 A1* | 4/2021 | Iwabuchi ............. H10N 30/883 |

FOREIGN PATENT DOCUMENTS

| | | |
|---|---|---|
| KR | 10-1323447 B1 | 10/2013 |
| KR | 10-2020-0041571 A | 4/2020 |
| KR | 10-2021-0015612 A | 2/2021 |
| WO | WO 01/99276 A1 | 12/2001 |

OTHER PUBLICATIONS

Korean Office Action issued on Mar. 27, 2024, in counterpart Korean Patent Application No. 10-2022-0033164 (6 pages in English, 5 pages in Korean).

* cited by examiner

BULK ACOUSTIC RESONATOR FILTER AND BULK ACOUSTIC RESONATOR PACKAGE

CROSS-REFERENCE TO RELATED APPLICATIONS

This application claims the benefit under 35 USC 119(a) of Korean Patent Application No. 10-2021-0131853 filed on Oct. 5, 2021, and Korean Patent Application No. 10-2022-0033164 filed on Mar. 17, 2022, in the Korean Intellectual Property Office, the entire disclosures of which are incorporated herein by reference for all purposes.

BACKGROUND

1. Field

The present disclosure relates to a bulk acoustic resonator filter and a bulk acoustic resonator package.

2. Description of Related Art

With the recent rapid development of mobile communications devices and chemical and biological testing-related devices, demand for small and lightweight filters, oscillators, resonant elements, and acoustic resonant mass sensors used in such devices is increasing.

Acoustic resonators such as bulk acoustic wave (BAW) filters may be configured as a means of implementing such small and lightweight filters, oscillators, resonant elements, and acoustic resonance mass sensors, and may have a relatively small size and relatively good performance compared to dielectric filters, metal cavity filters, and waveguides. Therefore, acoustic resonators may be widely used in communications modules of modern mobile devices that require relatively good performance (e.g., a relatively wide pass bandwidth).

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator filter includes a series part including at least one series acoustic resonator electrically connected in series between a first radio frequency port and a second radio frequency port; and a plurality of shunt acoustic resonators electrically connected to each other in series between a first node of the series part and a first ground port, wherein each of the plurality of shunt acoustic resonators includes a resonance portion including a first electrode, a piezoelectric layer, and a second electrode stacked in a first direction; and an overlap region in which the first electrode, the piezoelectric layer, and the second electrode overlap each other, the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction, and the aspect ratios of the plurality of shunt acoustic resonators include different aspect ratios that are different from each other.

A difference between the different aspect ratios of the plurality of shunt acoustic resonators may reduce an antiresonant frequency difference between the plurality of shunt acoustic resonators.

An antiresonant frequency difference between the plurality of shunt acoustic resonators may be smaller than a resonant frequency difference between the plurality of shunt acoustic resonators.

The plurality of shunt acoustic resonators may be connected to each other through respective first electrodes or respective second electrodes, and an aspect ratio difference between the plurality of shunt acoustic resonators may increase as a connection length between the plurality of shunt acoustic resonators increases.

The aspect ratio of a shunt acoustic resonator electrically connected closest to the first ground port among the plurality of shunt acoustic resonators may be lower than the aspect ratio of a shunt acoustic resonator electrically connected farther from the first ground port among the plurality of shunt acoustic resonators.

The aspect ratio of the shunt acoustic resonator electrically connected farther from the first ground port may be about 2.4.

The aspect ratio of each of the plurality of shunt acoustic resonators may be higher than 1.3 and 6.6 or lower.

The aspect ratio of each of the plurality of shunt acoustic resonators may be higher than 1.3 and lower than 3.8.

Each of the at least one series acoustic resonator may include a resonance portion including a first electrode, a piezoelectric layer, and a second electrode stacked in the first direction, and an overlap region in which the first electrode, the piezoelectric layer, and the second electrode overlap each other, the overlap region of each of the at least one series acoustic resonator may have an aspect ratio equal to a ratio between a longest length of the overlap region in an extension direction of a longest side of the overlap region and a longest length of the overlap region in a direction perpendicular to the extension direction, and a symmetry of a shape of the overlap region of at least one shunt acoustic resonator among the plurality of shunt acoustic resonators may be higher than a symmetry of a shape of the overlap region of at least one series acoustic resonator among the at least one series acoustic resonator.

An aspect ratio of the at least one shunt acoustic resonator among the plurality of shunt acoustic resonators may be 4.8 or higher and 6.6 or lower.

Symmetries of shapes of overlap regions of the plurality of shunt acoustic resonators may include different symmetries that are different from each other, and an aspect ratio of a shunt acoustic resonator having a higher symmetry among the plurality of shunt acoustic resonators may be higher than an aspect ratio of a shunt acoustic resonator having a lower symmetry among the plurality of acoustic resonators.

The aspect ratio of the shunt acoustic resonator having the higher symmetry may be 4.8 or higher and 6.6 or lower, and the aspect ratio of the shunt acoustic resonator having the lower symmetry may be higher than 1.3 and lower than 3.8.

The plurality of shunt acoustic resonators may include a first shunt acoustic resonator, a second shunt acoustic resonator, and a third shunt acoustic resonator electrically connected to each other in series, the first and second shunt acoustic resonators may be connected to each other through respective first electrodes or respective second electrodes, the second and third shunt acoustic resonators may be connected to each other through respective first electrodes or respective second electrodes, and an aspect ratio difference between the first and second shunt acoustic resonators may be different from an aspect ratio difference between the second and third shunt acoustic resonators.

The plurality of shunt acoustic resonators may include a first shunt acoustic resonator and a second shunt acoustic resonator electrically connected to each other in series between the first node of the series part and the first ground port, the bulk acoustic resonator filter may further include a third shunt acoustic resonator and a fourth shunt acoustic resonator electrically connected to each other in series between the first node of the series part and the first ground port, each of the third and fourth shunt acoustic resonators may include a resonance portion including a first electrode, a piezoelectric layer, and a second electrode stacked in the first direction, and an overlap region in which the first electrode, the piezoelectric layer, and the second electrode overlap each other, the overlap region of each of the third and fourth shunt acoustic resonators may have an aspect ratio equal to a ratio between a longest length of the overlap region in an extension direction of a longest side of the overlap region and a longest length of the overlap region in a direction perpendicular to the extension direction, and the first and second shunt acoustic resonators electrically connected to each other in series may be electrically connected in parallel with the third and fourth shunt acoustic resonators electrically connected to each other in series.

One shunt acoustic resonator among the first and third shunt acoustic resonators may be electrically connected to the first ground port through the first electrode of the one shunt acoustic resonator, and another shunt acoustic resonator among the first and third shunt acoustic resonators may be electrically connected to the first ground port through the second electrode of the other shunt acoustic resonator.

Aspect ratios of the third and fourth shunt acoustic resonators may be different from each other, and an aspect ratio difference between the first and second shunt acoustic resonators may be different from an aspect ratio difference between the third and fourth shunt acoustic resonators.

The bulk acoustic resonator filter may further include a fifth shunt acoustic resonator and a sixth shunt acoustic resonator electrically connected to each other in series between a second node of the series part and a second ground port, each of the fifth and sixth shunt acoustic resonators may include a resonance portion including a first electrode, a piezoelectric layer, and a second electrode stacked in the first direction, and an overlap region in which the first electrode, the piezoelectric layer, and the second electrode overlap each other, the overlap region of each of the fifth and sixth shunt acoustic resonators may have an aspect ratio equal to a ratio between a longest length of the overlap region in an extension direction of a longest side of the overlap region and a longest length of the overlap region in a direction perpendicular to the extension direction, the at least one series acoustic resonator may include a series acoustic resonator electrically connected between the first and second nodes, the first and third shunt acoustic resonators may be electrically connected closer to the first ground port compared to the second and fourth shunt acoustic resonators, the fifth shunt acoustic resonator may be electrically connected closer to the second ground port compared to the sixth shunt acoustic resonator, a size of the overlap region of each of the first and third shunt acoustic resonators may be different from a size of the overlap region of the fifth shunt acoustic resonator, and a size of the overlap region of each of the second and fourth shunt acoustic resonators may be different from a size of the overlap region of the sixth shunt acoustic resonator.

In another general aspect, a bulk acoustic resonator filter includes a series part including at least one series acoustic resonator electrically connected in series between a first radio frequency port and a second radio frequency port; and a shunt part including a plurality of shunt acoustic resonators electrically connected between the series part and a ground, wherein each of the plurality of shunt acoustic resonators includes a resonance portion including a first electrode, a piezoelectric layer, and a second electrode stacked in a first direction; and an overlap region in which the first electrode, the piezoelectric layer, and the second electrode overlap each other, the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction, a first portion of the plurality of shunt acoustic resonators are electrically connected to the ground through a first electrode, and a second portion of the plurality of shunt acoustic resonators are electrically connected to the ground through a second electrode, and an aspect ratio of the first portion of the plurality of shunt acoustic resonators electrically connected to the ground through the first electrode is different from an aspect ratio of the second portion of the plurality of shunt acoustic resonators electrically connected to the ground through the second electrode.

A difference between the aspect ratio of the first portion of the plurality of shunt acoustic resonators electrically connected to the ground through the first electrode and the aspect ratio of the second portion of the plurality of shunt acoustic resonators electrically connected to the ground through the second electrode may reduce an antiresonant frequency difference between the plurality of shunt acoustic resonators.

An antiresonant frequency difference between the first portion of the plurality of shunt acoustic resonators electrically connected to the ground through the first electrode and the second portion of the plurality of shunt acoustic resonators electrically connected to the ground through the second electrode may be smaller than a resonant frequency difference between the first portion of the plurality of shunt acoustic resonators electrically connected to the ground through the first electrode and the second portion of the plurality of shunt acoustic resonators electrically connected to the ground through the second electrode.

A resonant frequency of the at least one series acoustic resonator may be higher than a resonant frequency of each of the plurality of shunt acoustic resonators, and a resonant frequency difference between the first portion of the plurality of shunt acoustic resonators electrically connected to the ground through the first electrode and the second portion of the plurality of shunt acoustic resonators electrically connected to the ground through the second electrode may be smaller than a resonant frequency difference between a highest resonant frequency among the resonant frequencies of the plurality of shunt acoustic resonators and the resonant frequency of the at least one series acoustic resonator.

The first portion of the plurality of shunt acoustic resonators electrically connected to the ground through the first electrode and the second portion of the plurality of shunt acoustic resonators electrically connected to the ground through the second electrode may be electrically connected between a first node of the series part and a ground port.

In another general aspect, a bulk acoustic resonator package includes a substrate; a cap facing the substrate; a plurality of acoustic resonators each including a first electrode, a piezoelectric layer, and a second electrode stacked in a first direction extending from the substrate toward the cap and disposed between the substrate and the cap; a metal layer connecting the plurality of acoustic resonators to each other; and a bonding member surrounding the plurality of acoustic resonators in a circumferential direction perpendicular to the first direction and bonding the cap to the substrate, wherein each of the plurality of acoustic resonators include a resonance portion in which the first electrode, the piezoelectric layer, and the second electrode are stacked in the first direction; and an overlap region in which the first electrode, the piezoelectric layer, and the second electrode overlap each other, the overlap region of each of the plurality of acoustic resonators has an aspect ratio equal to a ratio between a longest length of the overlap region in an extension direction of a longest side of the overlap region and a longest length of the overlap region in a direction perpendicular to the extension direction, and an aspect ratio of an acoustic resonator disposed closer to the bonding member among the plurality of acoustic resonators is lower than aspect ratios of other acoustic resonators disposed farther from the bonding member among the plurality of acoustic resonators.

An aspect ratio difference between two acoustic resonators among the plurality of acoustic resonators may increase as a connection length of the metal layer connecting the two acoustic resonators to each other increases.

An aspect ratio difference between two acoustic resonators among the plurality of acoustic resonators may increase as a separation distance between the metal layer connecting the two acoustic resonators to each other and the bonding member decreases.

The plurality of acoustic resonators may include a first acoustic resonator, a second acoustic resonator, a third acoustic resonator, and a fourth acoustic resonator, the first and second acoustic resonators may be connected to each other through a first portion of the metal layer, the third and fourth acoustic resonators may be connected to each other through a second portion of the metal layer, a connection length of the first portion of the metal layer connecting the first and second acoustic resonators to each other may be longer than a connection length of the second portion of the metal layer connecting the third and fourth acoustic resonators to each other, and an aspect ratio difference between the first and second acoustic resonators may be greater than an aspect ratio difference between the third and fourth acoustic resonators.

The plurality of acoustic resonators may include a first acoustic resonator, a second acoustic resonator, a third acoustic resonator, and a fourth acoustic resonator, the first and second acoustic resonators may be connected to each other through a first portion of the metal layer, the third and fourth acoustic resonators may be connected to each other through a second portion of the metal layer, a separation distance between the first portion of the metal layer connecting the first and second acoustic resonators to each other and the bonding member may be shorter than a separation distance between the second portion of the metal layer connecting the third and fourth acoustic resonators to each other and the bonding member, and an aspect ratio difference between the first and second acoustic resonators may be greater than an aspect ratio difference between the third and fourth acoustic resonators.

The plurality of acoustic resonators may include a first acoustic resonator, a second acoustic resonator, a third acoustic resonator, and a fourth acoustic resonator, the first and second acoustic resonators may be connected to each other through a first portion of the metal layer, the third and fourth acoustic resonators may be connected to each other through a second portion of the metal layer, the first portion of the metal layer connecting the first and second acoustic resonators to each other and the second portion of the metal layer connecting the third and fourth acoustic resonators to each other may be disposed at different heights relative to the substrate, and aspect ratios of the first and second acoustic resonators may be different from each other.

The plurality of acoustic resonators may include a first acoustic resonator, a second acoustic resonator, and a third acoustic resonator electrically connected to each other in series, the first acoustic resonator may be closest to the bonding member among the first acoustic resonator, the second acoustic resonator, and the third acoustic resonator, and an aspect ratio difference between the first and second acoustic resonators may be greater than an aspect ratio difference between the second and third acoustic resonators.

The bulk acoustic resonator package may further include a first radio frequency port and a second radio frequency port to which the plurality of acoustic resonators may be electrically connected by the metal layer, wherein the first radio frequency port may be disposed near a first side of the substrate, the second radio frequency port may be disposed near a second side of the substrate, and an acoustic resonator disposed closer to a third side of the substrate among the plurality of acoustic resonators may have a lower aspect ratio than other acoustic resonators disposed farther from the third side of the substrate among the plurality of acoustic resonators.

The bulk acoustic resonator package may further include a ground port to which the plurality of acoustic resonators are electrically connected by the metal layer, wherein an acoustic resonator having a lower aspect ratio among the plurality of acoustic resonators may be electrically connected closer to the ground port than other acoustic resonators electrically connected farther from the ground port among the plurality of acoustic resonators.

The bonding member may include a conductive ring.

The bulk acoustic resonator package may further include a shielding layer disposed on a surface of the cap facing the plurality of acoustic resonators and electrically connected to the bonding member.

In another general aspect, a bulk acoustic resonator includes a series part including at least one series acoustic resonator electrically connected in series between a first radio frequency port and a second radio frequency port; and a plurality of shunt acoustic resonators electrically connected to each other between a node of the series part and a ground port, wherein each of the plurality of shunt acoustic resonators may include a resonance portion including a first electrode, a piezoelectric layer, and a second electrode stacked in a first direction; and an overlap region in which the first electrode, the piezoelectric layer, and the second electrode overlap each other, the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction, the bulk acoustic resonator further includes a first metal layer electrically connected to the first electrodes of the plurality of shunt acoustic resonators; and a second metal layer electrically connected to the second electrodes of the plurality of shunt acoustic resonators, the plurality of shunt acoustic resonators include a first shunt acoustic resonator and a second shunt acoustic resonator electrically connected to each other in an anti-series connection in which the second metal layer electrically connects the second electrode of the first shunt acoustic resonator to the ground port, and the first metal layer electrically connects the first electrode of the second shunt acoustic resonator to the first electrode of the first shunt acoustic resonator, and the aspect ratio of the second shunt acoustic resonator is different from the aspect ratio of the first shunt acoustic resonator.

A difference between the aspect ratios of the first and second shunt acoustic resonators may offset a difference between parasitic impedances of the first and second shunt acoustic resonators.

The aspect ratio of the second shunt acoustic resonator may be higher than the aspect ratio of the first shunt acoustic resonator.

The aspect ratio of the second shunt acoustic resonator may be lower than the aspect ratio of the first shunt acoustic resonator.

The plurality of shunt acoustic resonators may further include a third shunt acoustic resonator and a fourth shunt acoustic resonator electrically connected to each other in an anti-series connection in which a portion of the first metal layer electrically connects the first electrode of the third shunt acoustic resonator to the second metal layer and the second metal layer electrically connects the portion of the first metal layer to the ground port, and the second metal layer electrically connects the second electrode of the fourth shunt acoustic resonator to the second electrode of the third shunt acoustic resonator, and the aspect ratio of the second shunt acoustic resonator may be equal to or substantially equal to the aspect ratio of the first shunt acoustic resonator.

In another general aspect, a bulk acoustic resonator includes a series part including at least one series acoustic resonator electrically connected in series between a first radio frequency port and a second radio frequency port; and a plurality of shunt acoustic resonators electrically connected to each other in parallel between a first node of the series part and a first ground port, wherein each of the plurality of shunt acoustic resonators includes a resonance portion including a first electrode, a piezoelectric layer, and a second electrode stacked in a first direction; and an overlap region in which the first electrode, the piezoelectric layer, and the second electrode overlap each other, the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction, the bulk acoustic resonator may further include a first metal layer electrically connected to the first electrodes of the plurality of shunt acoustic resonators; and a second metal layer electrically connected to the second electrodes of the plurality of shunt acoustic resonators, the plurality of shunt acoustic resonators include a first shunt acoustic resonator and a second shunt acoustic resonator electrically connected to each other in an anti-parallel connection in which the second metal layer electrically connects the second electrode of the first shunt acoustic resonator to the first ground port, and a portion of the first metal layer electrically connects the first electrode of the second shunt acoustic resonator to the second metal layer and the second metal layer electrically connects the portion of the first metal layer to the first ground port, and the aspect ratio of the second shunt acoustic resonator is different from the aspect ratio of the first shunt acoustic resonator.

A difference between the aspect ratios of the first and second shunt acoustic resonators may offset a difference between parasitic impedances of the first and second shunt acoustic resonators.

The aspect ratio of the second shunt acoustic resonator may be higher than the aspect ratio of the first shunt acoustic resonator.

The bulk acoustic resonator may further include a second plurality of shunt acoustic resonators electrically connected to each other in series between a second node of the series part and a second ground port, wherein each of the second plurality of shunt acoustic resonators may include a resonance portion including a first electrode, a piezoelectric layer, and a second electrode stacked in the first direction; and an overlap region in which the first electrode, the piezoelectric layer, and the second electrode overlap each other, the overlap region of each of the second plurality of shunt acoustic resonators may have an aspect ratio equal to a ratio between a longest length of the overlap region in an extension direction of a longest side of the overlap region and a longest length of the overlap region in a direction perpendicular to the extension direction, the at least one series acoustic resonator may include a series acoustic resonator electrically connected between the first and second nodes, the first metal layer may be further electrically connected to the first electrodes of the second plurality of shunt acoustic resonators, the second metal layer may be further electrically connected to the second electrodes of the second plurality of shunt acoustic resonators, the second plurality of shunt acoustic resonators may include a third shunt acoustic resonator and a fourth shunt acoustic resonator electrically connected to each other in an anti-series connection in which the second metal layer electrically connects the second electrode of the third shunt acoustic resonator to the second ground port, and the first metal layer electrically connects the first electrode of the fourth shunt acoustic resonator to the first electrode of the third shunt acoustic resonator, and the aspect ratio of the fourth shunt acoustic resonator may be equal to or substantially equal to the aspect ratio of the third shunt acoustic resonator.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
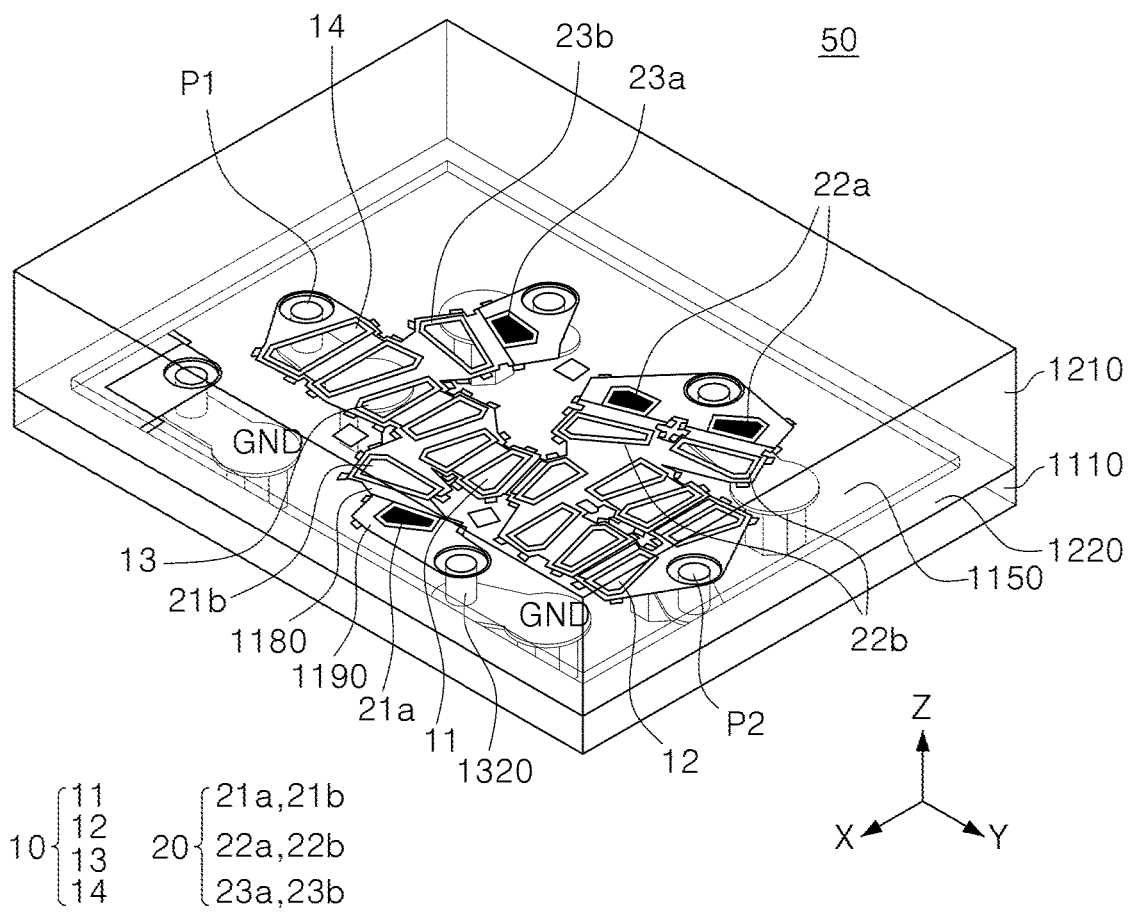
FIGS. 1A to 1C are perspective views illustrating a bulk acoustic resonator filter/package according to an embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Figure 1B:
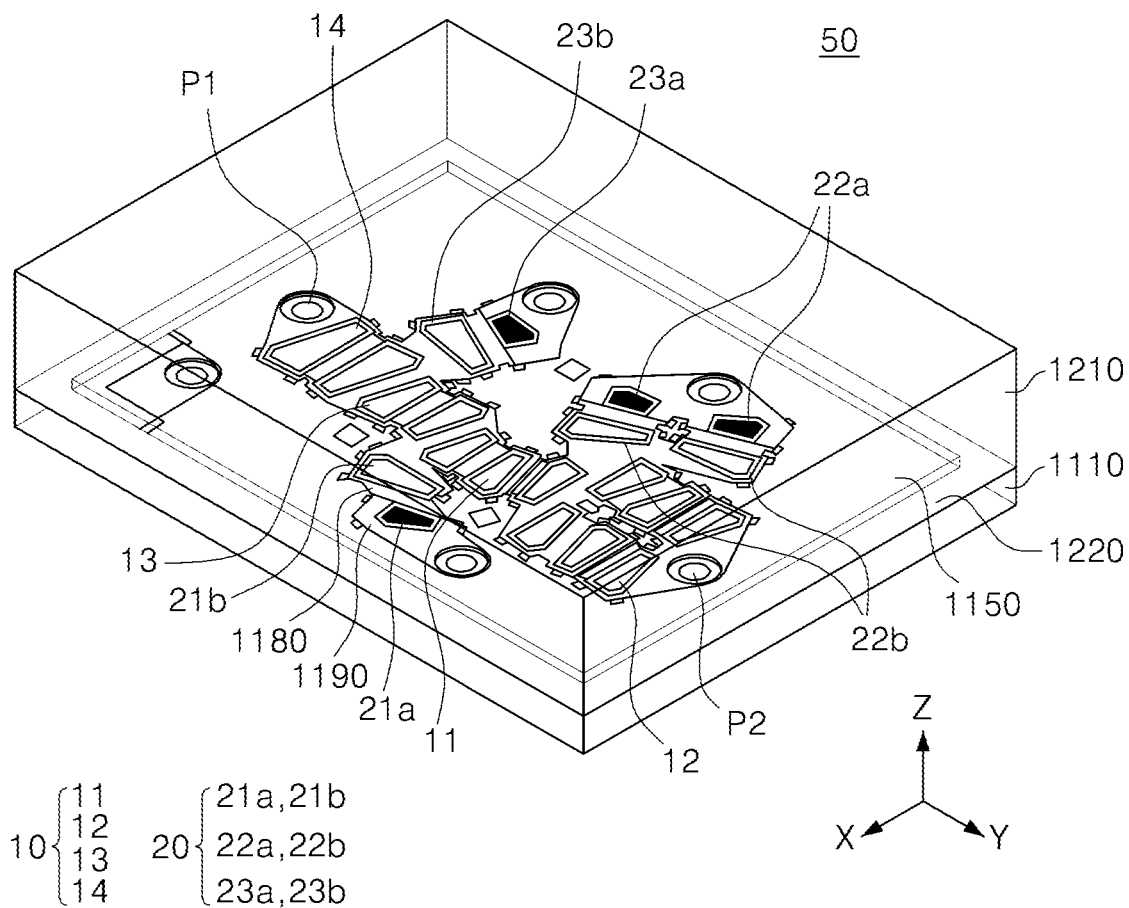
Figure 1C:
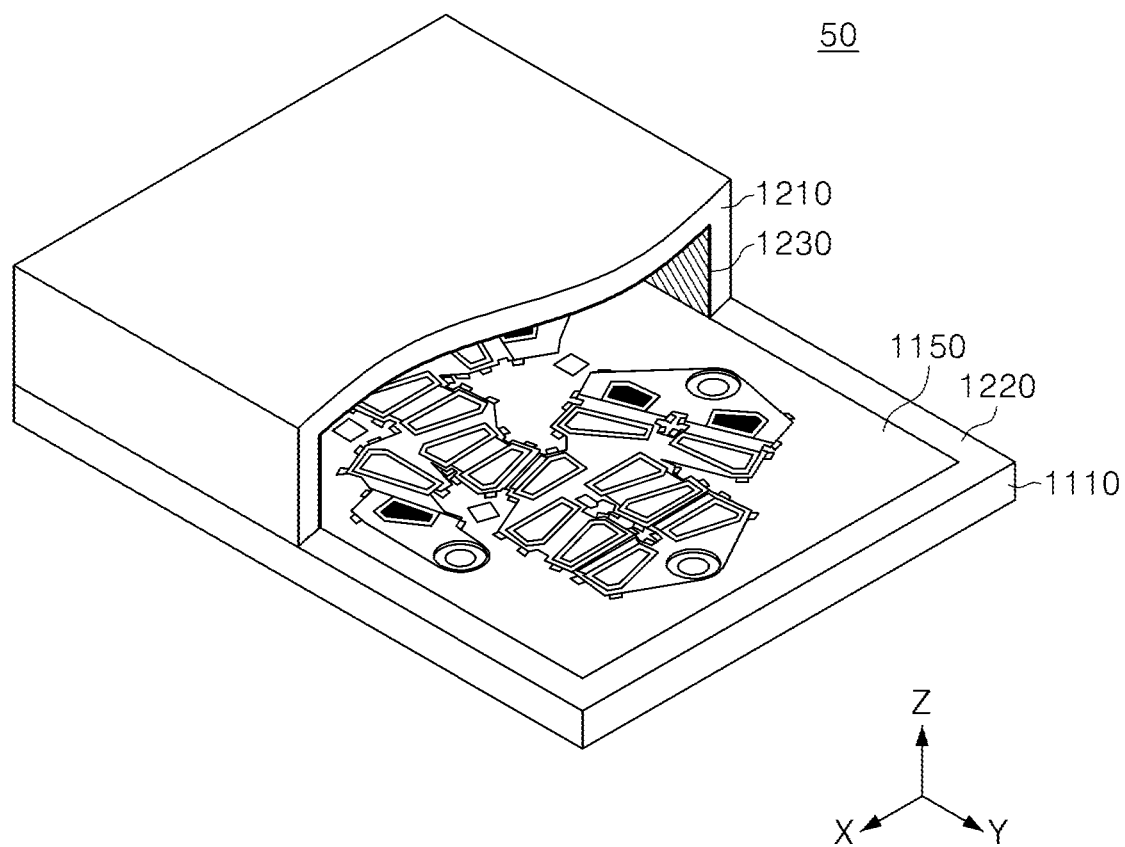
Figure 1D:
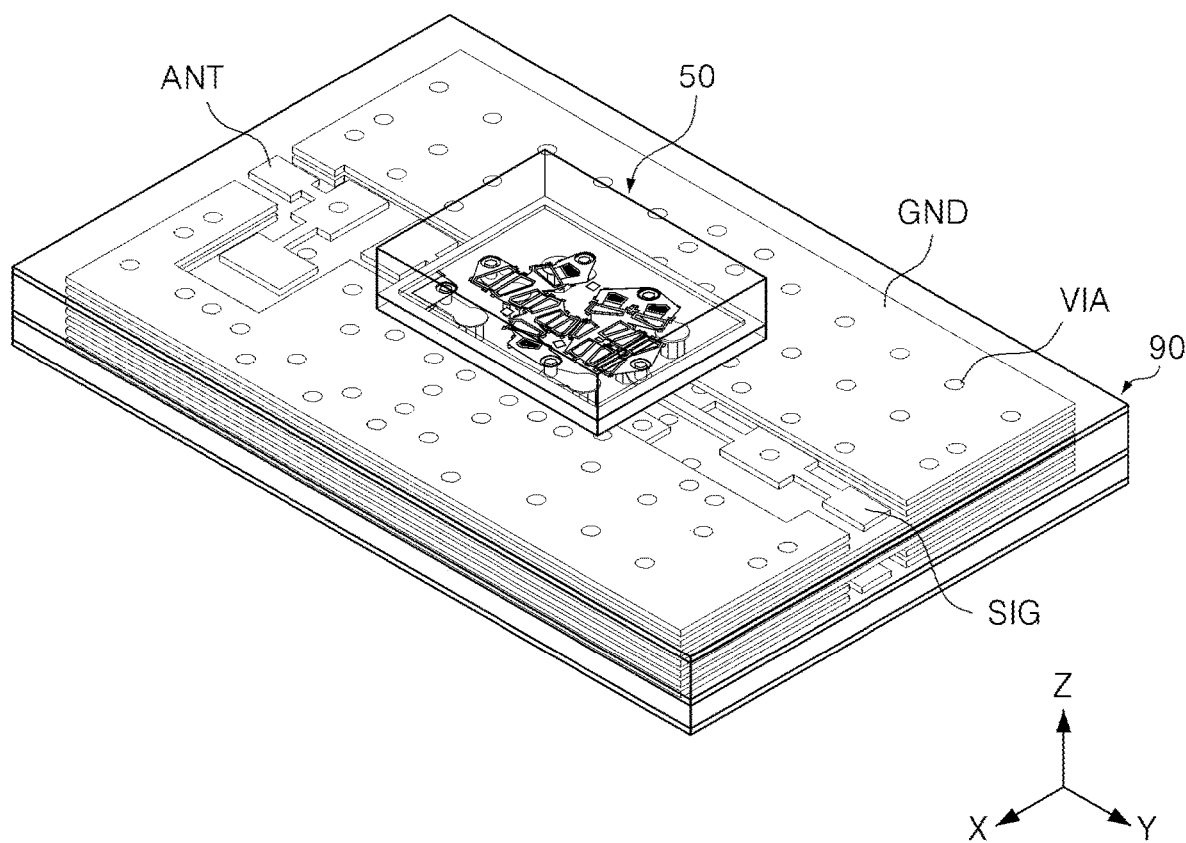
FIG. 1D is a perspective view illustrating a structure in which a bulk acoustic resonator filter/package is disposed on a set substrate according to an embodiment of the present disclosure.
Figure 1E:
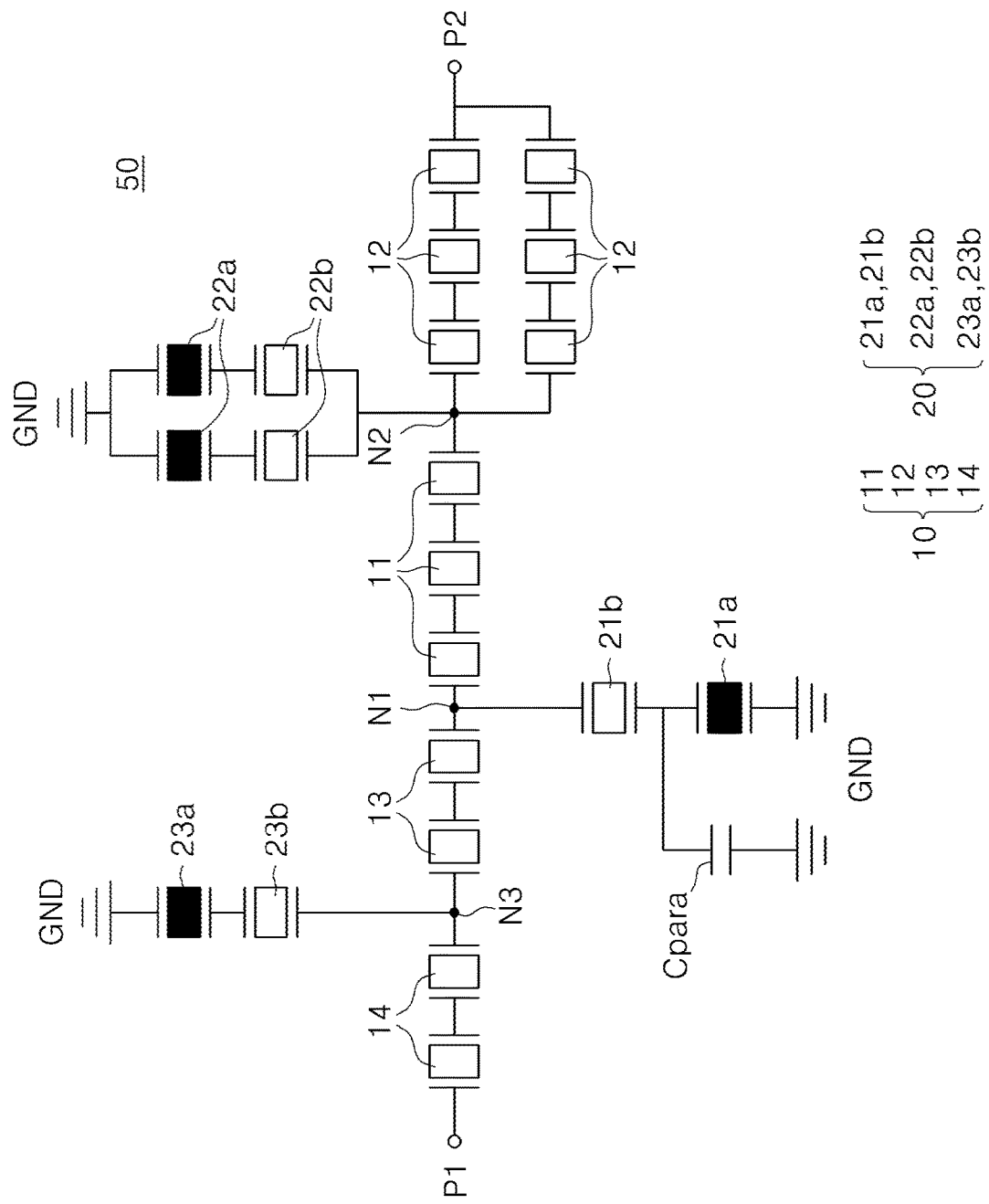
FIG. 1E is a circuit diagram illustrating a bulk acoustic resonator filter according to an embodiment of the present disclosure.

FIGS. 1A to 1C are perspective views illustrating a bulk acoustic resonator filter/package according to an embodiment of the present disclosure, FIG. 1D is a perspective view illustrating a structure in which a bulk acoustic resonator filter/package is disposed on a set substrate according to an embodiment of the present disclosure, and FIG. 1E is a circuit diagram illustrating a bulk acoustic resonator filter according to an embodiment of the present disclosure.

Referring to FIGS. 1A to 1E, a bulk acoustic resonator filter 50 according to an embodiment of the present disclosure may include a series part 10 and a shunt part 20, and a radio frequency (RF) signal may be transmitted or blocked between a first radio frequency (RF) port P1 and a second radio frequency (RF) port P2 according to a frequency of the RF signal.

The series part 10 may include at least one series acoustic resonator 11, 12, 13, or 14, and the shunt part 20 may include a plurality of shunt acoustic resonators 21a, 21b, 22a, 22b, 23a, and 23b.

A plurality of nodes N1, N2, and N3, disposed between the at least one series acoustic resonator 11, 12, 13, or 14, between the plurality of shunt acoustic resonators 21a, 21b, 22a, 22b, 23a, and 23b, and between the series part 10 and the shunt part 20, may be implemented with materials having a relatively low resistivity, such as gold (Au), a gold-tin (Au—Sn) alloy, copper (Cu), a copper-tin (Cu—Sn) alloy, aluminum (Al), or an aluminum alloy, but the present disclosure is not limited thereto.

Each of the at least one series acoustic resonator 11, 12, 13, or 14 and each of the plurality of shunt acoustic resonators 21a, 21b, 22a, 22b, 23a, and 23b may convert electrical energy of an RF signal into mechanical energy, or vice versa, through a piezoelectric effect. As the frequency of the RF signal approaches a resonant frequency of each of the acoustic resonators, an energy transfer rate between a plurality of electrodes increases. As the frequency of the RF signal approaches an antiresonant frequency of each of the acoustic resonators, the energy transfer rate between the plurality of electrodes decreases. The antiresonant frequency of each of the acoustic resonators may be higher than the resonant frequency of each of the acoustic resonators.

For example, each of the at least one series acoustic resonator 11, 12, 13, or 14 and each of the plurality of shunt acoustic resonators 21a, 21b, 22a, 22b, 23a, and 23b may be a film bulk acoustic resonator (FBAR) or a solidly mounted resonator (SMR).

The at least one series acoustic resonator 11, 12, 13, or 14 may be electrically connected in series between the first and second RF ports P1 and P2. As the frequency of the RF signal approaches a resonant frequency, a pass rate of the RF signal between the first and second RF ports P1 and P2 increases. As the frequency of the RF signal approaches an antiresonant frequency, a pass rate of the RF signal between the first and second RF ports P1 and P2 decreases.

The plurality of shunt acoustic resonators 21a, 21b, 22a, 22b, 23a, and 23b may be electrically shunt-connected between the at least one series acoustic resonator 11, 12, 13, or 14 and a ground GND. As the frequency of the RF signal approaches a resonant frequency, a pass rate of the RF signal toward the ground GND increases. As the frequency of the RF signal approaches an antiresonant frequency, a pass rate of the RF signal toward the ground GND decreases.

The pass rate of the RF signal between the first and second RF ports P1 and P2 decreases as the pass rate of the RF signal toward the ground GND increases. The pass rate of the RF signal between the first and second RF ports P1 and P2 increases as the pass rate of the RF signal toward the ground GND decreases.

For example, the pass rate of the RF signal between the first and second RF ports P1 and P2 decreases as the frequency of the RF signal approaches a resonant frequency of each of the plurality of shunt acoustic resonators 21a, 21b, 22a, 22b, 23a, and 23b or an antiresonant frequency of each of the at least one series acoustic resonator 11, 12, 13, or 14.

Since the antiresonant frequency is higher than the resonant frequency, a bulk acoustic resonator filter 50 according to an embodiment of the present disclosure may have a pass bandwidth formed by a lowest frequency corresponding to the resonant frequencies of the plurality of shunt acoustic resonators 21a, 21b, 22a, 22b, 23a, and 23b, and a highest frequency corresponding to the antiresonant frequency of the at least one series acoustic resonator 11, 12, 13, or 14. Alternatively, a bulk acoustic resonator filter 50 according to an embodiment of the present disclosure may have a stop bandwidth formed by a lowest frequency corresponding to the resonant frequency of the at least one series acoustic resonator 11, 12, 13, or 14, and a highest frequency corresponding to the antiresonant frequency of the plurality of shunt acoustic resonators 21a, 21b, 22a, 22b, 23a, and 23b.

The pass bandwidth increases as a difference between a resonant frequency of each of the plurality of shunt acoustic resonators 21a, 21b, 22a, 22b, 23a, and 23b and an antiresonant frequency of each of the at least one series acoustic resonators 11, 12, 13, or 14 increases. The stop bandwidth increases as a difference between a resonant frequency of each of the at least one series acoustic resonator 11, 12, 13, or 14 and an antiresonant frequency of each of the plurality of shunt acoustic resonators 21a, 21b, 22a, 22b, 23a, and 23b. When the differences are too large, the bandwidths may be split, and insertion loss and/or return loss of the bandwidths may become large.

When a resonant frequency of each of the at least one series acoustic resonator 11, 12, 13, or 14 is suitably higher than an antiresonant frequency of each of the plurality of shunt acoustic resonators 21a, 21b, 22a, 22b, 23a, and 23b, or a resonant frequency of each of the plurality of shunt acoustic resonators 21a, 21b, 22a, 22b, 23a, and 23b is suitably higher than an antiresonant frequency of each of the at least one series acoustic resonator 11, 12, 13, or 14, a bandwidth of the bulk acoustic resonator filter 50 may be wide and not split, or the loss thereof may be reduced.

In an acoustic resonator, a difference between a resonant frequency and an antiresonant frequency may be determined based on $kt^2$ (an electromechanical coupling factor), which is a physical characteristic of the acoustic resonator, and $kt^2$ may be determined based on a size, a thickness, and a shape of the acoustic resonator.

Since a bandwidth of the bulk acoustic resonator filter 50 may be proportional to an overall frequency of the bandwidth, the bandwidth may increase as the overall frequency of the bandwidth increases.

As the overall frequency of the bandwidth increases, a wavelength of an RF signal passing through the bulk acoustic resonator filter 50 decreases. As the wavelength of the RF signal decreases, energy attenuation relative to a transmission/reception distance in a remote transmission/reception process in an antenna increases.

For example, as the overall frequency of the bandwidth of the bulk acoustic resonator filter 50 increases, a higher power may be required for the RF signal passing through the bulk acoustic resonator filter 50 for stability and/or smoothness of the remote transmission/reception process.

As power of the RF signal passing through the bulk acoustic resonator filter 50 increases, an amount of heat generated by a piezoelectric operation of each of the plurality of shunt acoustic resonators 21a, 21b, 22a, 22b, 23a, and 23b and each of the at least one series acoustic resonator 11, 12, 13, or 14 increases, and a possibility of damage due to the heat of each of the plurality of shunt acoustic resonators 21a, 21b, 22a, 22b, 23a, and 23b and each of the at least one series acoustic resonator 11, 12, 13, or 14 increases.

As the number (e.g., 8) of the plurality of shunt acoustic resonators 21a, 21b, 22a, 22b, 23a, and 23b included in the shunt part 20 increases, or a ratio (e.g., 8/3) of the number of the plurality of shunt acoustic resonators 21a, 21b, 22a, 22b, 23a, and 23b relative to the number of the plurality of nodes N1, N2, and N3 increases, an amount of heat generated by a piezoelectric operation of each of the plurality of shunt acoustic resonators 21a, 21b, 22a, 22b, 23a, and 23b decreases, and a possibility of damage due to the heat of each of the plurality of shunt acoustic resonators 21a, 21b, 22a, 22b, 23a, and 23b decreases.

Even when the number of shunt acoustic resonators included in the shunt part 20 is only one, a bandwidth may be formed based on a combination of one acoustic resonator and one series acoustic resonator. Since a bulk acoustic resonator filter 50 according to an embodiment of the present disclosure may include at least two of a plurality of shunt acoustic resonators 21a, 21b, 22a, 22b, 23a, and 23b, it is possible to efficiently increase a frequency of an RF signal and effectively increase a power of the RF signal.

In addition, since a bulk acoustic resonator filter 50 according to an embodiment of the present disclosure may include a plurality of shunt acoustic resonators 21a, 21b, 22a, 22b, 23a, and 23b, the following additional advantages (e.g., linearity characteristics and attenuation characteristics) may be further obtained.

For example, each of the plurality of shunt acoustic resonators 21a, 21b, 22a, 22b, 23a, and 23b may be connected to a first electrode of an adjacent shunt acoustic resonator through a first electrode (e.g., an electrode disposed on a lower surface of the piezoelectric layer) of each of the plurality of shunt acoustic resonators, or may be connected to a second electrode of an adjacent shunt acoustic resonator through a second electrode (e.g., an electrode disposed on an upper surface of the piezoelectric layer) of each of the plurality of shunt acoustic resonators. Thus, each of the plurality of shunt acoustic resonators 21a, 21b, 22a, 22b, 23a, and 23b may be connected to an adjacent shunt acoustic resonator in an anti-series connection, and the anti-series connection structure may be used by increasing the number of the shunt acoustic resonators 21a, 21b, 22a, 22b, 23a, and 23b.

In a series connection, a first electrode of a shunt acoustic resonator is connected to a second electrode of an adjacent shunt acoustic resonator, or a second electrode of the shunt acoustic resonator is connected to a first electrode of the adjacent shunt acoustic resonator.

In an anti-series connection, the first electrode of the shunt acoustic resonator is connected to the first electrode of the adjacent shunt acoustic resonator, or the second electrode of the shunt acoustic resonator is connected to the second electrode of the adjacent shunt acoustic resonator.

Therefore, since the plurality of shunt acoustic resonators 21a, 21b, 22a, 22b, 23a, and 23b may effectively cancel out even-order harmonics of the RF signal, linearity characteristics (e.g., the second order intermodulation distortion (IMD2), the 1 dB compression point (P1dB), and the total harmonic distortion (THD)) of the bulk acoustic resonator filter 50 may be improved more efficiently, and the bulk acoustic resonator filter 50 may efficiently comply with communication standards to which a frequency of the RF signal belongs.

For example, a resonant frequency and/or an antiresonant frequency of some of the plurality of shunt acoustic resonators 21a, 21b, 22a, 22b, 23a, and 23b may be different from those of a different shunt acoustic resonator. An increase in the number of differences of resonant frequencies and/or antiresonant frequencies of the plurality of shunt acoustic resonators 21a, 21b, 22a, 22b, 23a, and 23b may be used by increasing the number of shunt acoustic resonators 21a, 21b, 22a, 22b, 23a, and 23b.

Therefore, the plurality of shunt acoustic resonators 21a, 21b, 22a, 22b, 23a, and 23b may optimize positions of a plurality of resonant frequencies and/or positions of a plurality of antiresonant frequencies near a minimum frequency of a bandwidth of the bulk acoustic resonator filter 50, attenuation characteristics of the bulk acoustic resonator filter 50 may be made sharper, and spurious noise that may be generated near the minimum frequency due to the characteristics of the acoustic resonator may be efficiently removed. For example, a combination of a plurality of resonant frequencies and/or a plurality of antiresonant frequencies may form a transmission zero pole in a frequency characteristic of the bulk acoustic resonator filter 50 to further improve the attenuation characteristics of the bulk acoustic resonator filter 50.

Since a difference between design characteristics and actual characteristics of each of the plurality of shunt acoustic resonators 21a, 21b, 22a, 22b, 23a, and 23b may affect performance of the bulk acoustic resonator filter 50 (e.g., loss characteristics, frequency limit characteristics, maximum power characteristics, heat generation characteristics, linearity characteristics, attenuation characteristics, or other characteristics), it may be more important to reduce the difference between the design characteristics and the actual characteristics of each of the plurality of shunt acoustic resonators 21a, 21b, 22a, 22b, 23a, and 23b as the number of shunt acoustic resonators 21a, 21b, 22a, 22b, 23a, and 23b included in the shunt part 20 increases (e.g., 8) or a ratio of the number of the plurality of shunt acoustic resonators 21a, 21b, 22a, 22b, 23a, and 23b to the number of the plurality of nodes N1, N2, and N3 increases (e.g., 8/3).

The difference between the design characteristics and the actual characteristics of each of the plurality of shunt acoustic resonators 21a, 21b, 22a, 22b, 23a, and 23b may depend on a parasitic impedance of each of the plurality of shunt acoustic resonators 21a, 21b, 22a, 22b, 23a, and 23b. The parasitic impedance may be generated based on an electric field and/or a magnetic field between peripheral conductive structures of the plurality of shunt acoustic resonators 21a, 21b, 22a, 22b, 23a, and 23b, even though the peripheral conductive structures of each of the plurality of shunt acoustic resonators 21a, 21b, 22a, 22b, 23a, and 23b may not be electrically connected to the plurality of shunt acoustic resonators 21a, 21b, 22a, 22b, 23a, and 23b.

For example, the peripheral conductive structures capable of affecting the parasitic impedance may be at least one of a plurality of shunt acoustic resonators 21a, 21b, 22a, 22b, 23a, and 23b, metal layers 1180 and 1190 connecting the plurality of shunt acoustic resonators 21a, 21b, 22a, 22b, 23a, and 23b to each other, a ground port 1320 providing a ground GND to the plurality of shunt acoustic resonators 21a, 21b, 22a, 22b, 23a, and 23b, a bonding member 1220 bonding a substrate 1110 and a cap 1210 to each other, or a shield layer 1230 disposed on the cap 1210.

Since various factors affect the parasitic impedance, parasitic impedances of the plurality of shunt acoustic resonators 21a, 21b, 22a, 22b, 23a, and 23b may be different from each other. For example, some of the plurality of shunt acoustic resonators 21a, 21b, 22a, 22b, 23a, and 23b that are electrically connected to each other in series may have different parasitic impedances due to a difference in how they are arranged with respect to a ground GND.

For example, among the plurality of shunt acoustic resonators, the metal layers 1180 and 1190 between first shunt acoustic resonators 21a, 22a, and 23a and second shunt acoustic resonators 21b, 22b, and 23b may form a parasitic capacitor Cpara, together with at least one of the ground port 1320, the bonding member 1220, or the shield layer 1230. The parasitic capacitor Cpara may act in a similar manner to a capacitor connected in parallel with the first shunt acoustic resonators 21a, 22a, and 23a, may be a portion of parasitic impedances of the first shunt acoustic resonators 21a, 22a, and 23a, and may not substantially affect parasitic impedances of the second shunt acoustic resonators 21b, 22b, and 23b. Therefore, the parasitic impedances of the first shunt acoustic resonators 21a, 22a, and 23a may be different from the parasitic impedances of the second shunt acoustic resonators 21b, 22b, and 23b.

A bulk acoustic resonator filter 50 and a bulk acoustic resonator package according to an embodiment of the present disclosure may include a plurality of shunt acoustic resonators 21a, 21b, 22a, 22b, 23a, and 23b having different aspect ratios (please refer to AR in FIGS. 4A and 5A), and may thus reduce an overall parasitic impedance difference between the plurality of shunt acoustic resonators 21a, 21b, 22a, 22b, 23a, and 23b without adding a capacitor in parallel with the second shunt acoustic resonators 21b, 22b, and 23b.

Therefore, since a difference between design characteristics and actual characteristics of each of the plurality of shunt acoustic resonators 21a, 21b, 22a, 22b, 23a, and 23b may be effectively reduced, a bulk acoustic resonator filter 50 and a bulk acoustic resonator package according to an embodiment of the present disclosure may use the plurality of shunt acoustic resonators 21a, 21b, 22a, 22b, 23a, and 23b to efficiently improve performance thereof (e.g., loss characteristics, frequency limit characteristics, maximum power characteristics, heat generation characteristics, linearity characteristics, attenuation characteristics, or other characteristics). In addition, since an additional capacitor for reducing the overall parasitic impedance difference of the plurality of shunt acoustic resonators 21a, 21b, 22a, 22b, 23a, and 23b may not be needed, a bulk acoustic resonator filter 50 and a bulk acoustic resonator package according to an embodiment of the present disclosure may have high performance relative to a size.

A difference between a resonant frequency and an antiresonant frequency of each of the plurality of shunt acoustic resonators 21a, 21b, 22a, 22b, 23a, and 23b may be determined based on $kt^2$ (an electromechanical coupling factor), which is a physical characteristic of a corresponding acoustic resonator, and $kt^2$ of the corresponding acoustic resonator may be changed according to an aspect ratio of the corresponding acoustic resonator.

For example, an aspect ratio of each of the first shunt acoustic resonators 21a, 22a, and 23a may be lower than an aspect ratio of each of the second shunt acoustic resonators 21b, 22b, and 23b, which causes a difference between a resonant frequency and an antiresonant frequency of each of the first shunt acoustic resonators 21a, 22a, and 23a to be greater than a difference between a resonant frequency and an antiresonant frequency of each of the second shunt acoustic resonators 21b, 22b, and 23b. Taking resonant frequencies of the first shunt acoustic resonators 21a, 22a, and 23a as being equal to resonant frequencies of the second shunt acoustic resonators 21b, 22b, and 23b, an antiresonant frequency of the first shunt acoustic resonators 21a, 22a, and 23a may be higher than an antiresonant frequency of each of the second shunt acoustic resonators 21b, 22b, and 23b.

In addition, according to an equivalent circuit of each of the plurality of shunt acoustic resonators 21a, 21b, 22a, 22b, 23a, and 23b, in each of the plurality of shunt acoustic resonators 21a, 21b, 22a, 22b, 23a, and 23b, a series LC equivalent component that may be proportional to a resonant frequency may be different from a parallel LC equivalent component that may be inversely proportional to an antiresonant frequency. The parasitic capacitor Cpara, which may act as a parallel capacitor with respect to the first shunt acoustic resonators 21a, 22a, and 23a, may be a C equivalent component of a parallel LC equivalent component that may be inversely proportional to antiresonant frequencies of the first shunt acoustic resonators 21a, 22a, and 23a, and thus antiresonant frequencies of the first shunt acoustic resonators 21a, 22a, and 23a with the parasitic capacitor Cpara may be lower than antiresonant frequencies of the first shunt acoustic resonators 21a, 22a, and 23a without the parasitic capacitor Cpara.

Therefore, the lowering of the antiresonant frequencies of the first shunt acoustic resonators 21a, 22a, and 23a by the parasitic capacitor Cpara, and the increasing of the antiresonant frequencies of the first shunt acoustic resonators 21a, 22a, and 23a by the low aspect ratio of the first shunt acoustic resonators 21a, 22a, and 23a, may act to cancel out each other, such that a difference between the antiresonant frequencies of the first shunt acoustic resonators 21a, 22a, and 23a and the antiresonant frequencies of the second shunt acoustic resonators 21b, 22b, and 23b may be effectively reduced. Performance (e.g., loss characteristics, frequency limit characteristics, maximum power characteristics, heat generation characteristics, linearity characteristics, attenuation characteristics, or other characteristics) of a bulk acoustic resonator filter 50 and a bulk acoustic resonator package according to an embodiment of the present disclosure may be efficiently improved.

As an aspect ratio of each of the at least one series acoustic resonator 11, 12, 13, or 14 and an aspect ratio of each of the plurality of shunt acoustic resonators 21a, 21b, 22a, 22b, 23a, and 23b increases, a connection width between each of the at least one series acoustic resonator 11, 12, 13, or 14 and each of the plurality of shunt acoustic resonators 21a, 21b, 22a, 22b, 23a, and 23b and each of the metal layers 1180 and 1190 connected thereto may be increases. Therefore, a connection resistance of each of the metal layers 1180 and 1190 with respect to the at least one series acoustic resonator 11, 12, 13, or 14 and the plurality of shunt acoustic resonators 21a, 21b, 22a, 22b, 23a, and 23b decreases. As the overall connection resistance decreases, an energy loss of a bulk acoustic resonator filter 50 and a bulk acoustic resonator package according to an embodiment of the present disclosure decreases.

Therefore, an aspect ratio of each of the first shunt acoustic resonators 21a, 22a, and 23a electrically connected closer to the ground GND than the second shunt acoustic resonators 21b, 22b, and 23b may be lower than an aspect ratio of each of the second shunt acoustic resonators 21b, 22b, and 23b. For example, an aspect ratio of each of the first shunt acoustic resonators 21a, 22a, and 23a may be closer to 1, and may be relatively closer to a regular polygon, compared to an aspect ratio of each of the second shunt acoustic resonators 21b, 22b, and 23b.

The capacitance of the parasitic capacitor Cpara may increase as a length of each of the metal layers 1180 and 1190 connecting the first shunt acoustic resonators 21a, 22a, and 23a and the second shunt acoustic resonators 21b, 22b, and 23b to each other increases. Therefore, an aspect ratio difference between the first shunt acoustic resonators 21a, 22a, and 23a and the second shunt acoustic resonators 21b, 22b, and 23b may increase as a connection length between the plurality of shunt acoustic resonators 21a, 21b, 22a, 22b, 23a, and 23b increases.

Referring to FIGS. 1A to 10, a bulk acoustic resonator package according to an embodiment of the present disclosure may include a substrate 1110, a cap 1210, a plurality of acoustic resonators 11, 12, 13, 14, 21a, 21b, 22a, 22b, 23a, and 23b, metal layers 1180 and 1190, and a bonding member 1220, and may further include a first radio frequency (RF) port P1, a second radio frequency (RF) port P2, a ground port 1320, a membrane layer 1150, and a shield layer 1230.

The substrate 1110 may have a cavity formed below the plurality of acoustic resonators 11, 12, 13, 14, 21a, 21b, 22a, 22b, 23a, and 23b. When a bulk acoustic resonator is a solid mounted resonator (SMR), the bulk acoustic resonator may have a stack structure in which heterogeneous layers having different acoustic impedances are alternately stacked in place of a cavity.

The membrane layer 1150 may be disposed between the cavity or the stack structure and the plurality of acoustic resonators 11, 12, 13, 14, 21a, 21b, 22a, 22b, 23a, and 23b, and may act as a substantial upper surface of the substrate 1110.

The cap 1210 may accommodate the plurality of acoustic resonators 11, 12, 13, 14, 21a, 21b, 22a, 22b, 23a, and 23b, to protect the plurality of acoustic resonators 11, 12, 13, 14, 21a, 21b, 22a, 22b, 23a, and 23b from an external environment. The cap 1210 may be formed as a cover having an internal space in which the plurality of acoustic resonators 11, 12, 13, 14, 21a, 21b, 22a, 22b, 23a, and 23b are accommodated. For example, the cap 1210 may have a shape in which a portion adjacent to an edge of a lower surface of the cap 1210 facing the substrate 1110 protrudes further toward the substrate 1110 compared to a central portion of the lower surface. For example, a vertical cross-section of the cap 1210 may have a U-shape.

Each of the plurality of acoustic resonators 11, 12, 13, 14, 21a, 21b, 22a, 22b, 23a, and 23b may include a first electrode, a piezoelectric layer, and a second electrode, stacked in a first direction (e.g., a Z direction) in which the substrate 1110 and the cap 1210 face each other, and may be accommodated between the substrate 1110 and the cap 1210.

The metal layers 1180 and 1190 may connect the plurality of acoustic resonators 11, 12, 13, 14, 21a, 21b, 22a, 22b, 23a, and 23b. The metal layer 1180 may be connected to a first electrode (e.g., an electrode disposed on a lower surface of the piezoelectric layer) of the plurality of acoustic resonators 11, 12, 13, 14, 21a, 21b, 22a, 22b, 23a, and 23b, and, the metal layer 1190 may be connected to a second electrode (e.g., an electrode disposed on an upper surface of the piezoelectric layer) of the plurality of acoustic resonators 11, 12, 13, 14, 21a, 21b, 22a, 22b, 23a, and 23b. Therefore, the metal layer 1180 and the metal layer 1190 may be disposed at different heights relative to the substrate, and a parasitic impedance due to the metal layer 1180 and a parasitic impedance due to the metal layer 1190 may be different from each other.

The bonding member 1220 may surround the plurality of acoustic resonators 11, 12, 13, 14, 21a, 21b, 22a, 22b, 23a, and 23b in a circumferential direction perpendicular to the first direction (e.g., the Z direction), and may be bonded to the cap 1210 between the substrate 1110 and the cap 1210. For example, the bonding member 1220 may have a eutectic bonding structure, and thus may include a conductive ring. The bonding member 1220 is not limited to the eutectic bonding structure, and may be also implemented as an anodic bonding structure or a melt bonding structure of a non-conductive material.

The metal layers 1180 and 1190 and the bonding member 1220 may form a parasitic capacitor Cpara, and the parasitic capacitor Cpara may affect only a portion of the plurality of acoustic resonators 11, 12, 13, 14, 21a, 21b, 22a, 22b, 23a, and 23b, or may differentially affect the plurality of acoustic resonators 11, 12, 13, 14, 21a, 21b, 22a, 22b, 23a, and 23b. Therefore, an overall parasitic impedance difference between the plurality of acoustic resonators 11, 12, 13, 14, 21a, 21b, 22a, 22b, 23a, and 23b may increase due to the parasitic capacitor Cpara based on the metal layers 1180 and 1190 and the bonding member 1220.

In a bulk acoustic resonator package according to an embodiment of the present disclosure, at least two of the plurality of acoustic resonators 11, 12, 13, 14, 21a, 21b, 22a, 22b, 23a, and 23b may have different aspect ratios relative to each other. Therefore, an overall parasitic impedance difference between the plurality of acoustic resonators 11, 12, 13, 14, 21a, 21b, 22a, 22b, 23a, and 23b may be reduced, and a difference between design characteristics and actual characteristics of each of the plurality of acoustic resonators 11, 12, 13, 14, 21a, 21b, 22a, 22b, 23a, and 23b may be effectively reduced.

The parasitic capacitor Cpara based on the metal layers 1180 and 1190 and the bonding member 1220 may increase as lengths of the metal layers 1180 and 1190 increase, or as the metal layers 1180 and 1190 are disposed closer to the bonding member 1220. For example, the parasitic capacitor Cpara may increase as a connection length of the metal layers 1180 and 1190 connecting the plurality of acoustic resonators 11, 12, 13, 14, 21a, 21b, 22a, 22b, 23a, and 23b to each other increases, or a separation distance between the metal layers 1180 and 1190 and the bonding member 1220 decreases.

To reduce a parasitic impedance difference between the plurality of acoustic resonators 11, 12, 13, 14, 21a, 21b, 22a, 22b, 23a, and 23b, an aspect ratio difference between the plurality of acoustic resonators 11, 12, 13, 14, 21a, 21b, 22a, 22b, 23a, and 23b may increase as the connection length of the metal layers 1180 and 1190 connecting the plurality of acoustic resonators 11, 12, 13, 14, 21a, 21b, 22a, 22b, 23a, and 23b to each other increases, or a separation distance between the metal layers 1180 and 1190 and the bonding member 1220 decreases.

For example, a first acoustic resonator 21a and a second acoustic resonator 21b may be connected to each other through a first portion of the metal layer 1180, and third acoustic resonators 22a and 23a and fourth acoustic resonators 22b and 23b may be connected to each other through a second portion of the metal layer 1180. A connection length of the first portion of the metal layer 1180 connecting the first and second acoustic resonators 21a and 21b to each other may be longer than a connection length of the second portion of the metal layer 1180 connecting the third and fourth acoustic resonators 22a, 23a, 22b, and 23b to each other. A separation distance between the first portion of the metal layer 1180 connecting the first and second acoustic resonators 21a and 21b to each other and the bonding member 1220 may be shorter than a separation distance between the second portion of the metal layer 1180 connecting the third and fourth acoustic resonators 22a, 23a, 22b, and 23b to each other and the bonding member 1220. An aspect ratio difference between the first and second acoustic resonators 21a and 21b may be greater than an aspect ratio difference between the third and fourth acoustic resonators 22a, 23a, 22b, and 23b.

As an aspect ratio of each of the plurality of acoustic resonators 11, 12, 13, 14, 21a, 21b, 22a, 22b, 23a, and 23b increases, a connection width between each of the plurality of acoustic resonators 11, 12, 13, 14, 21a, 21b, 22a, 22b, 23a, and 23b and the metal layers 1180 and 1190 connected thereto increases. Therefore, a connection resistance of each of the metal layers 1180 and 1190 with respect to the plurality of acoustic resonators 11, 12, 13, 14, 21a, 21b, 22a, 22b, 23a, and 23b decreases. As the overall connection resistance decreases, an energy loss of a bulk acoustic resonator package according to an embodiment of the present disclosure decreases.

Therefore, an aspect ratio of each of the acoustic resonators 11, 12, 13, 14, 21b, 22b, and 23b disposed relatively far from the bonding member 1220 may be relatively high, and an aspect ratio of each of the acoustic resonators 21a, 22a, and 23a disposed relatively close to the bonding member 1220 may be relatively lower than the aspect ratio of each of the acoustic resonators 11, 12, 13, 14, 21b, 22b, and 23b. For example, the aspect ratio of each of the acoustic resonators 21a, 22a, and 23a may be closer to 1 than the aspect ratio of each of the acoustic resonators 11, 12, 13, 14, 21b, 22b, and 23b.

The plurality of acoustic resonators 11, 12, 13, 14, 21a, 21b, 22a, 22b, 23a, and 23b may be electrically connected between the first and second RF ports P1 and P2. The first RF port P1 may be disposed near a first side surface of the substrate 1110 (e.g., in a −Y direction away from a center of the substrate 1110), and the second RF port P2 may be disposed near a second side surface of the substrate 1110 (e.g., in a +Y direction away from the center of the substrate 1110). The first and second RF ports P1 and P2 may provide a vertical electrical connection path between an interior and an exterior of the bulk acoustic resonator package.

Since the first and second RF ports P1 and P2 may be disposed near the first and second side surfaces of the substrate 1110 (e.g., in the −Y and +Y directions away from the center of the substrate 1110), the ground port 1320 may be disposed near a third side surface of the substrate 1110 (e.g., in a −X direction away from the center of the substrate 1110) and/or a fourth side surface of the substrate 1110 (e.g., in a +X direction away from the center of the substrate 1110).

The ground port 1320 may provide a ground GND, and the capacitance of the parasitic capacitor Cpara based on the metal layers 1180 and 1190 and the bonding member 1220 may depend on a position of the ground port 1320. Therefore, the aspect ratio of each of the acoustic resonators 21a, 22a, and 23a disposed closer to the third side surface and/or the fourth side surface of the substrate 1110 than the acoustic resonators 11, 12, 13, 14, 21b, 22b, and 23b, or electrically connected closer to the ground port 1320 than the acoustic resonators 11, 12, 13, 14, 21b, 22b, and 23b, may be relatively lower than the aspect ratio of each of the acoustic resonators 11, 12, 13, 14, 21b, 22b, and 23b. For example, the aspect ratio of the acoustic resonators 21a, 22a, and 23a may be closer to 1 than the aspect ratio of each of the acoustic resonators 11, 12, 13, 14, 21b, 22b, and 23b.

The shield layer 1230 may be disposed on a surface (e.g., a lower surface) of the cap 1210 facing the plurality of acoustic resonators 11, 12, 13, 14, 21a, 21b, 22a, 22b, 23a, and 23b, and may be electrically connected to the bonding member 1220. The shield layer 1230 may block the plurality of acoustic resonators 11, 12, 13, 14, 21a, 21b, 22a, 22b, 23a, and 23b from receiving electromagnetic noise from outside the bulk acoustic resonator package. Therefore, performance of the bulk acoustic resonator package may be improved.

Since the shield layer 1230 may overlap the metal layers 1180 and 1190 in the Z direction, and may be electrically connected to the ground GND, the shield layer 1230 and the metal layers 1180 and 1190 may act as a portion of the parasitic capacitor Cpara. A parasitic impedance difference between various ones of the plurality of acoustic resonators 11, 12, 13, 14, 21a, 21b, 22a, 22b, 23a, and 23b due to the parasitic capacitor Cpara may be reduced due to an aspect ratio difference between various ones of the plurality of acoustic resonators 11, 12, 13, 14, 21a, 21b, 22a, 22b, 23a, and 23b as described above.

Referring to FIG. 1D, a bulk acoustic resonator filter 50 and a bulk acoustic resonator package, according to an embodiment of the present disclosure may be disposed (e.g., mounted or embedded) on a set substrate 90.

For example, the set substrate 90 may be a printed circuit board in which a plurality of conductive layers and a plurality of insulating layers are alternately stacked, and the plurality of conductive layers may include an antenna transmission path ANT, a transceiver transmission path SIG, and a ground GND, and a plurality of vias VIA may electrically connect the plurality of conductive layers to each other in the Z direction.

The antenna transmission path ANT may be electrically connected to the first radio frequency port P1 of FIGS. 1A to 10, and the transceiver transmission path SIG may be electrically connected to the second radio frequency port P2 of FIGS. 1A to 10. When a bulk acoustic resonator filter 50 according to an embodiment of the present disclosure is configured to filter a transmitted RF signal, a power of the transmitted RF signal passing through the second radio frequency port P2 may be greater than a power of the transmitted RF signal passing through the first radio frequency port P1. Therefore, a size of a shunt acoustic resonator closest to the second radio frequency port P2 among the plurality of shunt acoustic resonators may be larger than the other ones of the plurality of shunt acoustic resonators to improve heat dissipation characteristics and/or reduce loss. Conversely, when the bulk acoustic resonator filter 50 is configured to filter a received RF signal, a size of a shunt acoustic resonator closest to the first radio frequency port P1 among the plurality of shunt acoustic resonators may be larger than the other ones of the plurality of shunt acoustic resonators to improve heat dissipation characteristics and/or reduce loss.

FIGS. 2A to 2G are plan views illustrating various modified structures of a bulk acoustic resonator filter/package according to embodiments of the present disclosure, and FIGS. 3A to 3H are circuit diagrams illustrating various modified structures of a bulk acoustic resonator filter according to embodiments of the present disclosure.

Figure 2A:
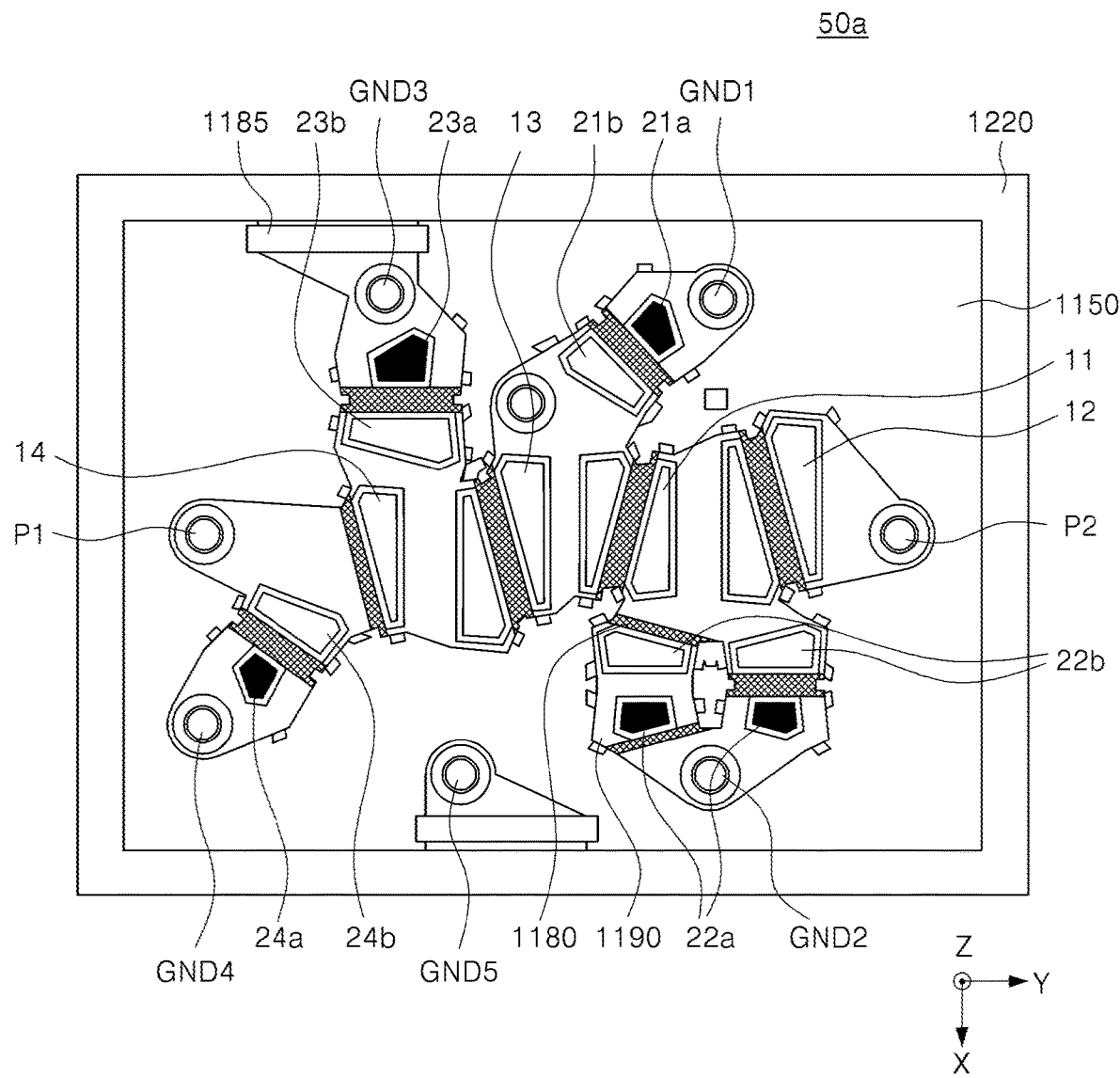
FIGS. 2A to 2G are plan views illustrating various modified structures of a bulk acoustic resonator filter/package according to embodiments of the present disclosure.
Figure 3A:
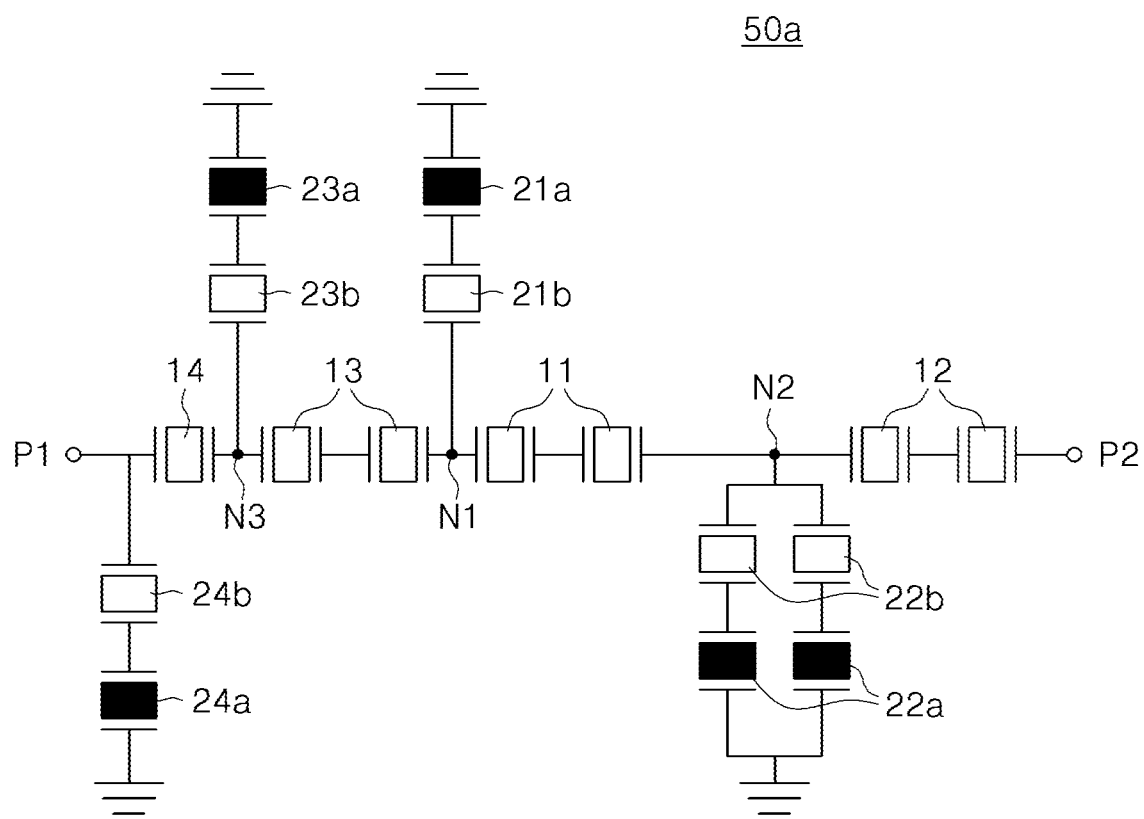
FIGS. 3A to 3H are circuit diagrams illustrating various modified structures of a bulk acoustic resonator filter according to embodiments of the present disclosure.

Referring to FIGS. 2A and 3A, a bulk acoustic resonator filter 50a according to an embodiment of the present disclosure may include at least one series acoustic resonator 11, 12, 13, or 14 and a plurality of shunt acoustic resonators 21a, 21b, 22a, 22b, 23a, 23b, 24a, and 24b, wherein aspect ratios of at least two of the plurality of shunt acoustic resonators 21a, 21b, 22a, 22b, 23a, 23b, 24a, and 24b may be different from each other.

An aspect ratio difference between the plurality of shunt acoustic resonators 21a, 21b, 22a, 22b, 23a, 23b, 24a, and 24b may be larger than an aspect ratio difference between the at least one series acoustic resonator 11, 12, 13, or 14 and the shunt acoustic resonators 21b, 22b, 23b, and 24b having an aspect ratio closer to an aspect ratio of the at least one series acoustic resonator 11, 12, 13, or 14 among the plurality of shunt acoustic resonators. Since the aspect ratio of the at least one series acoustic resonator 11, 12, 13, or 14 may be high, widths of portions of the metal layers 1180 and 1190 connecting the plurality of series acoustic resonators 11, 12, 13, or 14 to each other may increase such that a connection resistance thereof may be lowered. Therefore, a loss of an RF signal passing between the first and second RF ports P1 and P2 may be reduced.

The plurality of shunt acoustic resonators 21a, 21b, 22a, 22b, 23a, and 23b may be electrically connected between ground ports GND1, GND2, and GND3 and a plurality of nodes N1, N2, and N3, and the plurality of shunt acoustic resonators 24a and 24b may be electrically connected between a ground port GND4 and the first RF port P1.

A metal layer 1180 (the crosshatched areas between the various acoustic resonators in FIG. 2A) may be connected between first electrodes (e.g., electrodes disposed on a lower surface of a piezoelectric layer) of a plurality of acoustic resonators adjacent to each other, and a metal layer 1190 (the non-crosshatched areas between the various acoustic resonators in FIG. 2A) may be connected between second electrodes (e.g., electrodes disposed on an upper surface of the piezoelectric layer) of the plurality of acoustic resonators adjacent to each other. In addition, the metal layer 1190 may be connected to a bonding member 1220 through a ground extension member 1185, and the ground ports GND3 and GND5 may provide a ground for the bonding member 1220 through the ground extension member 1185.

First and second shunt acoustic resonators (a right shunt acoustic resonator of 22a and a right shunt acoustic resonator of 22b) may be electrically connected to each other through the first electrode and the metal layer 1180 in series, and third and fourth shunt acoustic resonators (a left shunt acoustic resonator of 22a and a left shunt acoustic resonator of 22b) may be electrically connected to each other through the second electrode and the metal layer 1190 in series. Since the first and third shunt acoustic resonators 22a may be electrically connected to each other in parallel, the first shunt acoustic resonator (the right shunt acoustic resonator of 22a) may be electrically connected to the ground port GND2 through the second electrode and the metal layer 1190, and the third shunt acoustic resonator (the left shunt acoustic resonator of 22a) may be electrically connected to the ground port GND2 through the first electrode and the metal layers 1180 and 1190.

Therefore, since the number of shunt acoustic resonators electrically connected between one node between the plurality of series acoustic resonators 11, 12, 13, or 14 and the ground port GND2 may be effectively increased, the first, second, third, and fourth shunt acoustic resonators 22a and 22b may more efficiently increase a frequency of an RF signal, may more efficiently increase a power of the RF signal, and may improve more efficiently linearity characteristics and/or attenuation characteristics of a bulk acoustic resonator filter 50a according to an embodiment of the present disclosure.

The metal layer 1180 connecting the first and second shunt acoustic resonators (the right shunt acoustic resonator of 22a and the right shunt acoustic resonator of 22b) to each other may be disposed at a lower height relative to the substrate 1110 than the metal layer 1190 connecting the third and fourth shunt acoustic resonators (the left shunt acoustic resonator of 22a and the left shunt acoustic resonator of 22b) to each other. Therefore, a parasitic impedance of the first shunt acoustic resonator (the right shunt acoustic resonator of 22a) may be different from a parasitic impedance of the third shunt acoustic resonator (the left shunt acoustic resonator of 22a).

The first and second shunt acoustic resonators (the right shunt acoustic resonator of 22a and the right shunt acoustic resonator of 22b) may have different aspect ratios relative to each other, or the third and fourth shunt acoustic resonators (the left shunt acoustic resonator of 22a and the left shunt acoustic resonator of 22b) may have different aspect ratios relative to each other. Therefore, since at least one of a parasitic impedance difference between the first and third shunt acoustic resonators 22a and the second and fourth shunt acoustic resonators 22b, or a parasitic impedance difference between the first and third shunt acoustic resonators 22a, may be reduced, an overall parasitic impedance difference between the first, second, third, and fourth shunt acoustic resonators 22a and 22b may be effectively reduced.

Therefore, a bulk acoustic resonator filter 50a according to an embodiment of the present disclosure may effectively reduce a difference between design characteristics and actual characteristics of each of the first, second, third, and fourth shunt acoustic resonators 22a and 22b by increasing a number of the first, second, third, and fourth shunt acoustic resonators 22a and 22b, and provide advantages (e.g., loss characteristics, frequency limit characteristics, maximum power characteristics, heat generation characteristics, linearity characteristics, attenuation characteristics, or other characteristics) according to the increase in the number of the first, second, third, and fourth shunt acoustic resonators 22a and 22b, while disadvantages (a sensitivity to the difference between design characteristics and actual characteristics) may be effectively eliminated.

Depending on a design, aspect ratios of the first and second shunt acoustic resonators (the right shunt acoustic resonator of 22a and the right shunt acoustic resonator of 22b) may be different from each other, and aspect ratios of third and fourth shunt acoustic resonators (the left shunt acoustic resonator of 22a and the left shunt acoustic resonator of 22b) may be different from each other. Also, an aspect ratio difference between the first and second shunt acoustic resonators (the right shunt acoustic resonator of 22a and the right shunt acoustic resonator of 22b) may be different from an aspect ratio difference between third and fourth shunt acoustic resonators (the left shunt acoustic resonator of 22a and the left shunt acoustic resonator of 22b). Therefore, a bulk acoustic resonator filter 50a according to an embodiment of the present disclosure may effectively reduce a difference between design characteristics and actual characteristics of each of the first, second, third, and fourth shunt acoustic resonators 22a and 22b.

Figure 2B:
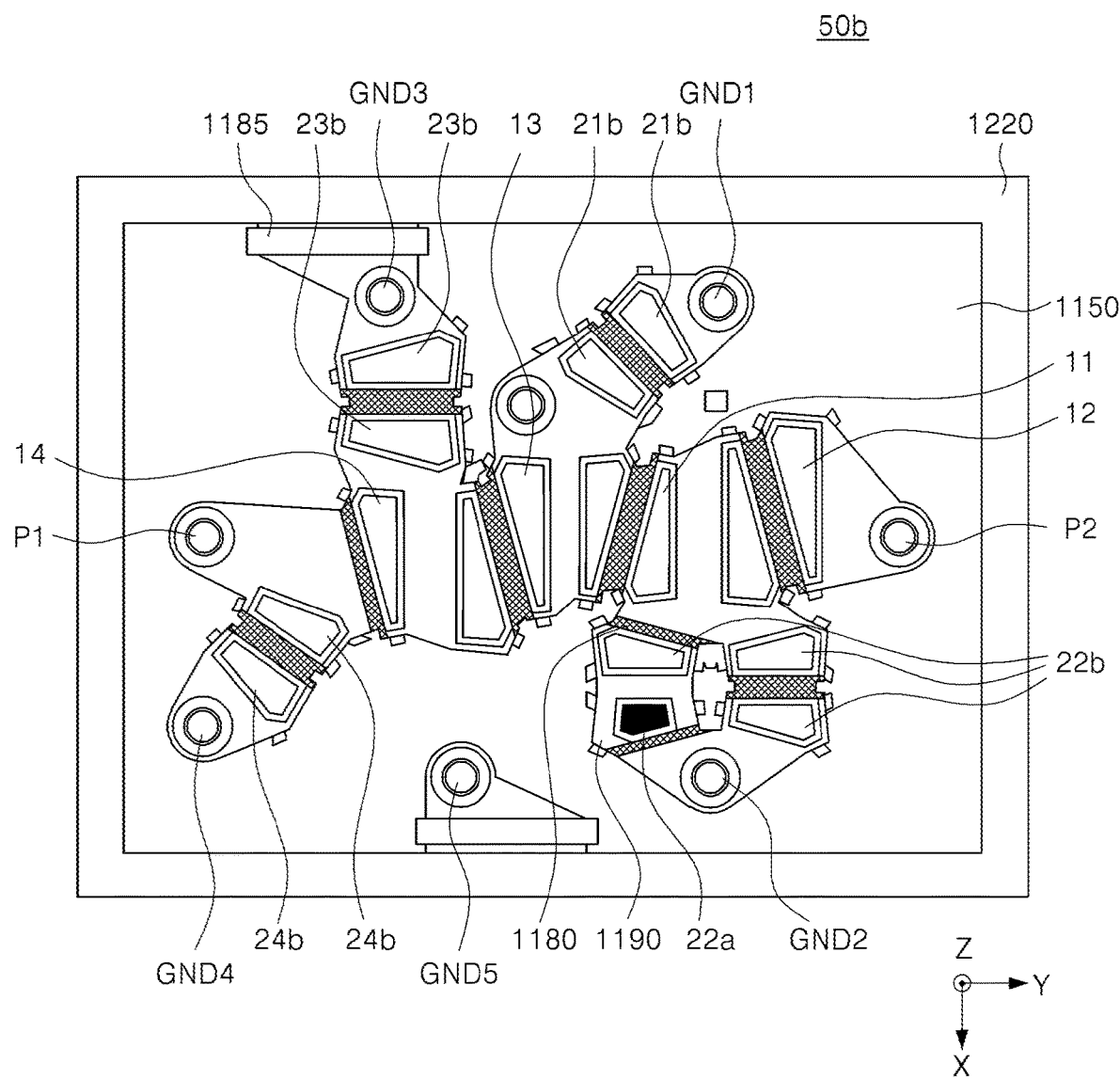
Figure 3B:
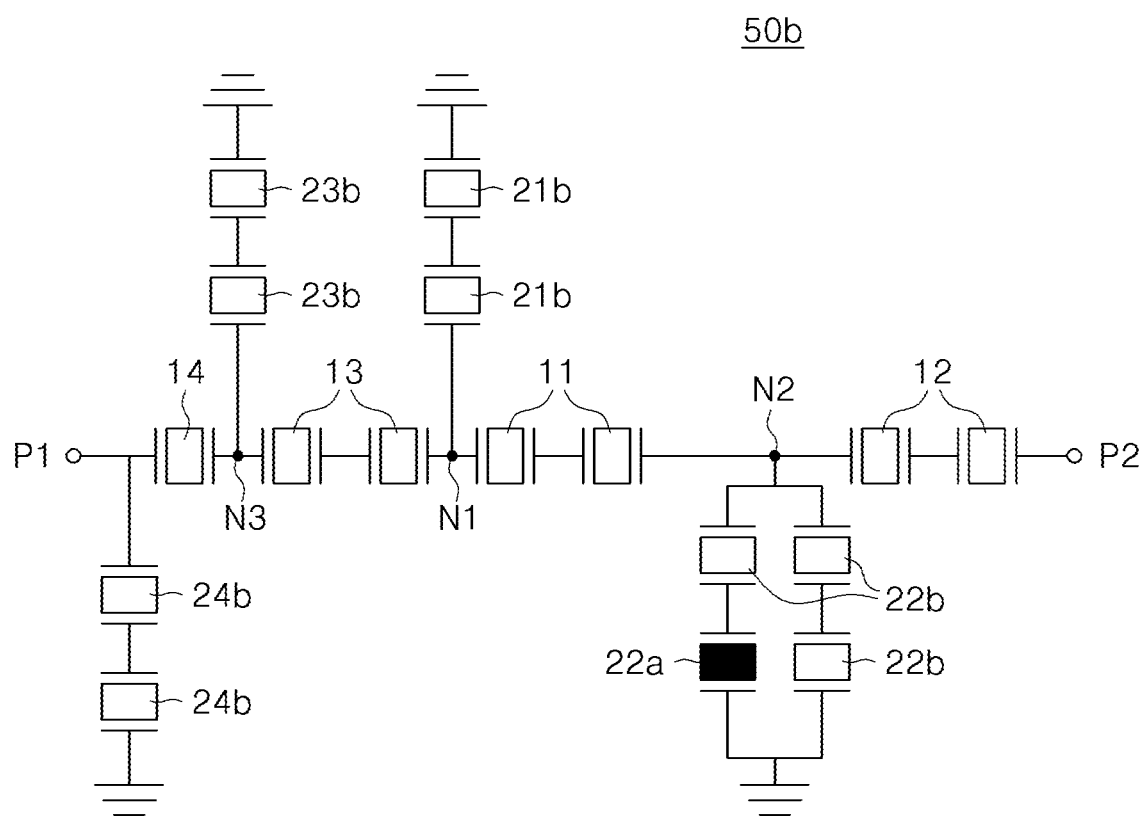

Referring to FIGS. 2B and 3B, in a bulk acoustic resonator filter 50b according to an embodiment of the present disclosure, an aspect ratio difference between first and second shunt acoustic resonators 22a and 22b electrically connected between a first node N2 and a ground port GND2 may be different from an aspect ratio difference between third and fourth shunt acoustic resonators 21b and 23b electrically connected between second nodes N1 and N3 and ground ports GND1 and GND3.

For example, the number per node of the first and second shunt acoustic resonators 22a and 22b (e.g., four) may be greater than the number per node of the third and fourth shunt acoustic resonators 21b and 23b (e.g., two), so an effect of a parasitic impedance difference of the first and second shunt acoustic resonators 22a and 22b on the bulk acoustic resonator filter 50b may be greater than an effect of a parasitic impedance difference of the third and fourth shunt acoustic resonators 21b and 23b on the bulk acoustic resonator filter 50b. Therefore, the aspect ratio difference between the first and second shunt acoustic resonators 22a and 22b may be larger than the aspect ratio difference between third and fourth shunt acoustic resonators 21b and 23b.

Figure 2C:
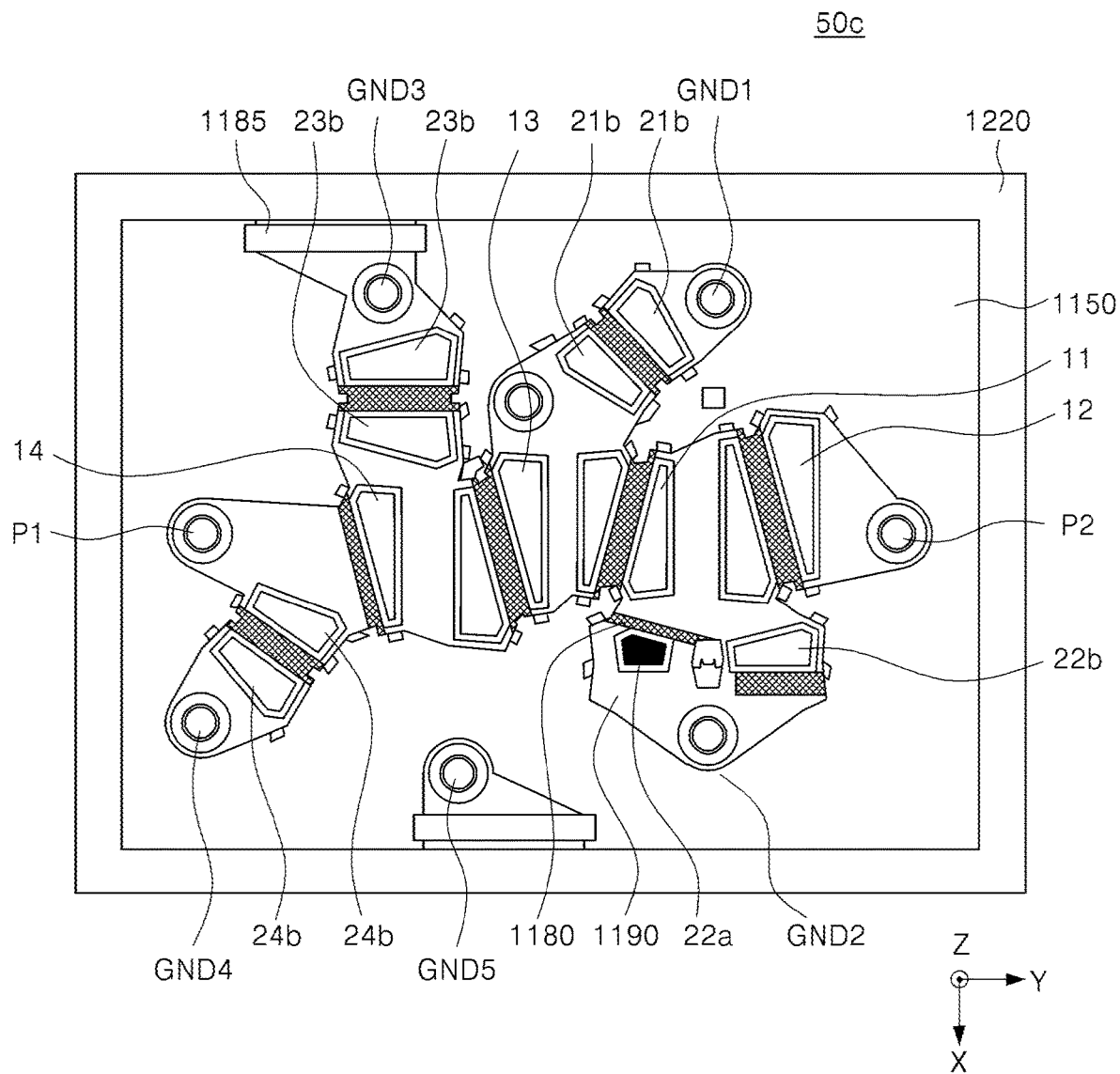
Figure 3C:
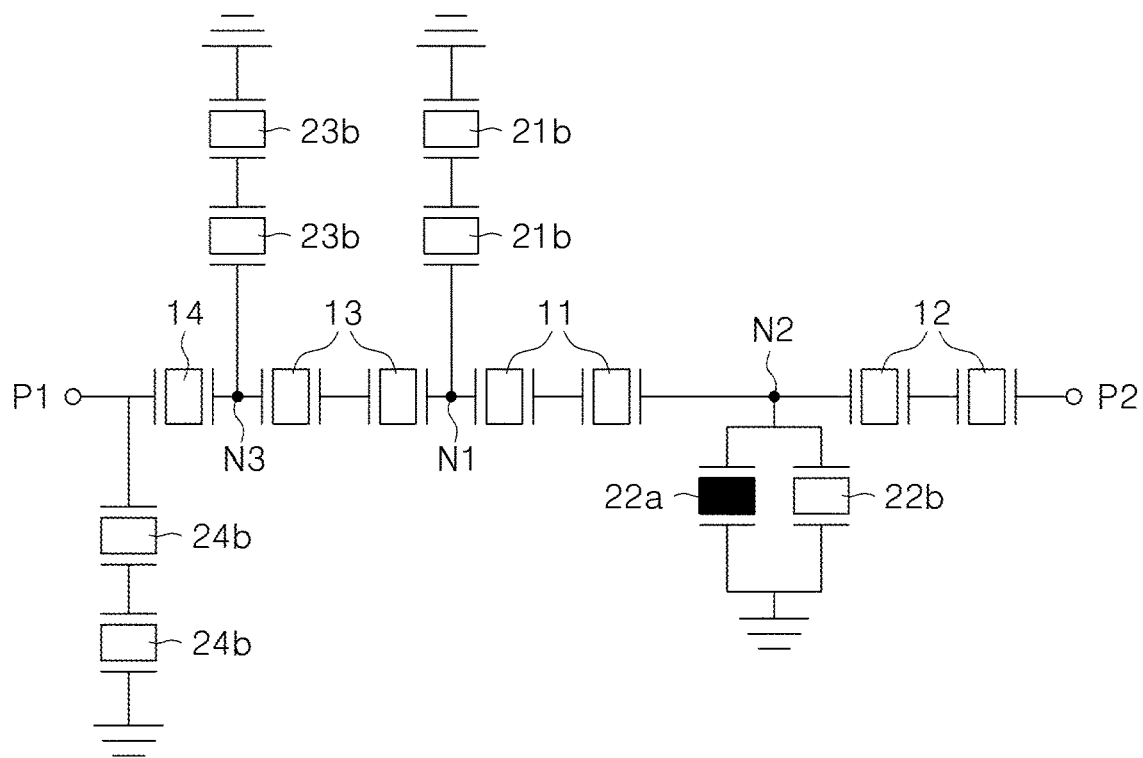

Referring to FIGS. 2C and 3C, a bulk acoustic resonator filter 50c according to an embodiment of the present disclosure may have a structure in which aspect ratios between first and second shunt acoustic resonators 22a and 22b connected in parallel may be different. For example, the first and second shunt acoustic resonators 22a and 22b having different aspect ratios are not limited to being connected in series, and a parasitic impedance difference between the first and second shunt acoustic resonators 22a and 22b connected in parallel may also occur depending on a difference in peripheral structures (e.g., metal layers 1180 and 1190) between the first and second shunt acoustic resonators 22a and 22b or variations in a manufacturing process of a bulk acoustic resonator 50c according to an embodiment of the present disclosure. In a bulk acoustic resonator filter 50c according to an embodiment of the present disclosure, a parasitic impedance difference between the first and second shunt acoustic resonators 22a and 22b having a parallel relationship may be reduced by an aspect ratio difference between the first and second shunt acoustic resonators 22a and 22b.

For example, the first shunt acoustic resonator 22a may be electrically connected to a ground port GND2 through a second electrode disposed on an upper surface of a piezoelectric layer of the first shunt acoustic resonator 22a and a metal layer 1190, and the second shunt acoustic resonator 22b may be electrically connected to the ground port GND2 through a first electrode disposed on a lower surface of a piezoelectric layer of the second shunt acoustic resonator 22b, a metal layer 1180, and the metal layer 1190. This is an anti-parallel connection because the second electrode of the first shunt acoustic resonator 22a is connected to the first electrode of the second shunt acoustic resonator 22b. In a parallel connection, a first electrode of the first shunt acoustic resonator 22a disposed on a lower surface of the piezoelectric layer of the first shunt acoustic resonator 22a would be connected to the first electrode of the second shunt acoustic resonator 22b.

As such, since structures in which the first and second shunt acoustic resonators 22a and 22b are electrically connected to the ground port GND2 may be different from each other, parasitic capacitances of the first and second shunt acoustic resonators 22a and 22b may be different. Since the first and second shunt acoustic resonators 22a and 22b may have different aspect ratios, a difference in parasitic capacitance between the first and second shunt acoustic resonators 22a and 22b may be canceled out. Therefore, the shunt acoustic resonators 21b, 22a, 22b, 23b, and 24b of a bulk acoustic resonator filter 50c according to an embodiment of the present disclosure should not be construed as being limited to being connected to an adjacent shunt acoustic resonator in series.

Figure 2D:
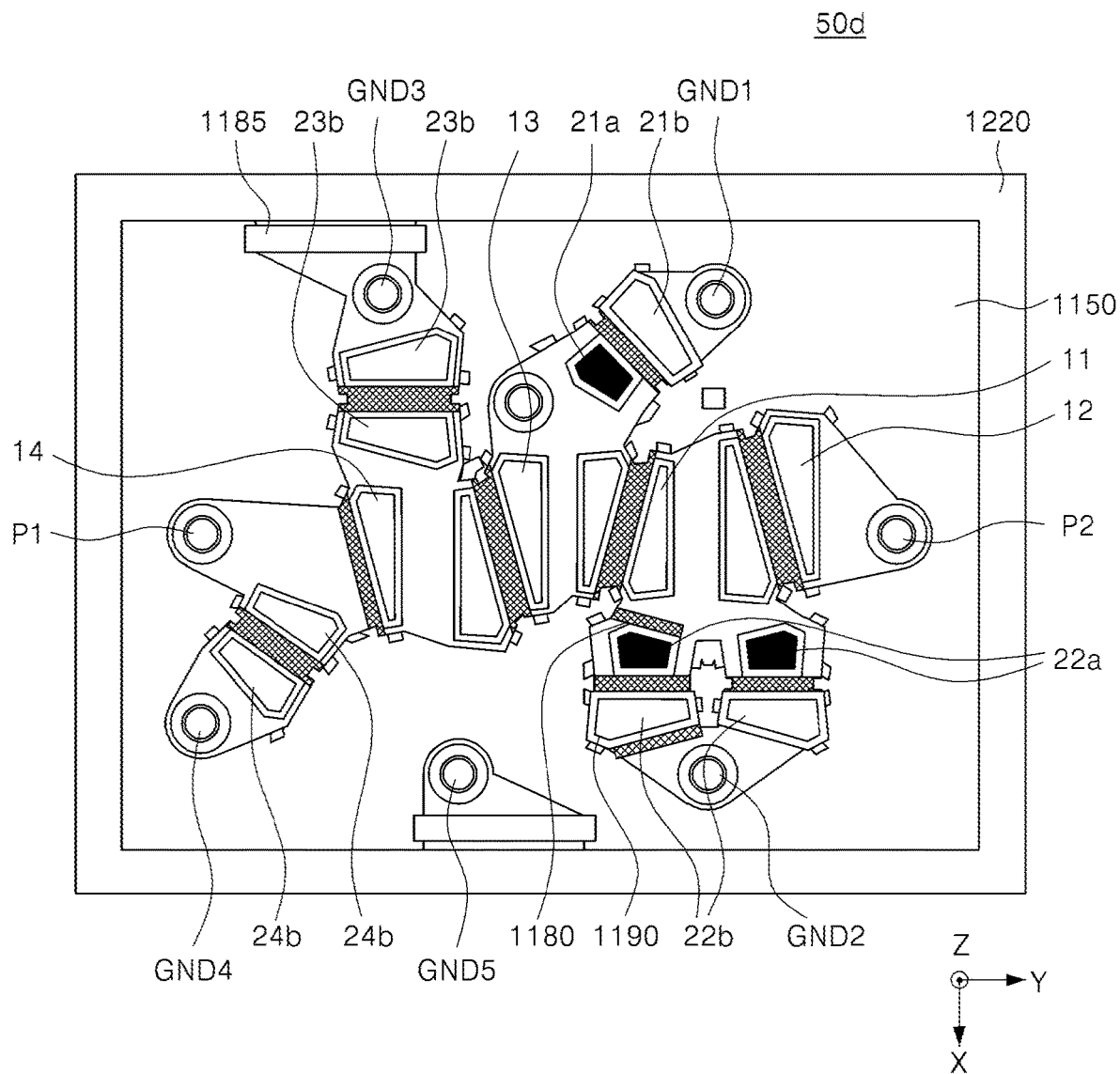
Figure 3D:
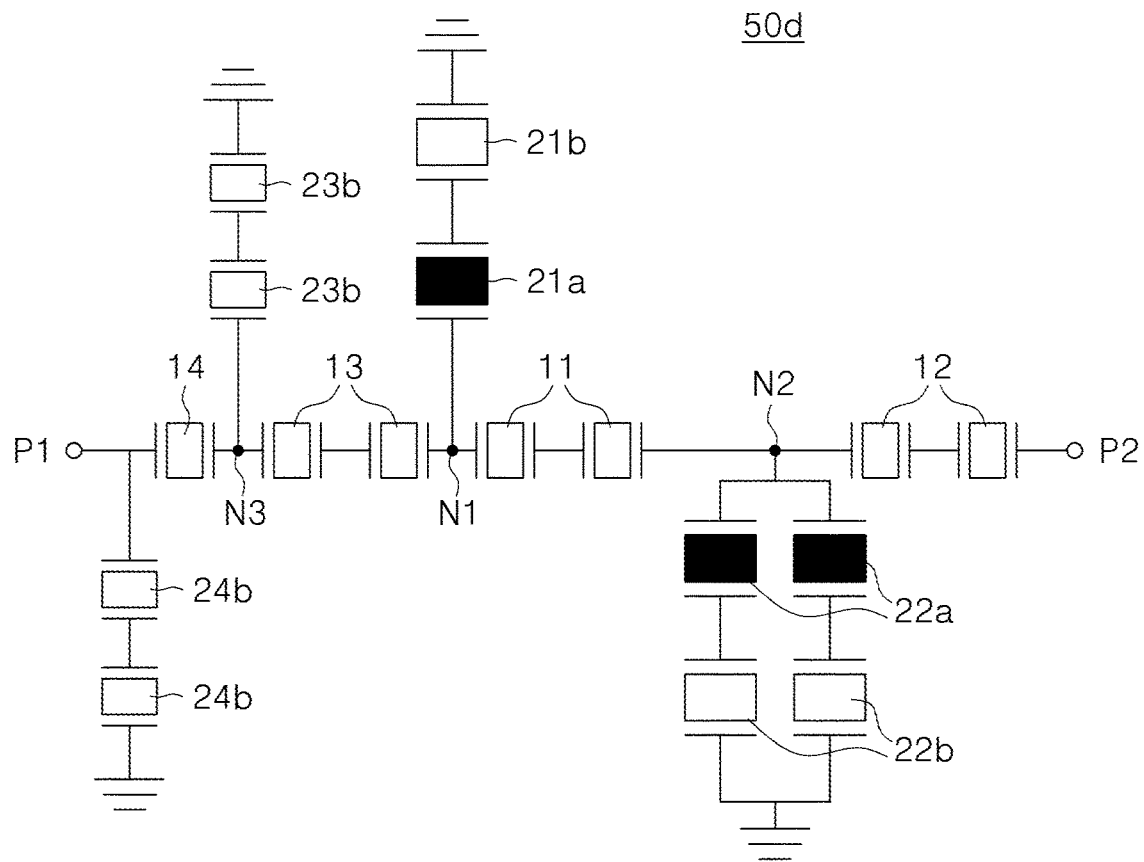

Referring to FIGS. 2D and 3D, a bulk acoustic resonator filter 50d according to an embodiment of the present disclosure may have a structure in which first shunt acoustic resonators 21a and 22a having an aspect ratio closer to 1 than second shunt acoustic resonators 21b and 22b are disposed further from ground ports GND1 and GND2 than second shunt acoustic resonators 21b and 22b. Various factors determine a parasitic impedance of a shunt acoustic resonator, and a resonant frequency and/or an antiresonant frequency of the first shunt acoustic resonators 21a and 22a may be different from a resonant frequency and/or an antiresonant frequency of the second shunt acoustic resonators 21b and 22b. Therefore, a structure in which the first shunt acoustic resonators 21a and 22a having an aspect ratio closer to 1 than the second shunt acoustic resonators 21b and 22b are disposed further from the ground ports GND1 and GND2 than the second shunt acoustic resonators 21b and 22b may also be used depending on a design.

Also, referring to FIG. 3D, in a bulk acoustic resonator filter 50d according to an embodiment of the present disclosure, sizes of the first and second shunt acoustic resonators 21a, 21b, 22a, and 22b (e.g., an area in which the first electrode, the piezoelectric layer, and the second electrode overlap) may be larger than sizes of third shunt acoustic resonators 23b, and may be larger than sizes of fourth shunt acoustic resonators 24b. The first and second shunt acoustic resonators 21a, 21b, 22a, and 22b may be electrically connected between first and second nodes N1 and N2 and ground ports GND1 and GND2, the third shunt acoustic resonators 23b may be electrically connected between a third node N3 and a ground port GND3, and the fourth shunt acoustic resonators 24b may be connected between a first radio frequency port P1 and a ground port GND4.

Since a power of a transmitted RF signal passing through the first radio frequency port P1 electrically connected to an antenna may be less than a power of a transmitted RF signal passing through a second radio frequency port P2, the first and second shunt acoustic resonators 21a, 21b, 22a, 22b electrically connected between the first and second nodes N1 and N2 closer to the second radio frequency port P2 and further away from the antenna and the ground ports GND1 and GND2 may require higher heat dissipation characteristics and/or maximum output characteristics than the third and fourth shunt acoustic resonators 23b and 24b. Therefore, the first and second shunt acoustic resonators 21a, 21b, 22a, and 22b may be implemented to have a larger size than the third and fourth shunt acoustic resonators 23b and 24b for higher heat dissipation characteristics and/or maximum output characteristics.

Therefore, a parasitic impedance difference between the first and second shunt acoustic resonators 21a, 21b, 22a, and 22b may be greater than a parasitic impedance difference between the third shunt acoustic resonators 23b, and may be greater than a parasitic impedance difference between the fourth shunt acoustic resonators 24b.

To reduce an overall impedance difference between the plurality of shunt acoustic resonators, an aspect ratio difference between the first and second shunt acoustic resonators 21a, 21b, 22a, and 22b may be greater than an aspect ratio difference between the third shunt acoustic resonators 23b, and may be greater than an aspect ratio difference between the fourth shunt acoustic resonators 24b. However, in the embodiment of FIGS. 2D and 3D, there is no aspect ratio difference between the third shunt acoustic resonators 23b, and there is no aspect ratio difference between the fourth shunt acoustic resonators 24b. That is, both of the third shunt acoustic resonators 23b have the same aspect ratio as each other, and both of the fourth shunt acoustic resonators 24b have the same aspect ratio as each other.

Figure 2E:
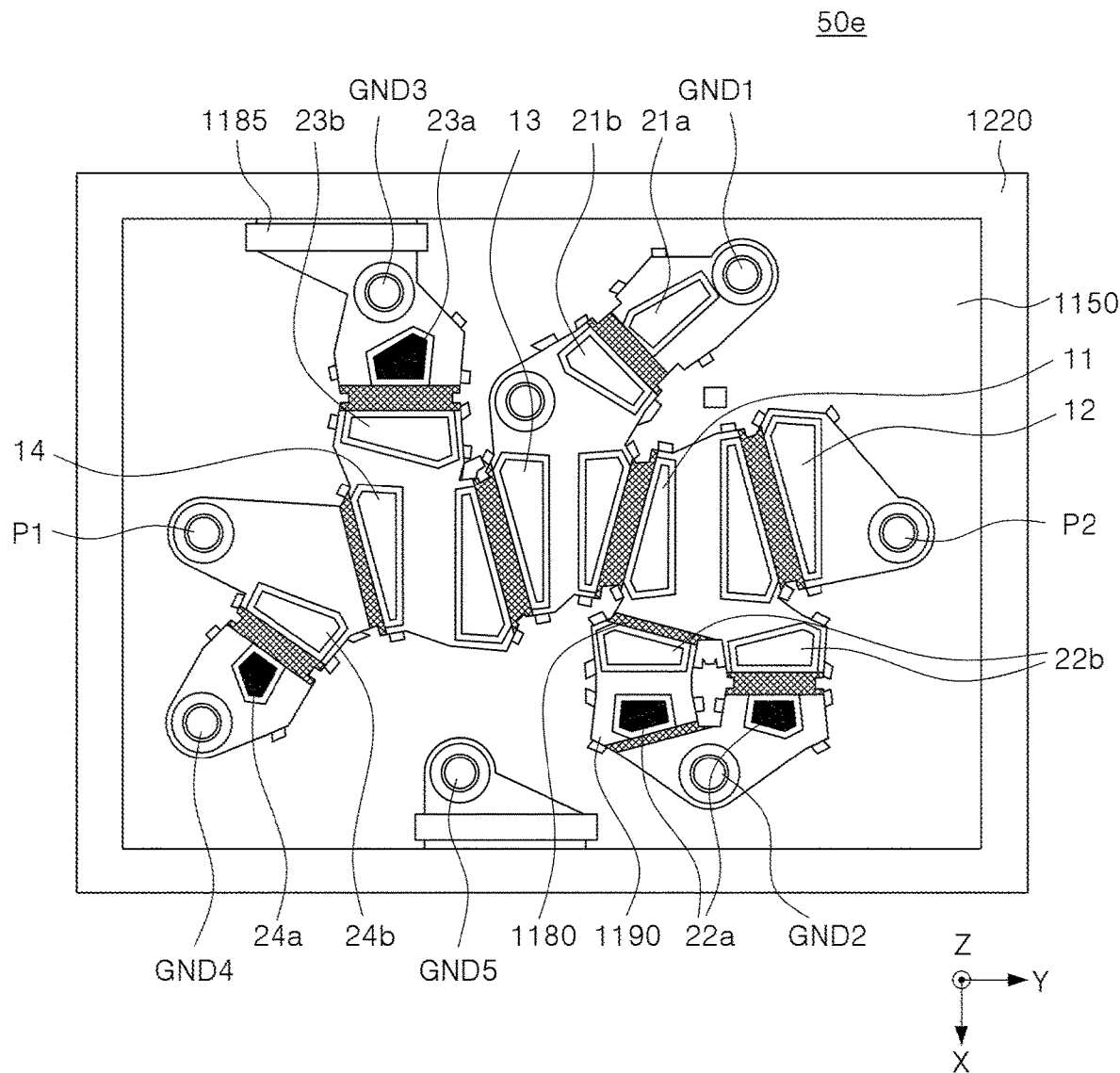

Referring to FIG. 2E, in a bulk acoustic resonator filter 50e according to an embodiment of the present disclosure, among a plurality of shunt acoustic resonators, an aspect ratio of one shunt acoustic resonator 21b closer to a ground port GND1 or a bonding member 1220 than another shunt resonator 21b may be greater than 1, and an aspect ratio of the other shunt acoustic resonator 21b farther from the ground port GND1 or the bonding member 1220 may be greater than 1. For example, depending on a design, the aspect ratio of the one shunt acoustic resonator 21a closer to the ground port GND1 or the bonding member 1220 may not be close to 1 compared to the aspect ratio of the other shunt acoustic resonator 21b farther from the ground port GND1 or the bonding member 1220, and may be the same or substantially the same as the aspect ratio of the other shunt acoustic resonator 21b farther from the ground port GND1 or the bonding member 1220.

Figure 2F:
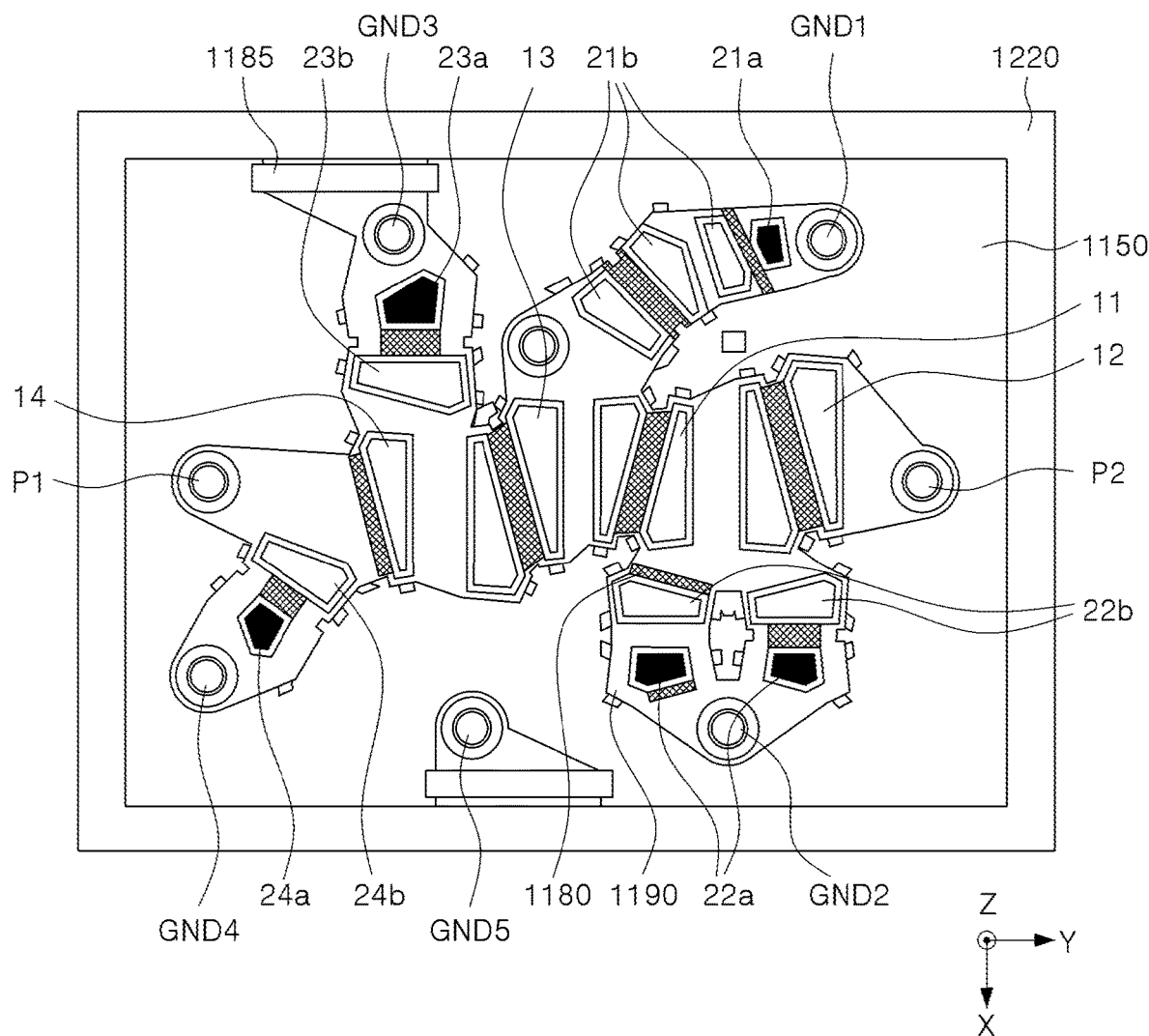
Figure 3E:
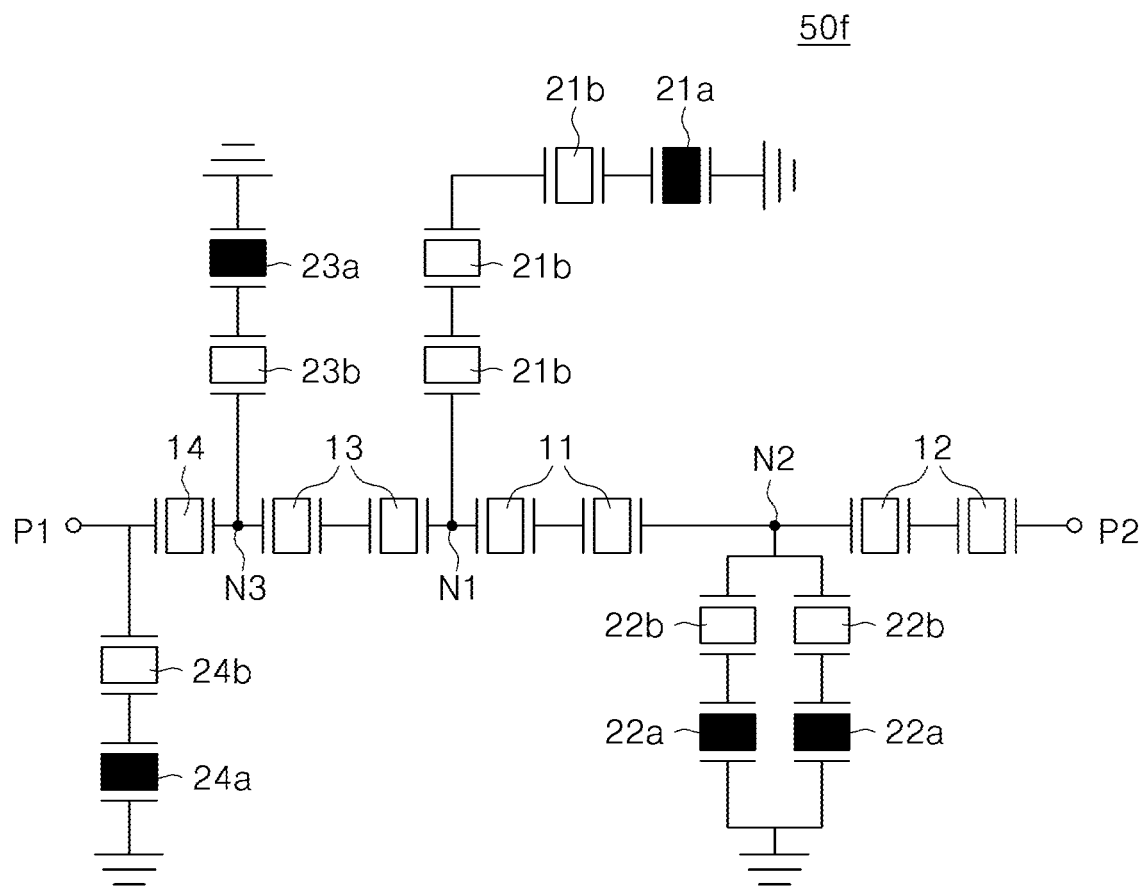

Referring to FIGS. 2F and 3E, a bulk acoustic resonator filter 50f according to an embodiment of the present disclosure may include first, second, third, and fourth shunt acoustic resonators 21a and 21b electrically connected to each other in series. A first shunt acoustic resonator 21a and a second shunt acoustic resonator 21b (a right shunt acoustic resonator 21b) may be connected to each other through a first electrode and a metal layer 1180, the second shunt acoustic resonator 21b (the right shunt acoustic resonator 21b) and a third shunt acoustic resonator 21b (a middle shunt acoustic resonator 21b) may be connected to each other through a second electrode and a metal layer 1190, and the third shunt acoustic resonator 21b (the middle shunt acoustic resonator 21b) and a fourth shunt acoustic resonator 21b (a left shunt acoustic resonator 21b) may be connected to each other through a first electrode and the metal layer 1180. The first shunt acoustic resonator 21a may be disposed closest to a bonding member 1220.

Since the parasitic capacitor formed by the metal layers 1180 and 1190 and the bonding member 1220 may act as a capacitor connected in parallel with the first shunt acoustic resonator 21a, a parasitic impedance difference between the first shunt acoustic resonator 21a and the second shunt acoustic resonator 21b (the right shunt acoustic resonator 21b) may be greater than a parasitic impedance difference between the second shunt acoustic resonator (the right shunt acoustic resonator 21b) and the third shunt acoustic resonator 21b (the middle shunt acoustic resonator 21b), and may be greater than a parasitic impedance difference between the third shunt acoustic resonator 21b (the middle shunt acoustic resonator 21b) and the fourth shunt acoustic resonator 21b (the left shunt acoustic resonator 21b).

To reduce parasitic impedance differences between the first, second, third, and fourth shunt acoustic resonators 21a and 21b, an aspect ratio difference between the first shunt acoustic resonator 21a and the second shunt acoustic resonator 21b (the right shunt acoustic resonator 21b) may be greater than an aspect ratio difference between the second shunt acoustic resonator 21b (the right shunt acoustic resonator 21b) and the third shunt acoustic resonator 21b (the middle shunt acoustic resonator 21b), and may be greater than an aspect ratio difference between the third shunt acoustic resonator 21b (the middle shunt acoustic resonator 21b) and the fourth shunt acoustic resonator 21b (the left shunt acoustic resonator 21b).

Figure 2G:
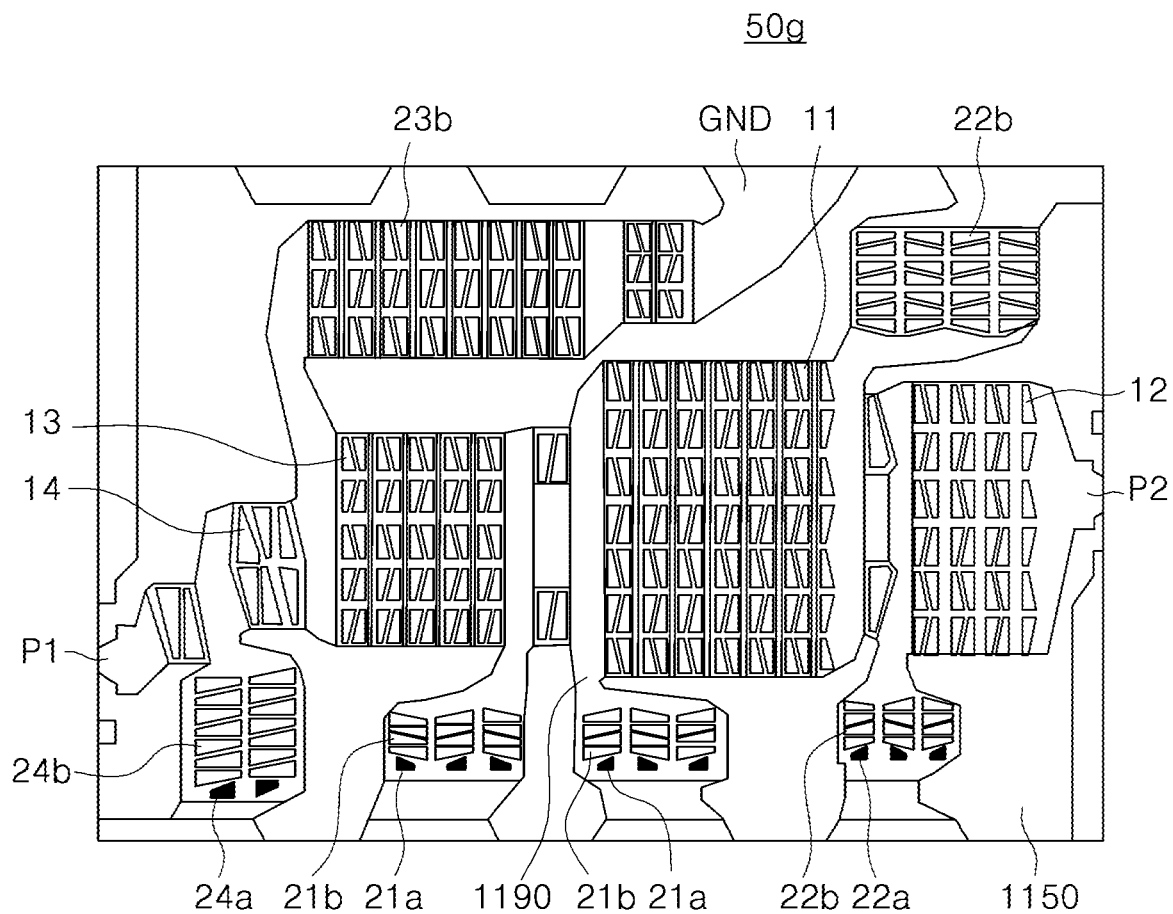

Referring to FIG. 2G, a bulk acoustic resonator filter 50g according to an embodiment of the present disclosure may include a plurality of series acoustic resonators 11, 12, 13, and 14 and a plurality of shunt acoustic resonators 21a, 21b, 22a, 22b, 23b, 24a, and 24b, may have a very high maximum output performance and/or a very high heat dissipation performance, and thus may be used in large electronic devices or installation-type electronic devices.

Figure 3F:
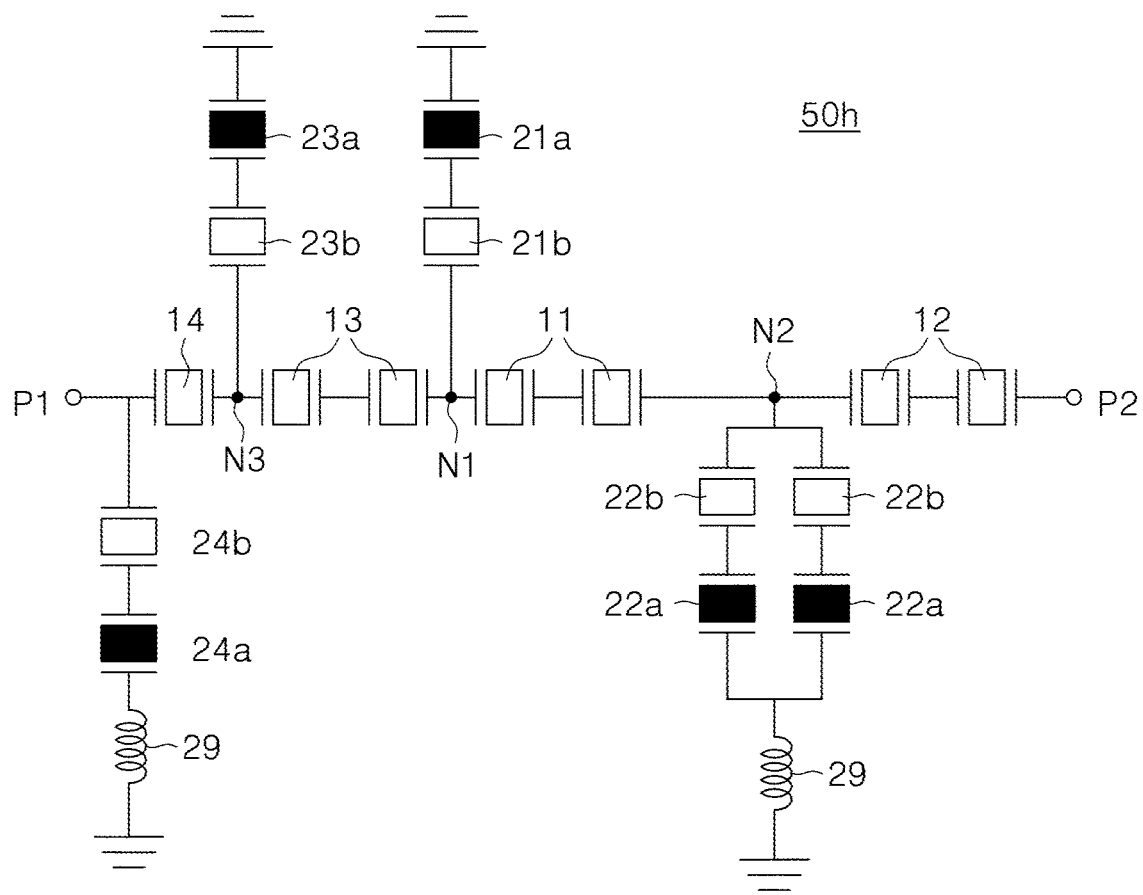

Referring to FIG. 3F, a bulk acoustic resonator filter 50h according to an embodiment of the present disclosure may further include inductors 29 electrically connected in series with a plurality of shunt acoustic resonators 22a, 22b, 24a, and 24b.

Since the inductor 29 may be a portion of an L equivalent component of a series LC equivalent and may be inversely proportional to resonant frequencies of the plurality of shunt acoustic resonators 22a, 22b, 24a, and 24b, resonant frequencies of the plurality of shunt acoustic resonators 22a, 22b, 24a, and 24b may be lowered, resonant frequencies and/or antiresonant frequencies of the plurality of shunt acoustic resonators 22a, 22b, 24a, and 24b may be different from resonant frequencies and/or antiresonant frequencies of a plurality of shunt acoustic resonators 21a, 21b, 23a, and 23b, and a bulk acoustic resonator filter 50h according to an embodiment of the present disclosure may efficiently form a wider bandwidth and/or obtain sharper attenuation characteristics.

Figure 3G:
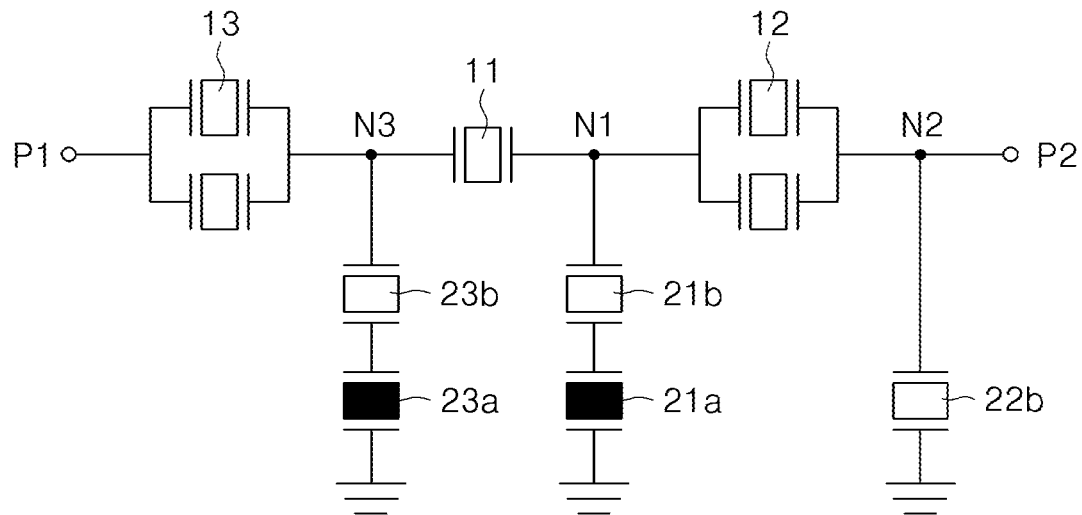

Referring to FIG. 3G, a bulk acoustic resonator filter 50i according to an embodiment of the present disclosure may have a more simplified compared to the bulk acoustic resonator filter of FIG. 1E.

Figure 3H:
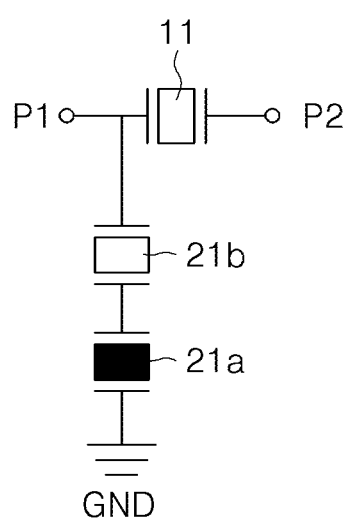

Referring to FIG. 3H, a bulk acoustic resonator filter 50j according to an embodiment of the present disclosure may have a more simplified structure compared to the bulk acoustic resonator filter of FIG. 3G.

Figure 4A:
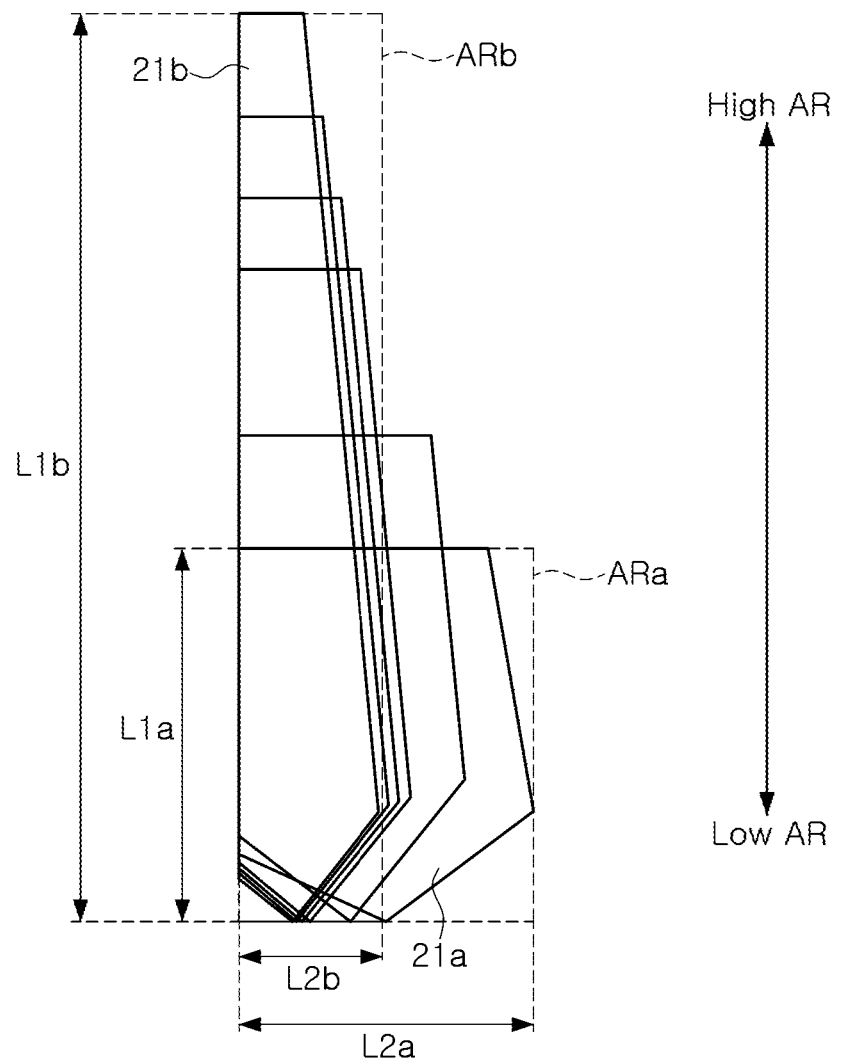
FIG. 4A is a plan view illustrating a change in an aspect ratio of an acoustic resonator of a bulk acoustic resonator filter/package according to embodiments of the present disclosure.

FIG. 4A is a plan view illustrating a change in an aspect ratio of an acoustic resonator of a bulk acoustic resonator filter/package according to embodiments of the present disclosure.

Referring to FIG. 4A, an aspect ratio ARa of an overlap region of a first acoustic resonator 21a may be different from an aspect ratio ARb of an overlap region of a second acoustic resonator 21b. The aspect ratio ARa may be a ratio between a longest length $L1a$ of the overlap region in an extension direction of a longest side of the first acoustic resonator 21a and a longest length $L2a$ of the overlap region in a direction perpendicular to the extension direction, and may be a low aspect ratio (Low AR). The aspect ratio ARb may be a ratio between a longest length $L1b$ of the overlap region in an extension direction of a longest side of the second acoustic resonator 21b and a longest length $L2b$ of the overlap region in a direction perpendicular to the extension direction, and may be a high aspect ratio (High AR).

For the aspect ratio measurement, a virtual rectangle sharing the longest sides of the first and second acoustic resonators 21a and 21b may be defined. A size of the virtual rectangle may be set such that remaining sides of the virtual rectangle pass through vertices of the first and second acoustic resonators 21a and 21b.

A length of a long side of the virtual rectangle may be each of the lengths $L1a$ and $L1b$ in the extension direction of the longest side, and may be equal to or longer than the length of the longest side, according to a specific shape of the first and second acoustic resonators 21a and 21b. A length of a short side of the virtual rectangle may be each of the lengths $L2a$ and $L2b$ in a direction perpendicular to the longest side.

The aspect ratios ARa and ARb illustrated in FIG. 4A may be 1.2 and 6, respectively, but are not limited thereto.

To reduce an unwanted characteristic difference between the first and second acoustic resonators 21a and 21b, areas of the first and second acoustic resonators 21a and 21b may be equal to each other. For example, to adjust the aspect ratios ARa and ARb, the lengths of the longest sides of the first and second acoustic resonators 21a and 21b may be preferentially adjusted, and lengths of remaining sides of the first and second acoustic resonators 21a and 21b may be adjusted to be lengths calculated such that the areas of the first and second acoustic resonators 21a and 21b are maintained the same in response to the length adjustment of the longest sides.

Therefore, since the first and second acoustic resonators 21a and 21b may have similar shapes while having different aspect ratios ARa and ARb, a difference in the aspect ratio ARa and ARb of the first and second acoustic resonators 21a and 21b may generate an antiresonant frequency difference without substantially inducing a resonant frequency difference between the first and second acoustic resonators 21a and 21b.

Figure 4B:
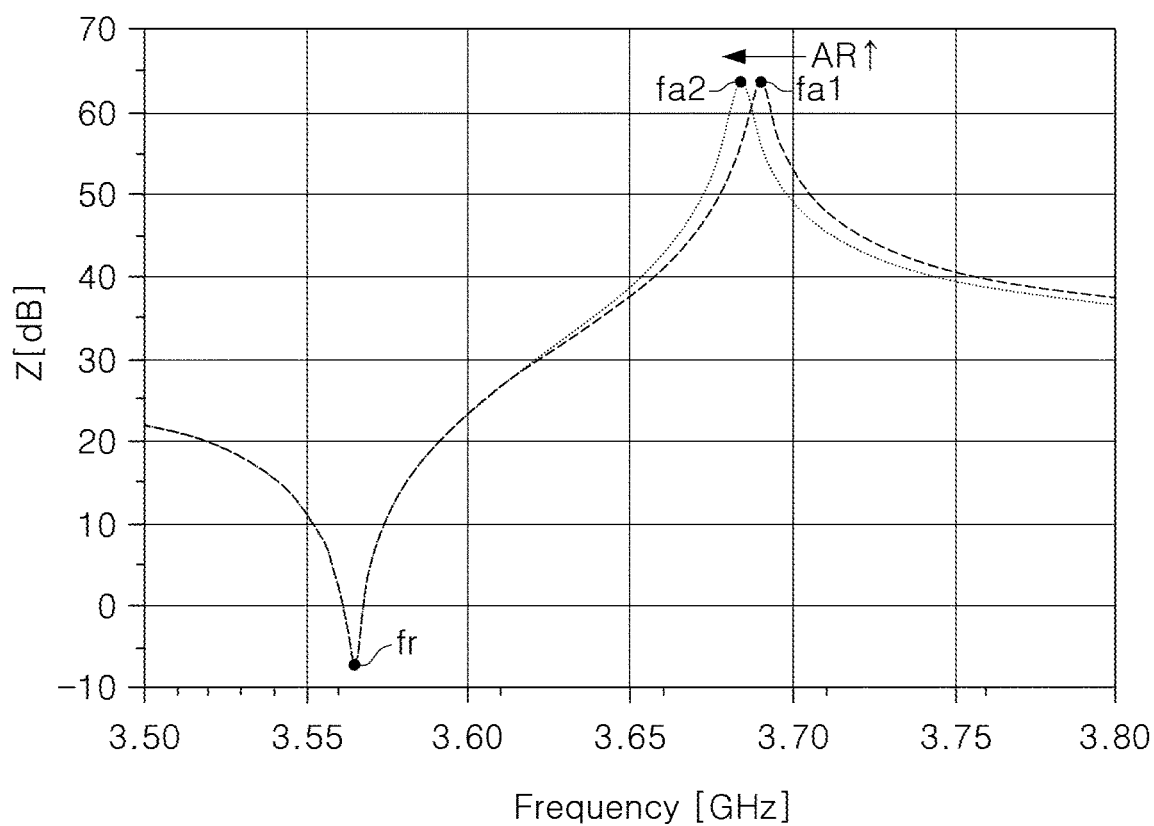
FIG. 4B is a graph illustrating a change in an antiresonant frequency according to a change in the aspect ratio of the acoustic resonator of FIG. 4A.

FIG. 4B is a graph illustrating a change in an antiresonant frequency according to a change in the aspect ratio of the acoustic resonator of FIG. 4A.

Referring to FIG. 4B, an impedance Z of the acoustic resonator may be a maximum at antiresonant frequencies fa1 and fa2 and a minimum at a resonant frequency fr. As an aspect ratio AR of the acoustic resonator increases, the antiresonant frequency may decrease from a first antiresonant frequency fa1 to a second antiresonant frequency fa2, and the resonant frequency fr may be substantially fixed.

For example, aspect ratios of a plurality of shunt acoustic resonators of a bulk acoustic resonator filter according to an embodiment of the present disclosure may be different from each other such that an antiresonant frequency difference fa1-fa2 between the plurality of shunt acoustic resonators decreases.

Figure 4C:
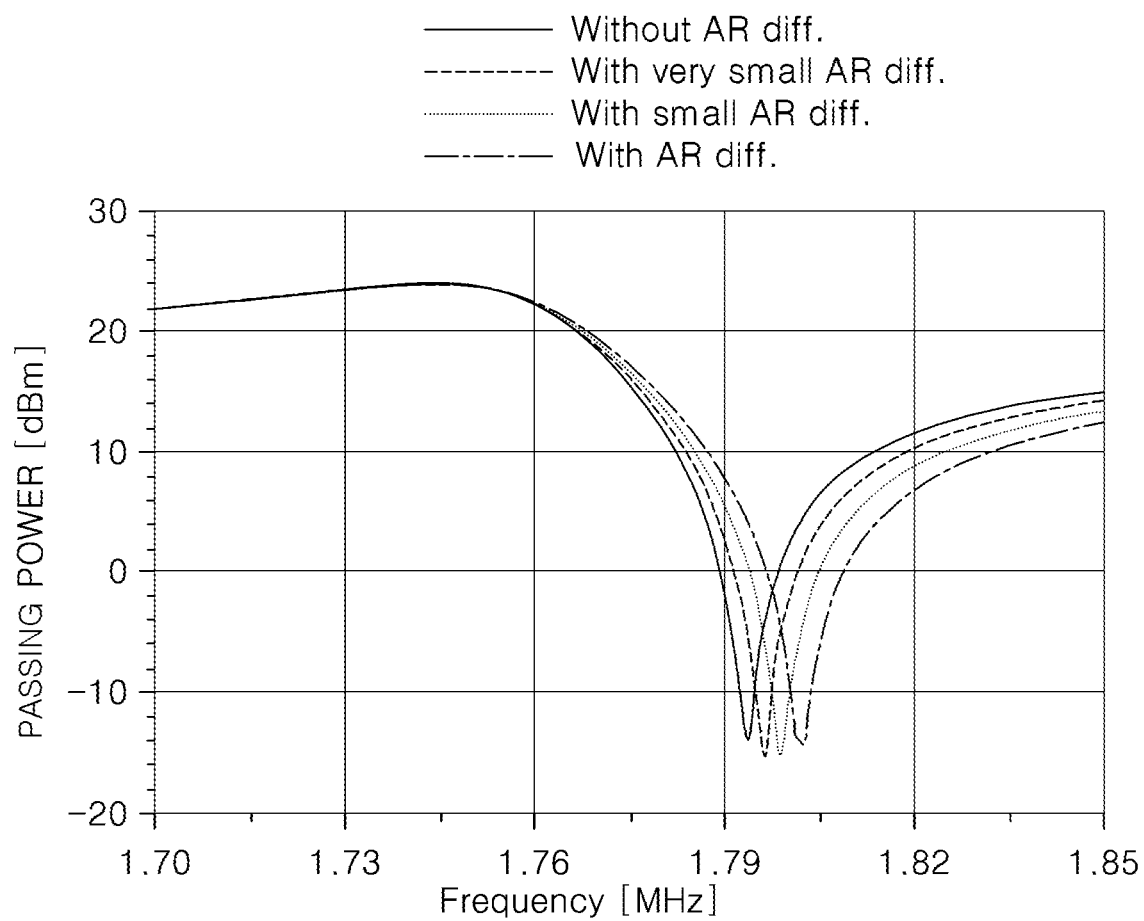
FIG. 4C is a graph illustrating a change in power passing through the shunt acoustic resonators of FIG. 3H as an aspect ratio of a shunt acoustic resonator connected closest to a ground or a bonding member decreases.

FIG. 4C is a graph illustrating a change in power passing through the plurality of shunt acoustic resonators of FIG. 3H as an aspect ratio of a shunt acoustic resonator connected closest to a ground or a bonding member changes.

Referring to FIG. 4C, a frequency at which the power passing through the shunt acoustic resonator of FIG. 3H connected closest to the ground or the bonding member is a minimum may correspond to an antiresonant frequency of the shunt acoustic resonator, and may increase as an aspect ratio of the shunt acoustic resonator connected closest to the ground or the bonding member decreases. An aspect ratio difference AR diff. between the plurality of shunt acoustic resonators of FIG. 3H may increase as the aspect ratio of the shunt acoustic connected closest to the ground or the bonding member decreases.

Figure 4D:
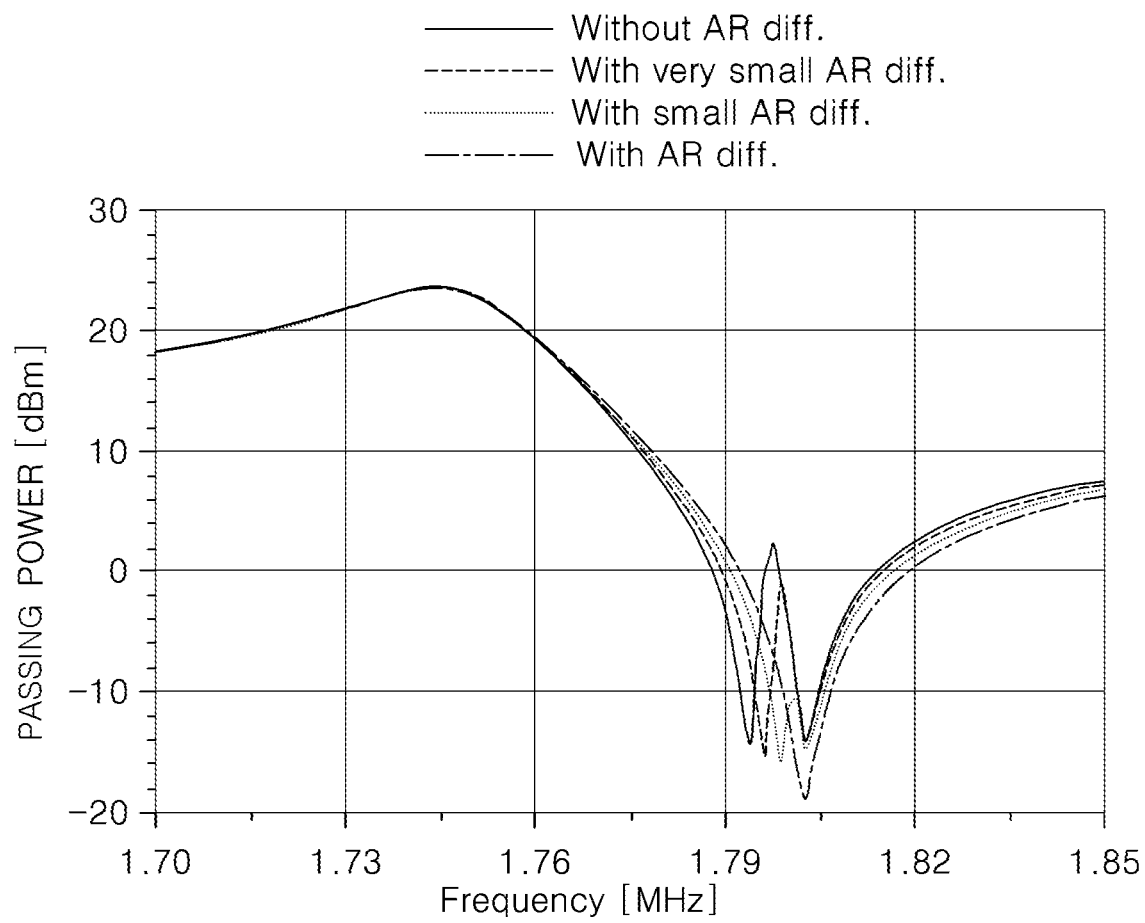
FIG. 4D is a graph illustrating a change in power passing through the plurality of shunt acoustic resonators of FIG. 3H according to the change in power passing through the plurality of shunt acoustic resonators shown in FIG. 4C.

FIG. 4D is a graph illustrating a change in power passing through the plurality of shunt acoustic resonators of FIG. 3H according to the change in power passing through the plurality of shunt acoustic resonators shown in FIG. 4C.

Referring to FIG. 4D, a frequency having the lowest power passing through the plurality of shunt acoustic resonators of FIG. 3H may correspond to an overall antiresonant frequency of the plurality of shunt acoustic resonators. As an antiresonant frequency difference of the plurality of shunt acoustic resonators decreases, a minimum value of the power passing through the plurality of shunt acoustic resonators decreases. The minimum value of the power passing through the plurality of shunt acoustic resonators decreases as an aspect ratio difference AR diff. between the plurality of shunt acoustic resonators increases.

For example, increasing an aspect ratio difference AR diff. between the plurality of shunt acoustic resonators may decrease a parasitic impedance difference between the plurality of shunt acoustic resonators. Therefore, increasing the aspect ratio difference AR diff. may decrease an antiresonant frequency difference of the plurality of shunt acoustic resonators, and decrease the minimum value of the power passing through the plurality of shunt acoustic resonators. Therefore, an energy loss at a frequency adjacent to antiresonant frequencies of the plurality of shunt acoustic resonators in a bandwidth of a bulk acoustic resonator filter according to an embodiment of the present disclosure may be reduced.

Figure 4E:
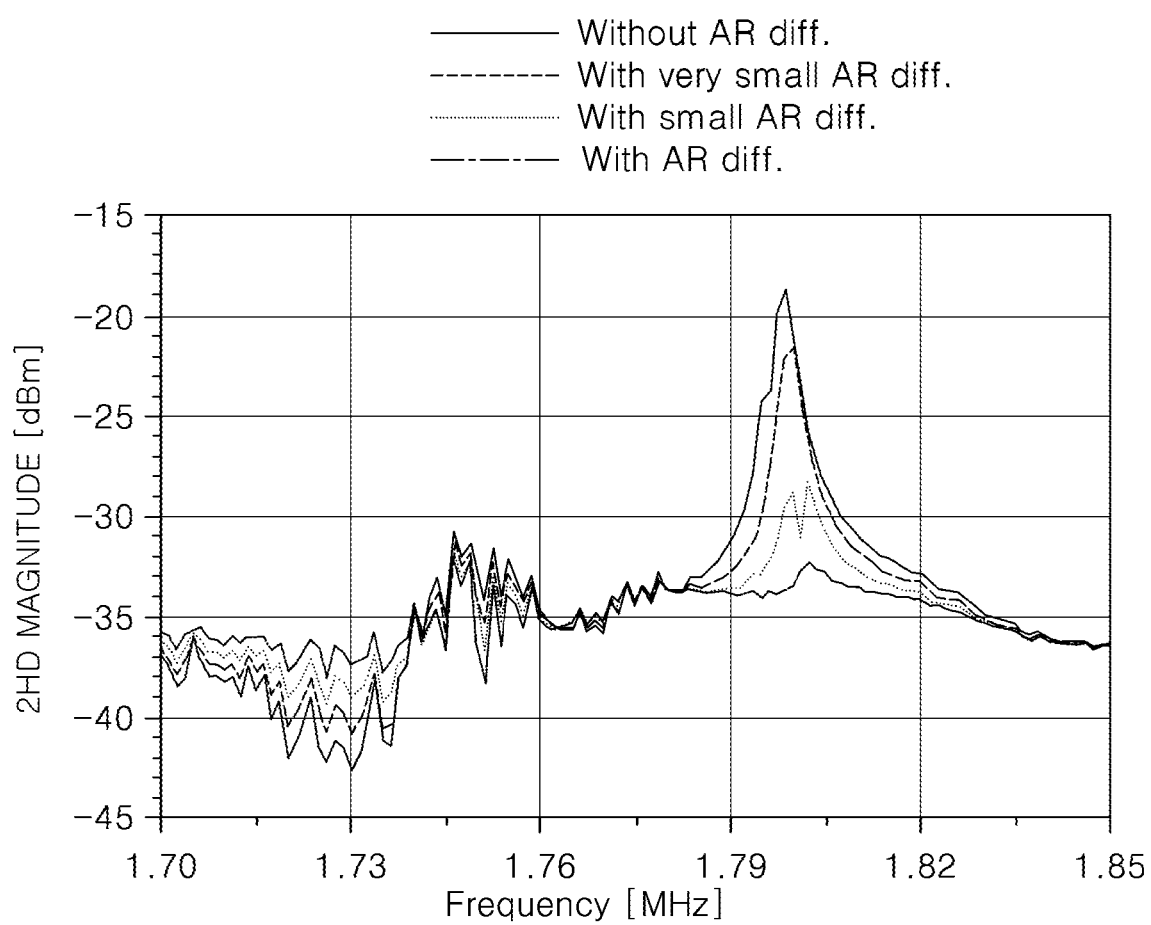
FIG. 4E is a graph illustrating a magnitude of second order harmonics in a signal passing through the plurality of shunt acoustic resonators of FIG. 3H according to the change in power passing through the plurality of shunt acoustic resonators shown in FIG. 4D.
Figure 4F:
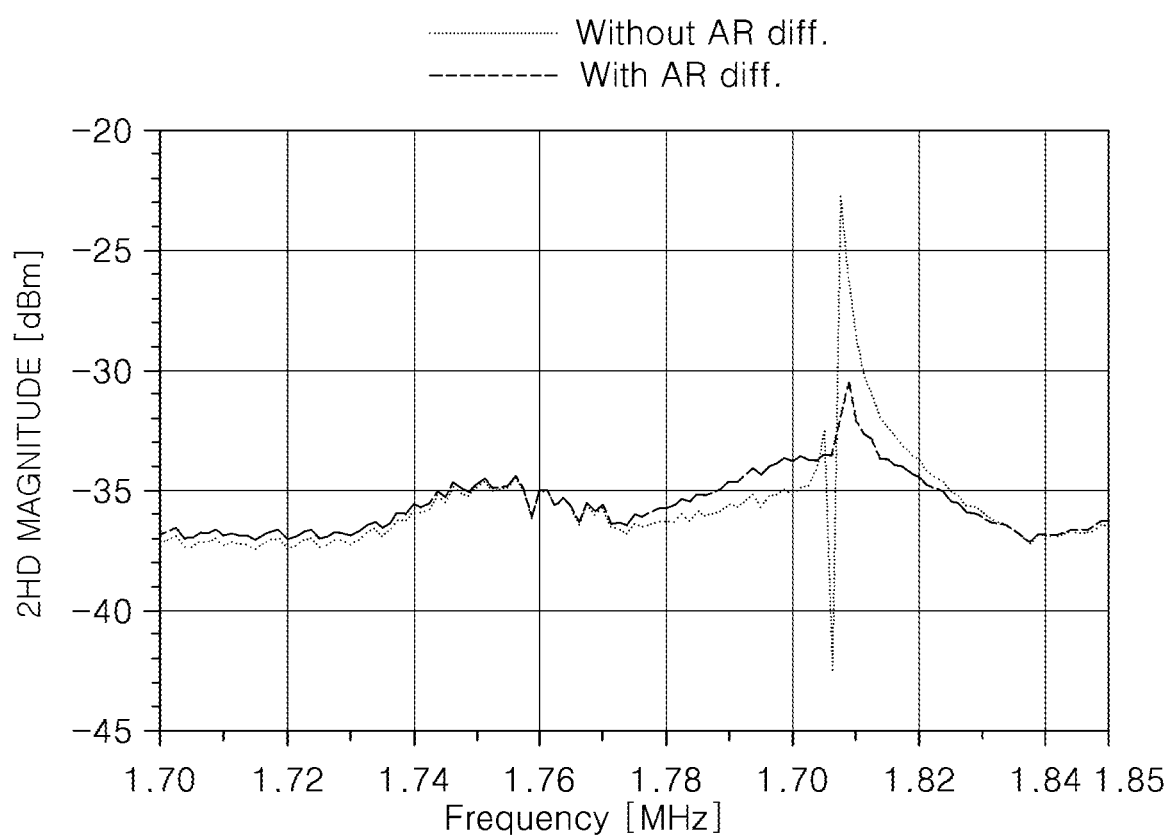
FIG. 4F is a graph illustrating a magnitude of second order harmonics in the signal passing through the plurality of shunt acoustic resonators of FIG. 3H as an aspect ratio of a shunt acoustic resonator connected closest to a ground among a plurality of shunt acoustic resonators having sizes larger than sizes of the plurality of shunt acoustic resonators of FIG. 3H decreases.

FIG. 4E is a graph illustrating a magnitude of second order harmonics in a signal passing through the plurality of shunt acoustic resonators of FIG. 3H according to the change in power passing through the plurality of shunt acoustic resonators shown in FIG. 4D, and FIG. 4F is a graph illustrating a magnitude of second order harmonics in the signal passing through the plurality of shunt acoustic resonators of FIG. 3H as an aspect ratio of a shunt acoustic resonator connected closest to a ground among a plurality of shunt acoustic resonators having sizes larger than sizes of the plurality of shunt acoustic resonators of FIG. 3H decreases.

Referring to FIGS. 4E and 4F, an aspect ratio difference AR diff. between a plurality of shunt acoustic resonators may increase to offset a parasitic impedance difference between the plurality of shunt acoustic resonators and decrease a maximum magnitude of second order harmonics in the signal passing through the plurality of shunt acoustic resonators. Therefore, linearity characteristics and/or heat dissipation characteristics of a bulk acoustic resonator filter according to an embodiment of the present disclosure may be improved.

Figure 4G:
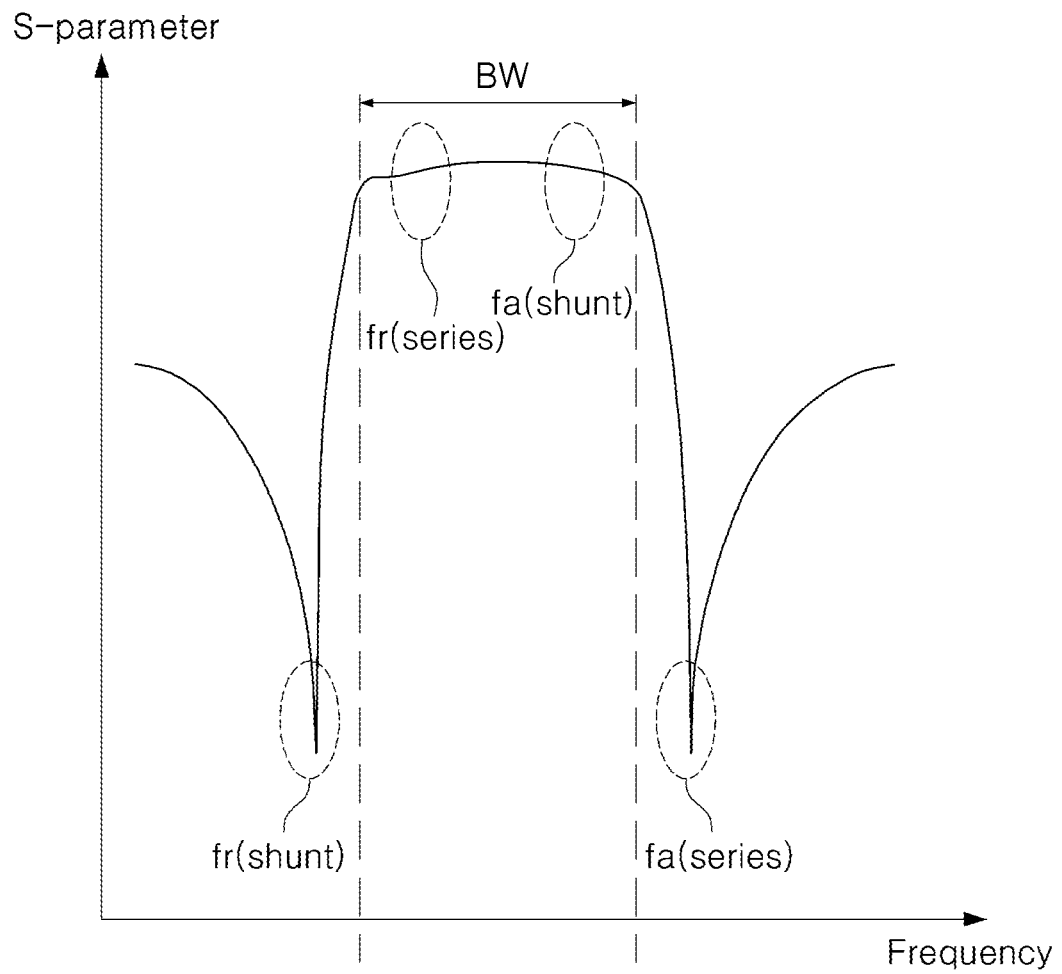
FIG. 4G is a graph illustrating a bandwidth of the bulk acoustic resonator filter of FIG. 3H.

FIG. 4G is a graph illustrating a bandwidth of the bulk acoustic resonator filter of FIG. 3H.

Referring to FIG. 4G, a bandwidth (BW) of a bulk acoustic resonator filter according to an embodiment of the present disclosure may be in a frequency range in which an S-parameter between a first radio frequency (RF) port and a second radio frequency (RF) port is high.

Since a resonant frequency fr(shunt) of a plurality of shunt acoustic resonators may be outside the bandwidth BW, and an antiresonant frequency fa(shunt) of the plurality of shunt acoustic resonators may be within the bandwidth BW, in order to reduce an energy loss, reducing a difference in antiresonant frequency fa(shunt) of the plurality of shunt acoustic resonators may be more important than reducing a difference in resonant frequency fr(shunt) of the plurality of shunt acoustic resonators.

Therefore, the difference in the antiresonant frequency fa(shunt) between the plurality of shunt acoustic resonators may be smaller than the difference in the resonant frequency fr(shunt) between the plurality of shunt acoustic resonators, and a difference in an aspect ratio between the plurality of shunt acoustic resonators may effectively reduce the difference in the antiresonant frequency fa(shunt) between the plurality of shunt acoustic resonators.

A resonant frequency fr(series) of at least one series acoustic resonator may be higher than the resonant frequency fr(shunt) of each of the plurality of shunt acoustic resonators, and an antiresonant frequency fa(series) of the at least one series acoustic resonator may be higher than the antiresonant frequency fa(shunt) of each of the plurality of shunt acoustic resonators. The difference in the resonant frequency fr(shunt) between the plurality of shunt acoustic resonators may be smaller than a difference between a highest resonant frequency fr(shunt) among the resonant frequencies fr(shunt) of the plurality of shunt acoustic resonators, and the resonant frequency fr(series) of the at least one series acoustic resonator. For example, the difference in the resonant frequency fr(shunt) and/or the difference in antiresonant frequency fa(shunt) between the plurality of shunt acoustic resonators may be small.

Figure 5A:
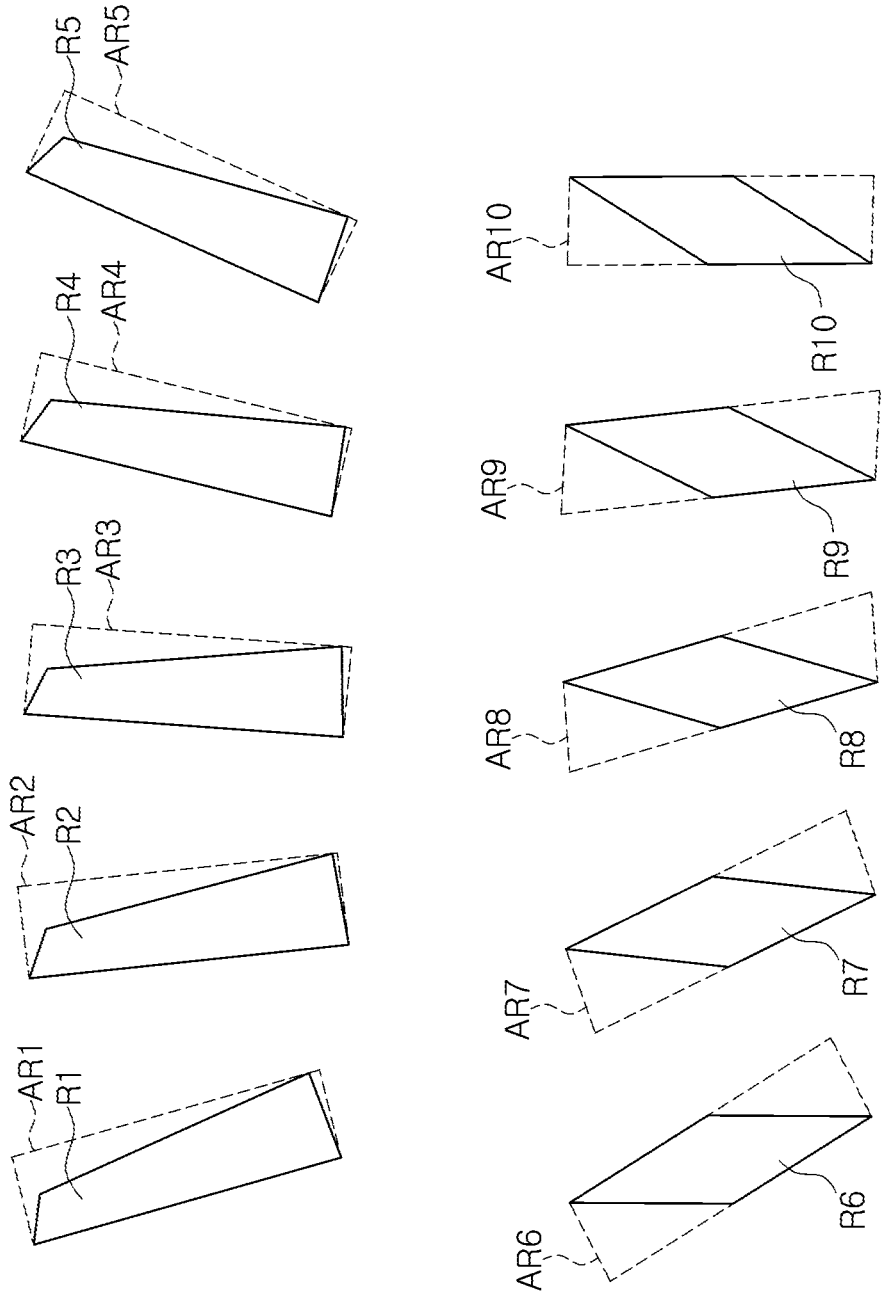
FIG. 5A is a view illustrating aspect ratio measurements for various types of acoustic resonators of a bulk acoustic resonator filter/package according to embodiments of the present disclosure.
Figure 5B:
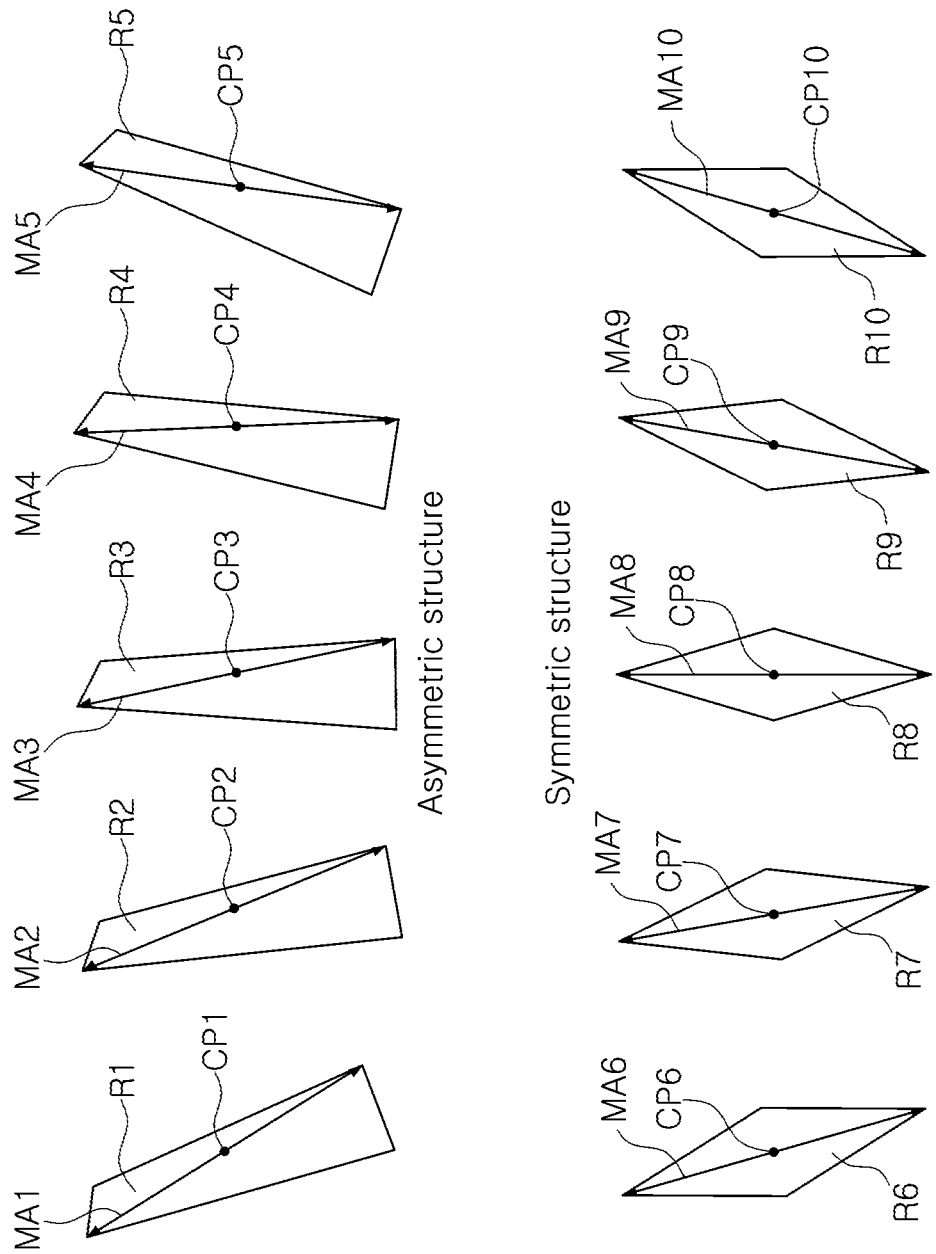
FIG. 5B is a view illustrating asymmetric structures and symmetric structures of an acoustic resonator of a bulk acoustic resonator filter/package according to embodiments of the present disclosure.

FIG. 5A is a view illustrating aspect ratio measurements for various types of acoustic resonators of a bulk acoustic resonator filter/package according to embodiments of the present disclosure, and FIG. 5B is a view illustrating asymmetric structures and symmetric structures of an acoustic resonator of a bulk acoustic resonator filter/package according to embodiments of the present disclosure.

Referring to FIGS. 5A and 5B, each of overlap regions of a plurality of acoustic resonators R1, R2, R3, R4, R5, R6, R7, R8, R9, and R10 may have a quadrangular shape that is different from the pentagon shape of each of overlap regions of the first acoustic resonator 21a and the second acoustic resonator 21b of FIG. 4A. For example, the number of sides of each of overlap regions of the plurality of acoustic resonators R1, R2, R3, R4, R5, R6, R7, R8, R9, and R10 may be changed depending on a design.

Referring to FIG. 5A, a longitudinal direction and a lateral direction, which are references for determining aspect ratios AR1, AR2, AR3, AR4, AR5, AR6, AR7, AR8, AR9, and AR10 of the plurality of acoustic resonators R1, R2, R3, R4, R5, R6, R7, R8, R9, and R10, may be changed depending on shapes (or rotation) of the plurality of acoustic resonators R1, R2, R3, R4, R5, R6, R7, R8, R9, and R10. For example, although the plurality of acoustic resonators R1, R2, R3, R4, and R5 have different rotation angles relative to each other, the aspect ratios AR1, AR2, AR3, AR4, and AR5 of the plurality of acoustic resonators R1, R2, R3, R4, and R5 may be identical to each other, and although the plurality of acoustic resonators R6, R7, R8, R9, and R10 have different rotation angles relative each other, the aspect ratios AR6, AR7, AR8, AR9, and AR10 of the plurality of acoustic resonators R6, R7, R8, R9, and R10 may be identical to each other.

For example, the plurality of acoustic resonators R1, R2, R3, R4, R5, R6, R7, R8, R9, and R10 may have different rotation angles, and may have different symmetries (symmetries at centers of the acoustic resonators in the longitudinal and/or lateral directions). Symmetries of the plurality of acoustic resonators R6, R7, R8, R9, and R10 may be higher than symmetries of the plurality of acoustic resonators R1, R2, R3, R4, and R5.

Characteristics according to aspect ratios AR of the plurality of acoustic resonators R1, R2, R3, R4, and R5 having relatively low symmetries are illustrated in Table 1 below.

TABLE 1

| AR | fr [GHz] | fa [GHz] | kt² [%] | IL [dB] | Attn. [dB] |
|---|---|---|---|---|---|
| 1.3 | 3.5550 | 3.6915 | 8.80 | −0.049 | 32.8 |
| 2.4 | 3.5550 | 3.6905 | 8.74 | −0.034 | 31.4 |
| 3.8 | 3.5550 | 3.6880 | 8.59 | −0.032 | 28.7 |

In this case, a lower insertion loss IL may be better, and a higher attenuation characteristic Attn. may be better. The insertion loss IL may become significantly lower as the aspect ratios AR of the plurality of acoustic resonators R1, R2, R3, R4, and R5 increase from 1.3 to 2.6, and the attenuation characteristic Attn. of the plurality of acoustic resonators R1, R2, R3, R4, and R5 may become significantly higher as the aspect ratios AR of the plurality of acoustic resonators R1, R2, R3, R4, and R5 decrease from 3.8 to 2.4.

Therefore, a shunt acoustic resonator having a relatively high aspect ratio AR among a plurality of shunt acoustic resonators of a bulk acoustic resonator filter according to embodiments of the present disclosure may have an aspect ratio AR greater than 1.3 and less than 3.8, or an aspect ratio AR of about 2.4. Therefore, the bulk acoustic resonator filter may have a low insertion loss IL and a high attenuation characteristic Attn.

Characteristics according to aspect ratios AR of the plurality of acoustic resonators R6, R7, R8, R9, and R10 having relatively high symmetries are illustrated in Table 2 below.

TABLE 2

| AR | kt² [%] | IL [dB] | Attn. [dB] |
|---|---|---|---|
| 4.8 | 8.59 | −0.025 | 30.9 |
| 6.6 | 8.47 | −0.022 | 29.6 |

As an aspect ratio AR increases, a width of a metal layer connected to an acoustic resonator may increase. Therefore, an insertion loss IL may decrease.

The plurality of acoustic resonators R6, R7, R8, R9, and R10 having relatively high symmetries may have relatively high aspect ratios AR of 4.8 to 6.6, and may have attenuation characteristics Attn. that are similar to the attenuation characteristics Attn. of the plurality of acoustic resonators R1, R2, R3, R4, and R5 having relatively low symmetries.

For example, the plurality of acoustic resonators R6, R7, R8, R9, and R10 having relatively high symmetries may have aspect ratios AR of 4.8 or more and 6.6 or less. Therefore, the bulk acoustic resonator filter may have a low insertion loss IL and a high attenuation characteristic Attn.

An acoustic resonator having a relatively high symmetry and a relatively high aspect ratio AR may be effective for use as a series acoustic resonator in which low insertion loss is relatively more important, and may also be used in a shunt acoustic resonator having a relatively high aspect ratio AR among a plurality of shunt acoustic resonators. In this case, an acoustic resonator having a relatively low symmetry and a relatively low aspect ratio AR (greater than 1.3 and less than 3.8) may be effective for use in a shunt acoustic resonator disposed closer to a ground or a bonding member.

Since all of the acoustic resonators having the aspect ratios AR listed in Tables 1 and 2 have at least a good insertion loss IL and at least a good attenuation characteristic Attn., an aspect ratio AR of each of the plurality of shunt acoustic resonators of a bulk acoustic resonator filter according to embodiments of the present disclosure may fall within a range of greater than 1.3 and less than or equal to 6.6, and may be appropriately optimized within the range.

Referring to FIG. 5B, centers CP1, CP2, CP3, CP4, CP5, CP6, CP7, CP8, CP9, and CP10 of long axes MA1, MA2, MA3, MA4, MA5, MA6, MA7, MA8, MA9, and MA10 of the plurality of acoustic resonators R1, R2, R3, R4, R5, R6, R7, R8, R9, and R10 may be references for measuring symmetries of the plurality of acoustic resonators R1, R2, R3, R4, R5, R6, R7, R8, R9, and R10.

For example, as distances between the centers CP1, CP2, CP3, CP4, and CP5 of the plurality of acoustic resonators R1, R2, R3, R4, and R5 and centers of gravity of the plurality of acoustic resonators R1, R2, R3, R4, and R5 increase. the plurality of acoustic resonators R1, R2, R3, R4, and R5 may be become more asymmetric. For example, when the plurality of acoustic resonators R6, R7, R8, R9, and R10 are completely symmetric, the centers CP6, CP7, CP8, CP9, and CP10 of the plurality of acoustic resonators R6, R7, R8, R9, and R10 may be located at the centers of gravity of the plurality of acoustic resonators R6, R7, R8, R9, and R10. In this case, the long axes MA1, MA2, MA3, MA4, MA5, MA6, MA7, MA8, MA9, and MA10 may have the longest distances among distances between vertices of the plurality of acoustic resonators R1, R2, R3, R4, R5, R6, R7, R8, R9, and R10.

Figure 5C:
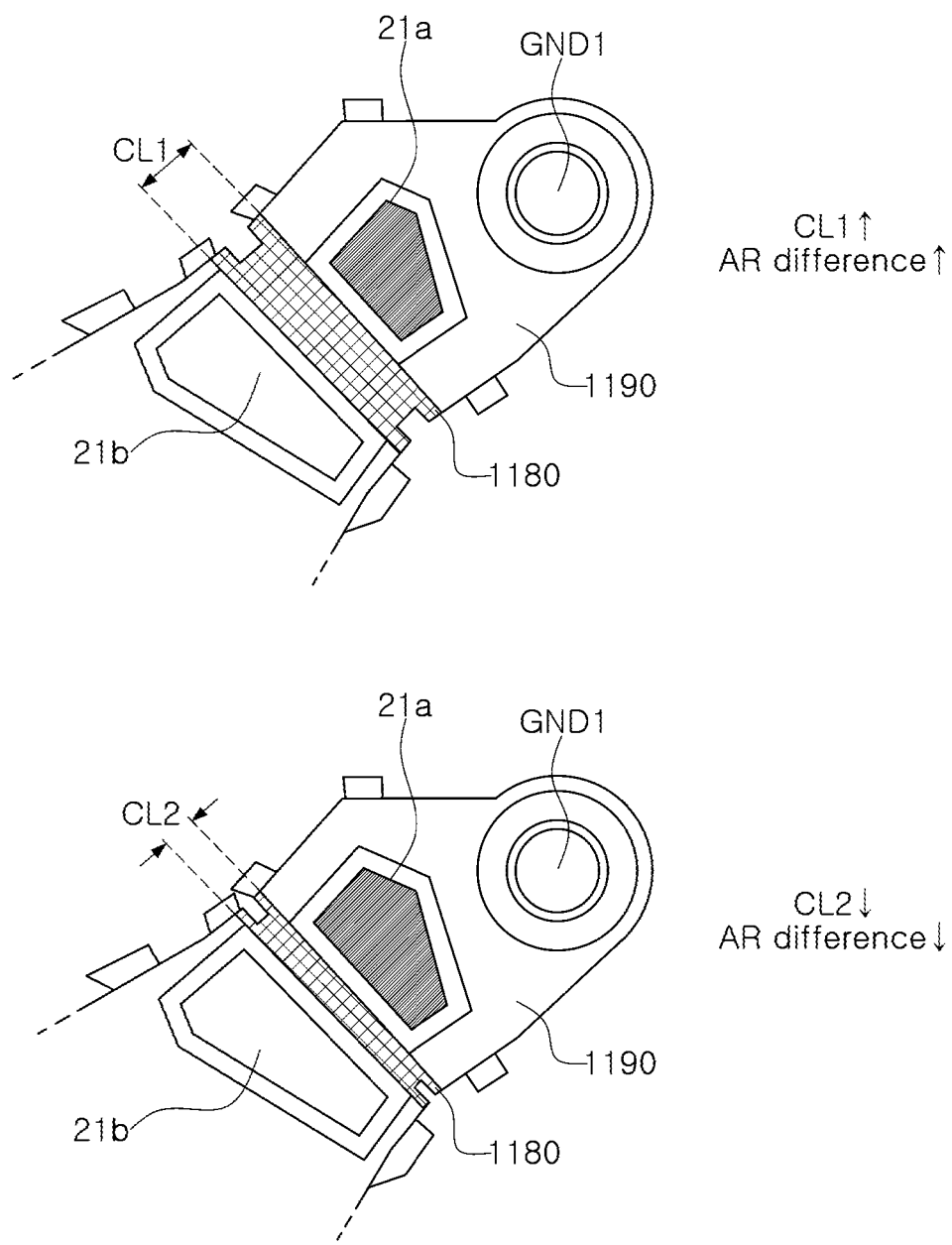
FIG. 5C is a view illustrating that an aspect ratio may be changed according to a connection length between a plurality of shunt acoustic resonators of a bulk acoustic resonator filter/package according to embodiments of the present disclosure.

FIG. 5C is a view illustrating that an aspect ratio may be changed according to a connection length between a plurality of shunt acoustic resonators of a bulk acoustic resonator filter/package according to embodiments of the present disclosure.

Referring to FIG. 5C, when a connection length CL1 between a plurality of shunt acoustic resonators 21a and 21b is long, an aspect ratio difference (AR difference) between the plurality of shunt acoustic resonators 21a and 21b may be large. When a connection length CL2 between the plurality of shunt acoustic resonators 21a and 21b is short, an aspect ratio difference (AR difference) between the plurality of shunt acoustic resonators 21a and 21b may be small. The connection lengths CL1 and CL2 may be lengths of portions of metal layers 1180 and 1190 located between the plurality of shunt acoustic resonators 21a and 21b.

Therefore, a parasitic impedance difference between the plurality of shunt acoustic resonators 21a and 21b may be canceled out. Depending on a design, the metal layer 1180 and the metal layer 1190 may be interchanged with each other, and the aspect ratio difference (AR difference) may be changed accordingly.

Figure 6A:
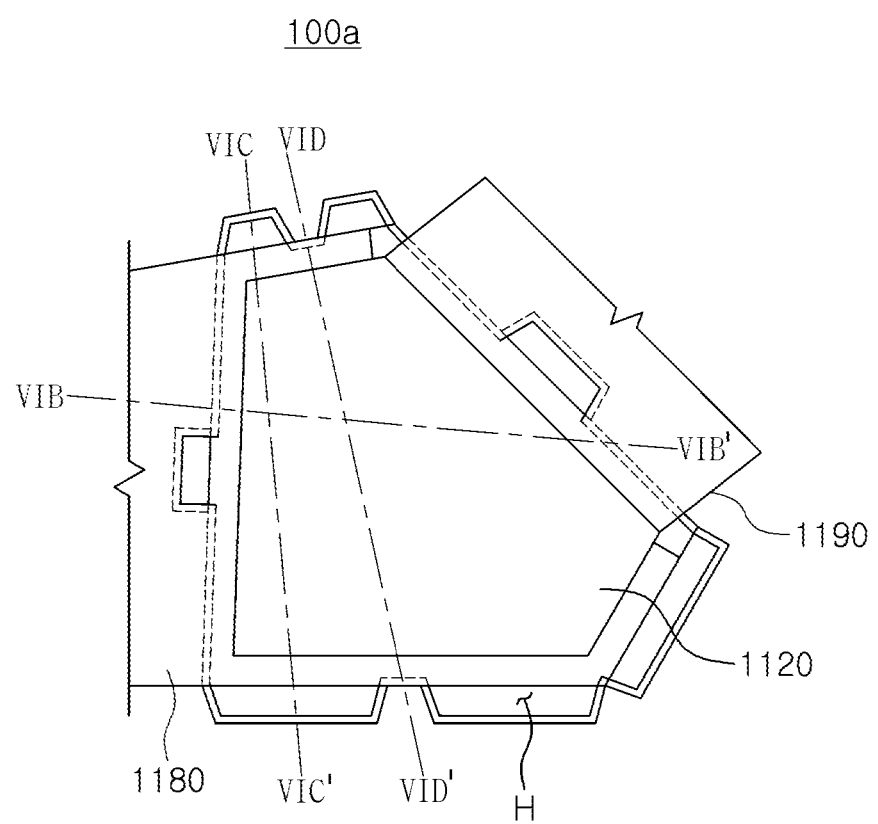
FIG. 6A is a plan view illustrating a specific structure of an acoustic resonator which may be included in a bulk acoustic resonator filter/package according to an embodiment of the present disclosure.
Figure 6B:
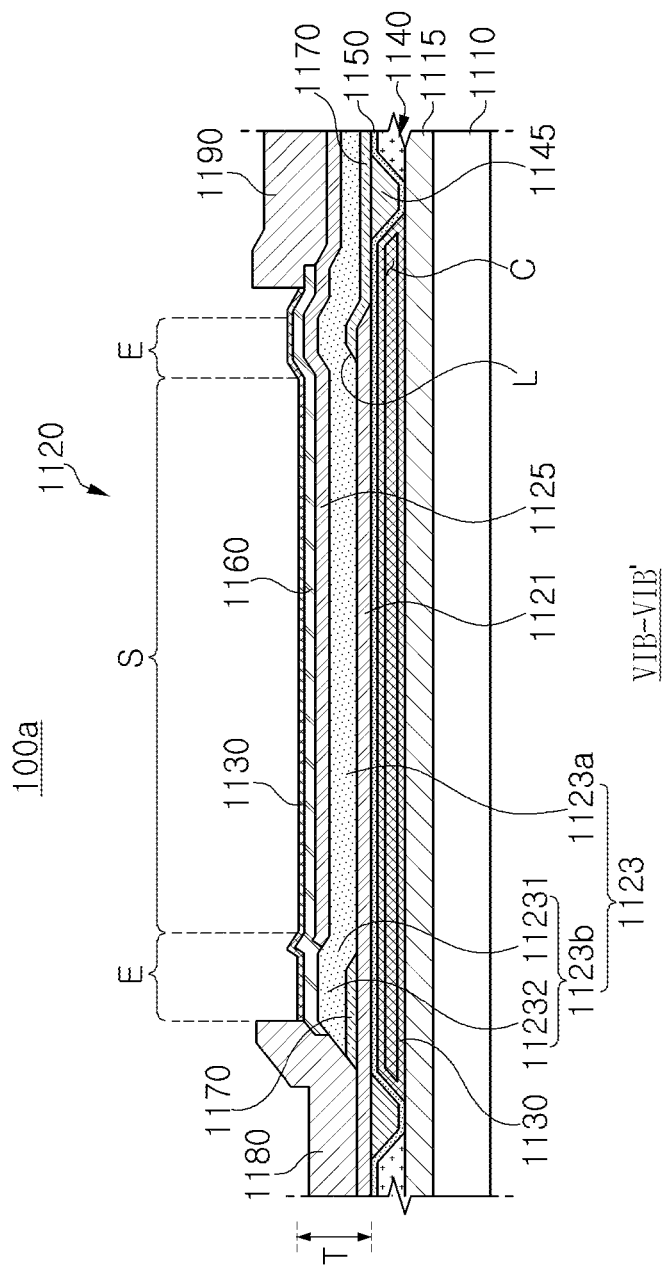
FIG. 6B is a cross-sectional view taken along the line VIB-VIB' of FIG. 6A.
Figure 6C:
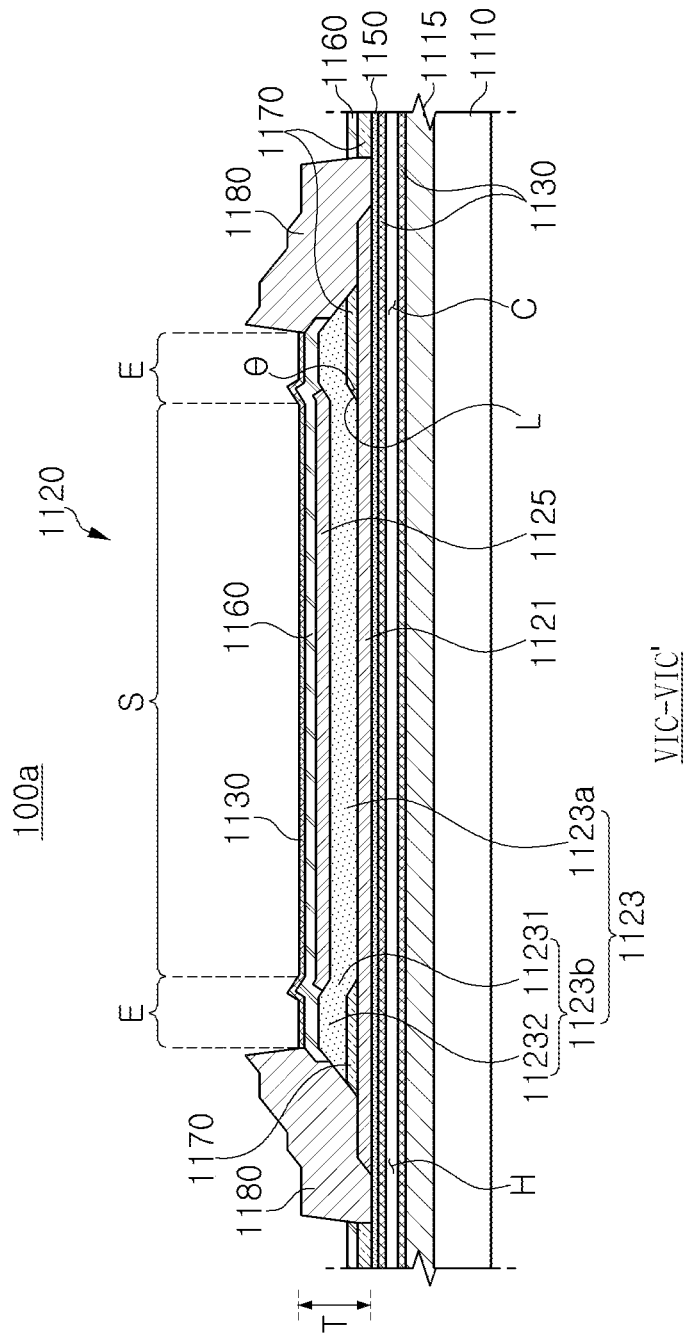
FIG. 6C is a cross-sectional view taken along the line VIC-VIC' of FIG. 6A.
Figure 6D:
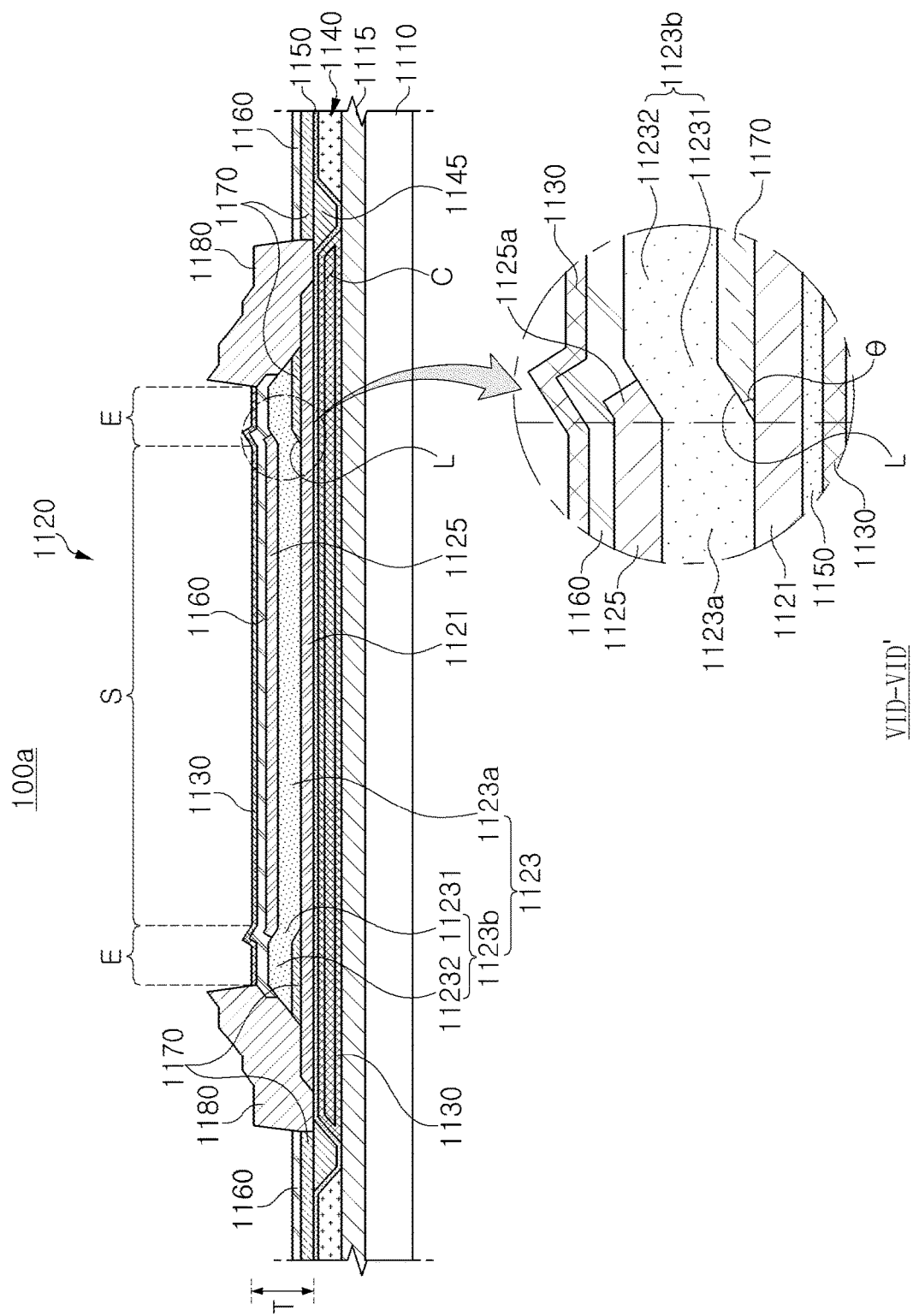
FIG. 6D is a cross-sectional view taken along the line VID-VID' of FIG. 6A.

FIG. 6A is a plan view illustrating a specific structure of an acoustic resonator which may be included in a bulk acoustic resonator filter/package according to an embodiment of the present disclosure, FIG. 6B is a cross-sectional view taken along the line VIB-VIB' in FIG. 6A, FIG. 6C is a cross-sectional view taken along the line VIC-VIC' in FIG. 6A, and FIG. 6D is a cross-sectional view taken along the line VID-VID' in FIG. 6A.

Referring to FIGS. 6A to 6D, an acoustic resonator 100a may include a substrate 1110, an insulating layer 1115, a resonance portion 1120, and a hydrophobic layer 1130.

The substrate 1110 may be a silicon substrate. In an example, a silicon wafer or a silicon-on-insulator (SOI) substrate may be used as the substrate 1110.

The insulating layer 1115 may be provided on an upper surface of the substrate 1110 to electrically isolate the substrate 1110 from the resonance portion 1120. Additionally, the insulating layer 1115 may prevent the substrate 1110 from being etched by an etching gas when a cavity C is formed during a method of manufacturing the acoustic resonator 100a.

In this case, the insulating layer 1115 may be formed of at least one of silicon dioxide ($SiO_2$), silicon nitride ($Si_3N_4$), aluminum oxide ($Al_2O_3$), or aluminum nitride (AlN), and may be formed by at least one of processes such as chemical vapor deposition, radio frequency (RF) magnetron sputtering, or evaporation.

A support layer 1140 may be formed on the insulating layer 1115, and may be disposed around the cavity C and an etch-stop portion 1145 to surround the cavity C and the etch-stop portion 1145 therein.

The cavity C may be formed as an empty space, and may be formed by removing a portion of a sacrificial layer formed during preparation of the support layer 1140, and the support layer 1140 may be formed as a remaining portion of the sacrificial layer.

The support layer 1140 may be formed of a material, such as polysilicon, a polymer, or other suitable material, which may be easily etched. However, the material of the support layer 1140 is not limited thereto.

The etch-stop portion 1145 may be disposed along a boundary of the cavity C. The etch-stop portion 1145 may be provided to prevent etching from proceeding beyond the cavity region during formation of the cavity C.

A membrane layer 1150 may be formed on the support layer 1140, and may define an upper surface of the cavity C. Therefore, the membrane layer 1150 may be formed of a material which may not be easily removed during the formation of the cavity C.

In an example, when a halide-based etching gas such as fluorine (F) or chlorine (Cl) is used to remove a portion of the support layer 1140 (for example, a cavity region), the membrane layer 1150 may be formed of a material having a low reactivity with the above-described etching gas. In this case, the membrane layer 1150 may include at least one of silicon dioxide ($SiO_2$), silicon nitride ($Si_3N_4$), or the like.

Moreover, the membrane layer 1150 may include a dielectric layer including at least one material of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), or zinc oxide (ZnO), or may include a metal layer including at least one material of aluminum (Al), nickel (Ni), chrome (Cr), platinum (Pt), gallium (Ga), or hafnium (Hf). However, the configuration of the present disclosure is not limited thereto.

The resonance portion 1120 may include a first electrode 1121, a piezoelectric layer 1123, and a second electrode 1125. In the resonance portion 1120, the first electrode 1121, the piezoelectric layer 1123, and the second electrode 1125 may be sequentially stacked in order starting with the first electrode 1121. Therefore, in the resonance portion 1120, the piezoelectric layer 1123 may be disposed between the first electrode 1121 and the second electrode 1125.

The resonance portion 1120 may be formed on the membrane layer 1150, such that the membrane layer 1150, the first electrode 1121, the piezoelectric layer 1123, and the second electrode 1125 are sequentially stacked to form the resonance portion 1120. The resonance portion 1120 may have an aspect ratio, which is an aspect ratio of an overlap region in which the first electrode 1121, the piezoelectric layer 1123, and the second electrode 1125 overlap.

The piezoelectric layer 1123 of the resonance portion 1120 may resonate according to a signal applied to the first electrode 1121 and the second electrode 1125 to generate a resonant frequency and an antiresonant frequency.

The resonance portion 1120 may be divided into a central portion S in which the first electrode 1121, the piezoelectric layer 1123, and the second electrode 1125 are stacked in a substantially flat manner, and an extension portion E with an insertion layer 1170 interposed between the first electrode 1121 and the piezoelectric layer 1123.

The central portion S is a region disposed in a center of the resonance portion 1120, and the extension portion E is a region disposed along a periphery of the central portion S of the resonance portion 1120. Therefore, the extension portion E is a region extending outwardly from the central portion S, and is a region formed in a continuous annular shape along the periphery of the central portion S. As necessary, the extension portion E may be formed in a discontinuous annular shape in which some regions are removed.

Therefore, as illustrated in FIG. 6B, in a cross-section in which the resonance portion 1120 is cut to cross the central portion S, the extension portion E may be disposed on opposite sides of the central portion S. Additionally, an insertion layer 1170 may be disposed on the extension portion E disposed at the opposite sides of the central portion S.

The insertion layer 1170 may have an inclined surface L having a thickness that increases in a direction away from the central portion S.

In the extension portion E, the piezoelectric layer 1123 and the second electrode 1125 may be disposed on the insertion layer 1170. Therefore, the piezoelectric layer 1123 and the second electrode 1125 disposed in the extension portion E may have inclined surfaces conforming to a shape of the insertion layer 1170.

The extension portion E may be defined as being included in the resonance portion 1120, such that resonance may also occur in the extension portion E. However, the present disclosure is not limited thereto. Depending on a structure of the extension portion E, resonance may not occur in the extension portion E, but may occur only in the central portion S.

The first electrode 1121 and the second electrode 1125 may be formed of a conductive material, for example, gold, molybdenum, ruthenium, iridium, aluminum, platinum, titanium, tungsten, palladium, tantalum, chromium, nickel, or a metal including at least one thereof. However, the present disclosure is not limited thereto.

In the resonance portion 1120, the first electrode 1121 may be formed to have an area larger than an area of the second electrode 1125, and a first metal layer 1180 may be formed on at least a portion of the first electrode 1121 along an external periphery of the first electrode 1121. Therefore, the first metal layer 1180 may be disposed to be spaced apart from the second electrode 1125 by a predetermined distance and to surround the resonance portion 1120.

Since the first electrode 1121 is disposed on the membrane layer 1150, the first electrode 1121 may be formed to be entirely planar. Since the second electrode 1125 may be disposed on the piezoelectric layer 1123, the second electrode 1125 may be bent to correspond to a shape of the piezoelectric layer 1123.

The first electrode 1121 may be implemented as either one of an input electrode and an output electrode that inputs and outputs an electrical signal such as a radio frequency (RF) signal.

The second electrode 1125 may be disposed in an entirety of the central portion S, and may be disposed in a portion of the extension portion E. The second electrode 1125 may be divided into a portion disposed on a piezoelectric portion 1123*a* of the piezoelectric layer 1123, and a portion disposed on a bent portion 1123*b* of the piezoelectric layer 1123.

In particular, the second electrode 1125 may be disposed to entirely cover the piezoelectric portion 1123*a* and partially cover an inclined portion 11231 of the piezoelectric layer 1123. Therefore, a portion (1125*a*, FIG. 6D) of the second electrode 1125 disposed in the extension portion E may be formed to have an area smaller than an area of an inclined surface of the inclined portion 11231, and a portion of the second electrode 1125 disposed in the resonance portion 1120 may be formed to have an area smaller than an area of the piezoelectric layer 1123.

Therefore, as illustrated in FIG. 6B, in a vertical cross-section in which the resonance portion 1120 is cut to cross the central portion S, an end of the second electrode 1125 may be disposed in the extension portion E. Moreover, at least a portion of the end of the second electrode 1125 disposed in the extension portion E may be disposed to overlap the insertion layer 1170. The term "overlap" means that a shape of the second electrode 1125, projected onto a plane, overlaps the insertion layer 1170 when the second electrode 1125 is projected onto the plane on which the insertion layer 1170 is disposed.

The second electrode 1125 may be used as either one of an input electrode and an output electrode that inputs and outputs an electrical signal such as a radio-frequency (RF) signal. For example, when the first electrode 1121 is used as an input electrode, the second electrode 1125 may be used as an output electrode. Alternatively, when the first electrode 1121 is used as an output electrode, the second electrode 1125 may be used as an input electrode.

As illustrated in FIG. 6D, when an end of the second electrode 1125 is disposed on the inclined portion 11231 of the piezoelectric layer 1123 to be described later, a local structure of an acoustic impedance of the resonance portion 1120 may be formed in a sparse/dense/sparse/dense structure from the central portion S to increase a reflective interface reflecting a lateral wave toward an interior of the resonance portion 1120. Therefore, most lateral waves may not flow out of the resonance portion 1120, but may be reflected to flow toward the interior of the resonance portion 1120, such that a performance of the acoustic resonator 100*a* may be improved.

The piezoelectric layer 1123 may be a portion converting electrical energy into mechanical energy in a form of elastic waves through a piezoelectric effect, and may be formed on the first electrode 1121 and the insertion layer 1170 to be described later.

Zinc oxide (ZnO), aluminum nitride (AlN), doped aluminum nitride, lead zirconate titanate, quartz, or other piezoelectric materials may be selectively used as a material of the piezoelectric layer 1123. In the case of doped aluminum nitride, a rare earth metal, a transition metal, or an alkaline earth metal may be further included. The rare earth metal may include at least one of scandium (Sc), erbium (Er), yttrium (Y), or lanthanum (La). The transition metal may include at least one of hafnium (Hf), titanium (Ti), zirconium (Zr), tantalum (Ta), or niobium (Nb). In addition, the alkaline earth metal may include magnesium (Mg). Amounts of elements doped into aluminum nitride (AlN) may be in a range of 0.1 to 30 at %, but are not limited thereto.

The piezoelectric layer 1123 may be formed from a material obtained by doping aluminum nitride (AlN) with scandium (Sc). In this case, a piezoelectric constant may be increased to increase $kt^2$ of the acoustic resonator 100*a*.

The piezoelectric layer 1123 may include a piezoelectric portion 1123*a* disposed in the central portion S, and a bent portion 1123*b* disposed in the extension portion E.

The piezoelectric portion 1123*a* may be a portion directly stacked on an upper surface of the first electrode 1121. Therefore, the piezoelectric portion 1123*a* may be interposed between the first electrode 1121 and the second electrode 1125 to be formed in a flat shape, together with the first electrode 1121 and the second electrode 1125.

The bent portion 1123*b* may be defined as a region extending outwardly from the piezoelectric portion 1123*a*, and disposed in the extension portion E.

The bent portion 1123*b* may be disposed on the insertion layer 1170 to be described later, and may be formed in a shape in which an upper surface thereof is raised along a shape of the insertion layer 1170. Therefore, the piezoelectric layer 1123 may be curved or bent on a boundary between the piezoelectric portion 1123*a* and the bent portion 1123*b*, and the bent portion 1123*b* may be raised to correspond to a thickness and a shape of the insertion layer 1170.

The bent portion 1123*b* may be divided into an inclined portion 11231 and an extension portion 11232.

The inclined portion 11231 may be a portion that is formed to be inclined along an inclined surface L of the insertion layer 1170 to be described later. The extension portion 11232 may be a portion extending outwardly from the inclined portion 11231.

The inclined portion 11231 may be formed to be parallel to the inclined surface L of the insertion layer 1170, and an angle of inclination of the inclined portion 11231 may be the same as an angle of inclination θ of the inclined surface L of the insertion layer 1170 (see the enlarged portion in FIG. 6D).

The insertion layer 1170 may be disposed along a surface formed by the membrane layer 1150, the first electrode 1121, and the etch-stop portion 1145. Therefore, the insertion layer 1170 may be partially disposed in the resonance portion 1120, and may be disposed between the first electrode 1121 and the piezoelectric layer 1123.

The insertion layer 1170 may be disposed around the central portion S to support the bent portion 1123b of the piezoelectric layer 1123. Therefore, the bent portion 1123b of the piezoelectric layer 1123 may be divided into an inclined portion 11231 and an extension portion 11232 disposed along a shape of the insertion layer 1170.

In an example, the insertion layer 1170 may be disposed in a region other than the central portion S. For example, the insertion layer 1170 may be disposed entirely in a region other than the central portion S on the substrate 1110, or may be disposed in some regions other than the central portion S on the substrate 1110.

The insertion layer 1170 may be formed to have a thickness increasing in a direction extending away from the central portion S. Therefore, the insertion layer 1170 may be formed to have a side surface disposed adjacent to the central portion S and including an inclined surface L having a predetermined inclination angle θ. In an example, the predetermined inclination angle θ may be formed to be 5 degrees or more to 70 degrees or less, but is not limited thereto.

The inclined portion 11231 of the piezoelectric layer 1123 may be formed along the inclined surface L of the insertion layer 1170, and thus may be formed at the same inclination angle as the inclined surface L of the insertion layer 1170. Therefore, the inclination angle of the inclined portion 11231 may also be formed to be 5 degrees or more to 70 degrees or less, but is not limited thereto, like the inclined surface L of the insertion layer 1170. Such a configuration may also be equally applied to the portion of the second electrode 1125 stacked on the inclined surface L of the insertion layer 1170.

The insertion layer 1170 may be formed of a dielectric material such as silicon oxide ($SiO_2$), aluminum nitride (AlN), aluminum oxide ($Al_2O_3$), silicon nitride ($Si_3N_4$), magnesium oxide (MgO), zirconium oxide ($ZrO_2$), lead zirconate titanate (PZT), gallium arsenic (GaAs), hafnium oxide ($HfO_2$), titanium oxide ($TiO_2$), zinc oxide (ZnO), or another suitable dielectric material, but may be formed of a material different from the material of the piezoelectric layer 1123.

Alternatively, the insertion layer 1170 may be formed of a metal material. When the acoustic resonator 100a is used for 5G communications, a large amount of heat may be generated by the resonance portion 1120, and thus the heat generated by the resonance portion 1120 should be evenly dissipated. The insertion layer 1170 may be formed of an aluminum alloy material containing scandium (Sc).

The resonance portion 1120 may be disposed to be spaced apart from the substrate 1110 through a cavity C formed as an empty space.

The cavity C may be formed by removing a portion of the support layer 1140 by supplying an etching gas (or an etching solution) to an inlet hole (H of FIG. 6A) in a process of manufacturing the acoustic resonator 100a.

Therefore, the cavity C may be a space having an upper surface (a ceiling surface) and a side surface (a wall surface) defined by the membrane layer 1150, and a bottom surface defined by the substrate 1110 or the insulating layer 1115. The membrane layer 1150 may be formed only on the upper surface (the ceiling surface) of the cavity C according to a sequence of the manufacturing method.

A protective layer 1160 may be disposed along a surface of the acoustic resonator 100a to protect the acoustic resonator 100a from an external environment. The protective layer 1160 may be disposed along a surface defined by the second electrode 1125 and the bent portion 1123b of the piezoelectric layer 1123.

The protective layer 1160 may be partially removed for frequency control in a final process of the manufacturing method. For example, a thickness of the protective layer 1160 may be adjusted through frequency trimming in the manufacturing method.

The protective layer 1160 may include any one of silicon oxide ($SiO_2$), silicon nitride ($Si_3N_4$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), zinc oxide (ZnO), amorphous silicon (a-Si), or polycrystalline silicon (p-Si), but the present disclosure is not limited thereto.

The first electrode 1121 and the second electrode 1125 may extend outwardly from the resonance portion 1120. Additionally, a first metal layer 1180 and a second metal layer 1190 may each be disposed on an upper surface of an extended portion of the resonance portion 1120.

The first metal layer 1180 and the second metal layer 1190 may be formed of any one material of gold (Au), a gold-tin (Au—Sn) alloy, copper (Cu), a copper-tin (Cu—Sn) alloy, aluminum (Al), or an aluminum alloy. The aluminum alloy may be an aluminum-germanium (Al—Ge) alloy or an aluminum-scandium (Al—Sc) alloy.

The first metal layer 1180 and the second metal layer 1190 may function as connection wirings electrically connecting the electrodes (e.g., 1121 and 1125) of the acoustic resonator 100a to electrodes of an adjacent acoustic resonator on the substrate 1110.

At least a portion of the first metal layer 1180 may be in contact with the protective layer 1160, and may be bonded to the first electrode 1121.

In the resonance portion 1120, the first electrode 1121 may be formed to have an area larger than an area of the second electrode 1125, and the first metal layer 1180 may be formed on a peripheral portion of the first electrode 1121.

Therefore, the first metal layer 1180 may be disposed along a periphery of the resonance portion 1120, and may be disposed to surround the second electrode 1125. However, the present disclosure is not limited thereto.

In the acoustic resonator 100a, the hydrophobic layer 1130 may be disposed on a surface of the protective layer 1160 and an internal wall of the cavity C. The hydrophobic layer 1130 may suppress adsorption of water and a hydroxyl group (OH group) to significantly reduce frequency variations, such that resonator performance may be maintained to be uniform.

The hydrophobic layer 1130 may be formed of a self-assembled monolayer (SAM) forming material, rather than a polymer. When the hydrophobic layer 1130 is formed of a polymer, the mass of the polymer may affect the resonance portion 1120. Since the hydrophobic layer 1130 may be formed of a self-assembled monolayer in the acoustic resonator 100a, a change in resonant frequency of the acoustic resonator 100a may be significantly reduced. Additionally, a thickness of the hydrophobic layer 1130, depending on a position in the cavity C, may be uniform.

The hydrophobic layer 1130 may be formed by vapor deposition of a precursor which may have hydrophobicity. In this case, the hydrophobic layer 1130 may be deposited as a monolayer having a thickness of 100 angstroms or less (in an example, several angstroms to several tens of angstroms). The precursor, which may have hydrophobicity, may be formed with a material in which a static contact angle with water is 90 degrees or more after deposition. In an example, the hydrophobic layer 1130 may contain a fluorine (F) component, and may include fluorine (F) and silicon (Si). In particular, a fluorocarbon having a silicon head may be used, but the present disclosure is not limited thereto.

To improve adhesion between the self-assembled monolayer forming the hydrophobic layer 1130 and the protective layer 1160, an adhesion layer (not illustrated) may be formed on the protective layer 1160 before the hydrophobic layer 1130 is formed.

The adhesion layer may be formed by vapor-depositing a precursor having a hydrophobic functional group on a surface of the protective layer 1160.

The precursor used for deposition of the adhesion layer may be a hydrocarbon having a silicon head or a siloxane having a silicon head, but is not limited thereto.

The hydrophobic layer 1130 may be formed after the first metal layer 1180 and the second metal layer 1190 are formed, and thus may be formed along surfaces of the protective layer 1160, the first metal layer 1180, and the second metal layer 1190.

The drawings illustrate an example in which the hydrophobic layer 1130 is not disposed on surfaces of the first metal layer 1180 and the second metal layer 1190, but the present disclosure is not limited thereto. As necessary, the hydrophobic layer 1130 may also be disposed on the surfaces of the first metal layer 1180 and the second metal layer 1190.

Moreover, the hydrophobic layer 1130 may be disposed not only on an upper surface of the protective layer 1160, but also on an internal surface of the cavity C.

The hydrophobic layer 1130, when formed in the cavity C, may be formed on the entirety of an internal wall forming the cavity C. Therefore, the hydrophobic layer 1130 may also be formed on a lower surface of the membrane layer 1150 forming a lower surface of the resonance portion 1120. In this case, adsorption of a hydroxyl group by a lower portion of the resonance portion 1120 may be suppressed.

The adsorption of the hydroxyl group occurs not only in the protective layer 1160, but also in the cavity C. Therefore, to significantly reduce mass loading caused by adsorption of the hydroxyl group, and a resulting drop in the resonant frequency of the acoustic resonator 100a, the adsorption of the hydroxyl group may be blocked in the protective layer 1160, as well as on an upper surface of the cavity C (a lower surface of the membrane layer 1150), for example, a lower surface of the resonance portion, by the hydrophobic layer 1130.

In addition, when the hydrophobic layer 1130 is formed on an upper surface and a lower surface or a side surface of the cavity C, an effect of suppressing occurrence of a stiction phenomenon, a phenomenon in which the resonance portion 1120 is adhered to the insulating layer 1115 due to surface tension in a wetting process or a cleaning process after formation of the cavity C, may be provided.

An example in which the hydrophobic layer 1130 is formed on the entirety of an internal wall of the cavity C has been described, but the present disclosure is not limited thereto. Alternatively, various modifications may be made, for example, the hydrophobic layer 1130 may only be formed on an upper surface of the cavity C, or the hydrophobic layer 1130 may only be formed on at least a portion of a lower surface and a side surface of the cavity C.

A ratio of thicknesses T of a plurality of shunt acoustic resonators of a bulk acoustic resonator filter/package according to an embodiment of the present disclosure in a Z direction may be closer to 1, compared to a ratio of aspect ratios of the plurality of shunt acoustic resonators. In this case, the thickness T may be defined as a thickness from the upper surface of the membrane layer 1150 to the upper surface of the hydrophobic layer 1130, and may affect a resonant frequency and/or an antiresonant frequency of the acoustic resonator. When resonant frequencies and/or antiresonant frequencies of the plurality of shunt acoustic resonators are substantially equal to each other, thicknesses T of the plurality of shunt acoustic resonators may be substantially equal to each other, and a ratio of the thicknesses T of the plurality of shunt acoustic resonators may be 1. For example, the thickness T may be measured by analysis using at least one of a transmission electron microscope (TEM), an atomic force microscope (AFM), a scanning electron microscope (SEM), an optical microscope, or a surface profiler.

Figure 6E:
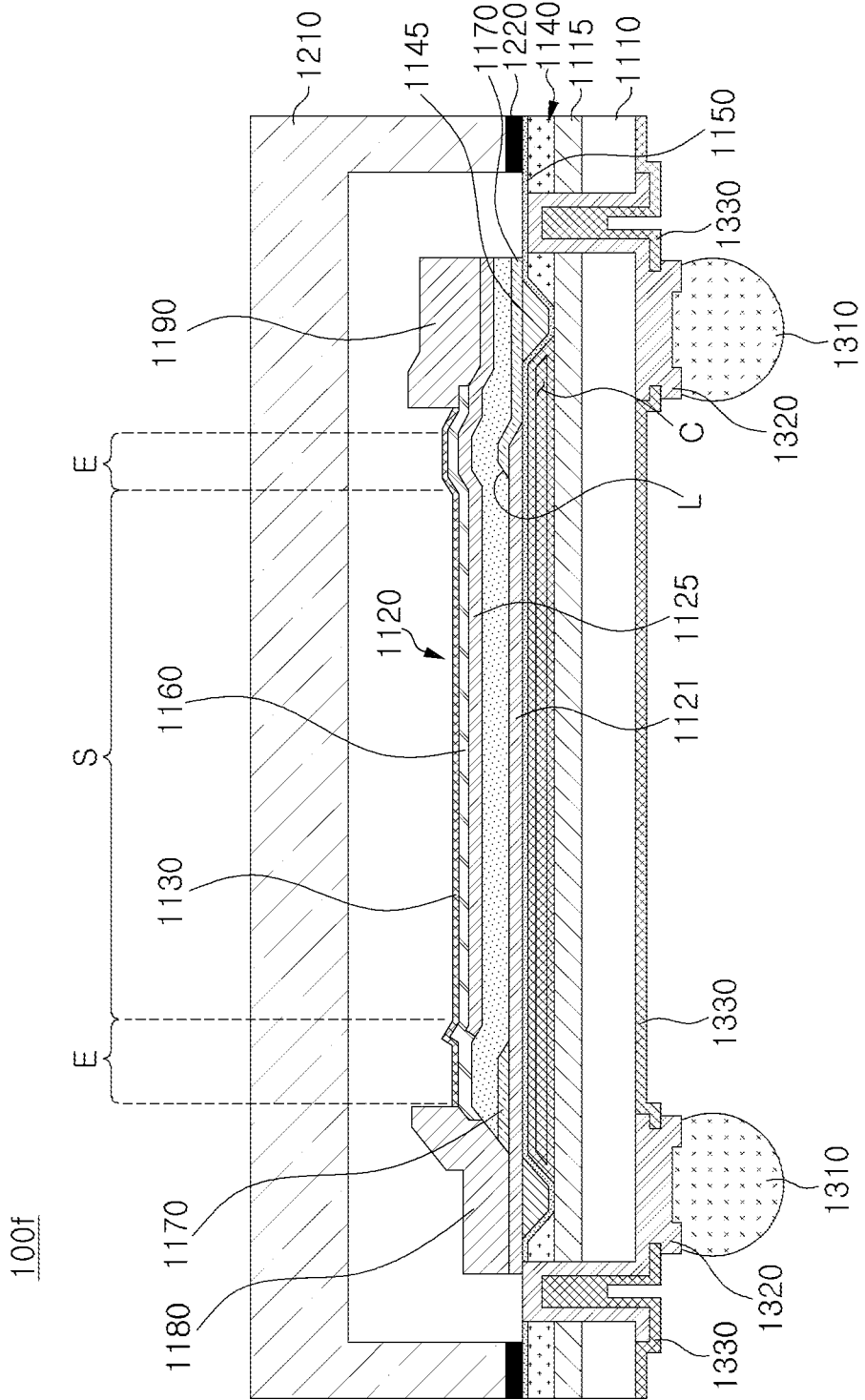
FIGS. 6E and 6F are cross-sectional views illustrating a structure for electrically connecting interior and exterior spaces of a bulk acoustic resonator filter/package according to embodiments of the present disclosure.
Figure 6F:
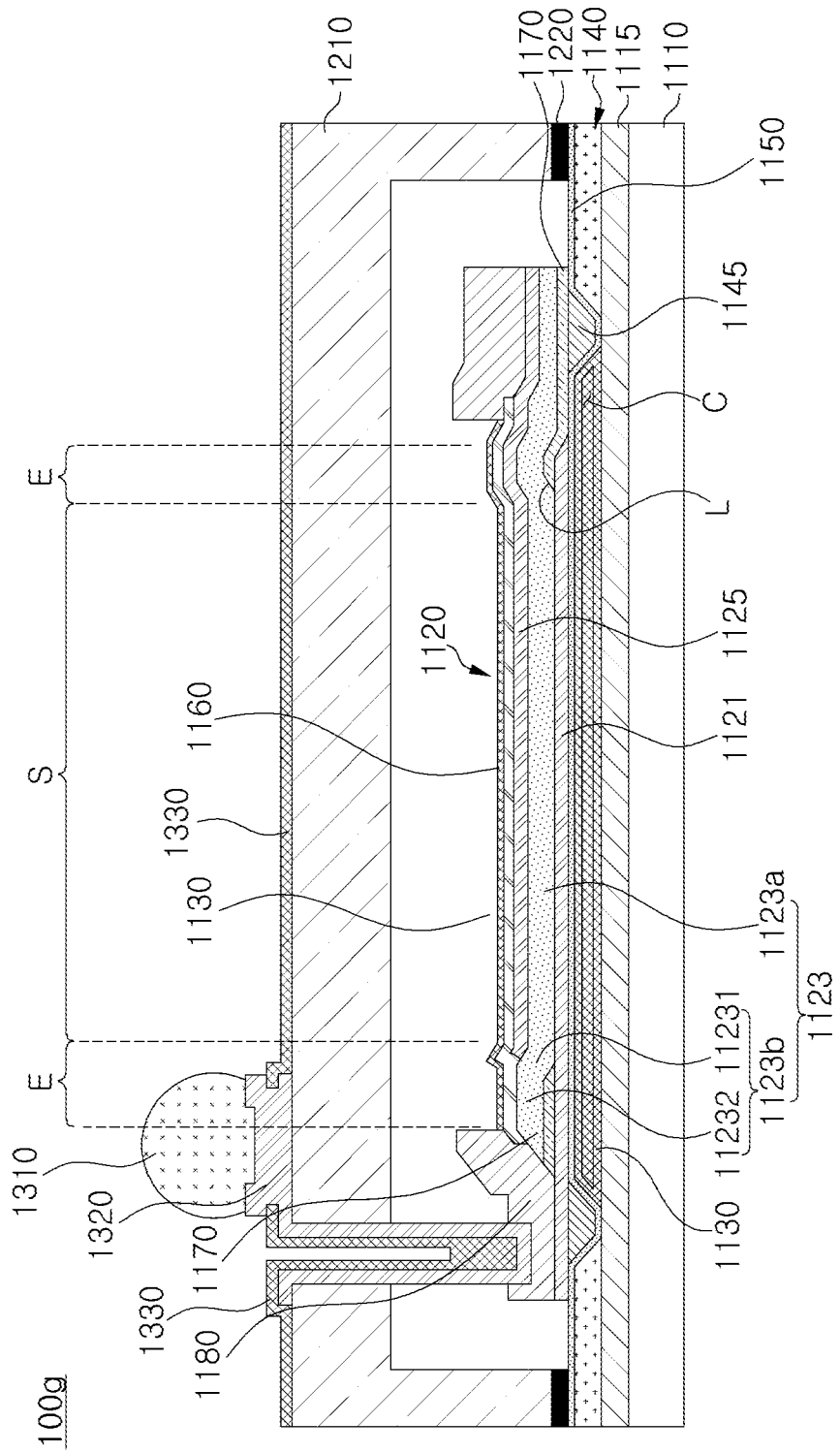

FIGS. 6E and 6F are cross-sectional views illustrating a structure for electrically connecting interior and exterior spaces of a bulk acoustic resonator filter/package according to embodiments of the present disclosure.

Referring to FIGS. 6E and 6F, bulk acoustic resonator packages 100f and 100g according to embodiments of the present disclosure may further include at least one of a hydrophobic layer 1130, a bump 1310, a connection pattern 1320, or a hydrophobic layer 1330.

The hydrophobic layer 1130 may be disposed between a resonance portion 1120 and a cap 1210, and may be more hydrophobic than the cap 1210. Therefore, adsorption of organic substances, moisture, or other foreign substances, which may be generated in a process of forming a bonding member 1220, by the resonance portion 1120 may be reduced, such that characteristics of the resonance portion 1120 may be further improved. In an example, the hydrophobic layer 1130 may be formed on an upper surface of the resonance portion 1120.

Referring to FIG. 6E, at least a portion of a connection pattern 1320 may pass through a substrate 1110, may be electrically connected to at least one of the first electrode 1131 or the second electrode 1125, and may be in contact with a hydrophobic layer 1330. Therefore, a resonance portion 1120 may be electrically connected to an external device outside the bulk acoustic resonator package 100f.

The hydrophobic layer 1330 may be disposed on a surface (for example, a lower surface) of the substrate 1110 opposing a surface (for example, an upper surface) of the substrate 1110 facing a cap 1210, and may be more hydrophobic than the substrate 1110. Therefore, adsorption of organic substances, moisture, or other foreign materials, which may be generated in a process of forming a bonding member 1220, by the connection pattern 1320 may be reduced, such that a transmission loss in the connection pattern 1320 may be further reduced.

Referring to FIG. 6F, at least a portion of a connection pattern 1320 may pass through a cap 1210, may be electrically connected to at least one of the first electrode 1121 or the second electrode 1125, and may be in contact with a hydrophobic layer 1330. Therefore, a resonance portion 1120 may be electrically connected to an external device outside the bulk acoustic resonator package 100g.

The hydrophobic layer 1330 may be disposed on a surface (for example, an upper surface) of the cap 1210 opposing a surface (for example, a lower surface) of the cap 1210 facing a substrate 1110, and may be more hydrophobic than the cap 1210. Therefore, adsorption of organic substances, moisture, or other foreign substances, which may be generated in a process of forming a bonding member 1220, by the connection pattern 1320 may be reduced, such that a transmission loss in the connection pattern 1320 may be further reduced.

In an example, in a state in which there is a hole in a portion of the substrate 1110 and/or the cap 1210, the connection pattern 1320 may be formed by a process of depositing, applying, or filling a conductive metal (for example, gold, copper, titanium-copper (Ti—Cu) alloy, or another suitable material) on a sidewall of the hole.

A process of forming a hole in a portion of the substrate 1110 and/or the cap 1210 may be omitted. In an example, the resonance portion 1120 may receive an electrical connection path by wire bonding.

A bump 1310 may have a structure supporting the bulk acoustic resonator packages 100f and 100g such that the bulk acoustic resonator packages 100f and 100g may be mounted on an external printed circuit board (PCB) on a lower side thereof. In an example, a portion of the connection pattern 1320 may have a pad shape contacting the bump 1310.

A bulk acoustic resonator filter and a bulk acoustic resonator package according to embodiments of the present disclosure may effectively improve performance versus size (e.g., loss characteristics, frequency limitation characteristics, maximum power characteristics, heat generation characteristics, linearity characteristics, attenuation characteristics, or other characteristics).

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and are not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator filter, comprising:
a series part comprising at least one series acoustic resonator electrically connected in series between a first radio frequency port and a second radio frequency port; and
a plurality of shunt acoustic resonators electrically connected to each other in series between a first node of the series part and a first ground port,
wherein an antiresonant frequency difference between the plurality of shunt acoustic resonators is less than a resonant frequency difference between the plurality of shunt acoustic resonators, and
wherein each of the plurality of shunt acoustic resonators comprises:
a resonance portion comprising a first electrode, a piezoelectric layer, and a second electrode stacked in a first direction; and
an overlap region in which the first electrode, the piezoelectric layer, and the second electrode overlap each other,
the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction, and
the aspect ratios of the plurality of shunt acoustic resonators comprise different aspect ratios that are different from each other.

2. The bulk acoustic resonator filter of claim 1, wherein a difference between the different aspect ratios of the plurality of shunt acoustic resonators generates the antiresonant frequency difference between the plurality of shunt acoustic resonators.

3. The bulk acoustic resonator filter of claim 1, wherein the plurality of shunt acoustic resonators are connected to each other through respective first electrodes or respective second electrodes, and
an aspect ratio difference between the plurality of shunt acoustic resonators changes proportionally based on a change in a connection length between the plurality of shunt acoustic resonators.

4. The bulk acoustic resonator filter of claim 1, wherein the aspect ratio of a shunt acoustic resonator electrically connected closest to the first ground port among the plurality of shunt acoustic resonators is lower than the aspect ratio of a shunt acoustic resonator electrically connected farther from the first ground port among the plurality of shunt acoustic resonators.

5. The bulk acoustic resonator filter of claim 4, wherein the aspect ratio of the shunt acoustic resonator electrically connected farther from the first ground port is about 2.4.

6. The bulk acoustic resonator filter of claim 1, wherein the aspect ratio of each of the plurality of shunt acoustic resonators is higher than 1.3 and 6.6 or lower.

7. The bulk acoustic resonator filter of claim 6, wherein the aspect ratio of each of the plurality of shunt acoustic resonators is higher than 1.3 and lower than 3.8.

8. The bulk acoustic resonator filter of claim 1, wherein each of the at least one series acoustic resonator comprises:
a resonance portion comprising a first electrode, a piezoelectric layer, and a second electrode stacked in the first direction, and
an overlap region in which the first electrode, the piezoelectric layer, and the second electrode overlap each other,
the overlap region of each of the at least one series acoustic resonator has an aspect ratio equal to a ratio between a longest length of the overlap region in an extension direction of a longest side of the overlap region and a longest length of the overlap region in a direction perpendicular to the extension direction, and
a symmetry of a shape of the overlap region of at least one shunt acoustic resonator among the plurality of shunt acoustic resonators is higher than a symmetry of a shape of the overlap region of at least one series acoustic resonator among the at least one series acoustic resonator.

9. The bulk acoustic resonator filter of claim 8, wherein an aspect ratio of the at least one shunt acoustic resonator among the plurality of shunt acoustic resonators is 4.8 or higher and 6.6 or lower.

10. The bulk acoustic resonator filter of claim 1, wherein symmetries of shapes of overlap regions of the plurality of shunt acoustic resonators comprise different symmetries that are different from each other, and
an aspect ratio of a shunt acoustic resonator having a higher symmetry among the plurality of shunt acoustic resonators is higher than an aspect ratio of a shunt acoustic resonator having a lower symmetry among the plurality of acoustic resonators.

11. The bulk acoustic resonator filter of claim 10, wherein the aspect ratio of the shunt acoustic resonator having the higher symmetry is 4.8 or higher and 6.6 or lower, and
the aspect ratio of the shunt acoustic resonator having the lower symmetry is higher than 1.3 and lower than 3.8.

12. The bulk acoustic resonator filter of claim 1, wherein the plurality of shunt acoustic resonators comprise a first shunt acoustic resonator, a second shunt acoustic resonator, and a third shunt acoustic resonator electrically connected to each other in series,
the first and second shunt acoustic resonators are connected to each other through respective first electrodes or respective second electrodes,
the second and third shunt acoustic resonators are connected to each other through respective first electrodes or respective second electrodes, and
an aspect ratio difference between the first and second shunt acoustic resonators is different from an aspect ratio difference between the second and third shunt acoustic resonators.

13. The bulk acoustic resonator filter of claim 1, wherein the plurality of shunt acoustic resonators comprise a first shunt acoustic resonator and a second shunt acoustic resonator electrically connected to each other in series between the first node of the series part and the first ground port,
the bulk acoustic resonator filter further comprises a third shunt acoustic resonator and a fourth shunt acoustic resonator electrically connected to each other in series between the first node of the series part and the first ground port,
each of the third and fourth shunt acoustic resonators comprises:
a resonance portion comprising a first electrode, a piezoelectric layer, and a second electrode stacked in the first direction, and
an overlap region in which the first electrode, the piezoelectric layer, and the second electrode overlap each other,
the overlap region of each of the third and fourth shunt acoustic resonators has an aspect ratio equal to a ratio between a longest length of the overlap region in an extension direction of a longest side of the overlap region and a longest length of the overlap region in a direction perpendicular to the extension direction, and
the first and second shunt acoustic resonators electrically connected to each other in series are electrically connected in parallel with the third and fourth shunt acoustic resonators electrically connected to each other in series.

14. The bulk acoustic resonator filter of claim 13, one shunt acoustic resonator among the first and third shunt acoustic resonators is electrically connected to the first ground port through the first electrode of the one shunt acoustic resonator, and another shunt acoustic resonator among the first and third shunt acoustic resonators is electrically connected to the first ground port through the second electrode of the other shunt acoustic resonator.

15. The bulk acoustic resonator filter of claim 14, wherein aspect ratios of the third and fourth shunt acoustic resonators are different from each other, and
an aspect ratio difference between the first and second shunt acoustic resonators is different from an aspect ratio difference between the third and fourth shunt acoustic resonators.

16. The bulk acoustic resonator filter of claim 13, further comprising a fifth shunt acoustic resonator and a sixth shunt acoustic resonator electrically connected to each other in series between a second node of the series part and a second ground port,
each of the fifth and sixth shunt acoustic resonators comprises:
a resonance portion comprising a first electrode, a piezoelectric layer, and a second electrode stacked in the first direction, and
an overlap region in which the first electrode, the piezoelectric layer, and the second electrode overlap each other,
the overlap region of each of the fifth and sixth shunt acoustic resonators has an aspect ratio equal to a ratio between a longest length of the overlap region in an extension direction of a longest side of the overlap region and a longest length of the overlap region in a direction perpendicular to the extension direction,
the at least one series acoustic resonator comprises a series acoustic resonator electrically connected between the first and second nodes,
the first and third shunt acoustic resonators are electrically connected closer to the first ground port compared to the second and fourth shunt acoustic resonators,
the fifth shunt acoustic resonator is electrically connected closer to the second ground port compared to the sixth shunt acoustic resonator,
a size of the overlap region of each of the first and third shunt acoustic resonators is different from a size of the overlap region of the fifth shunt acoustic resonator, and
a size of the overlap region of each of the second and fourth shunt acoustic resonators is different from a size of the overlap region of the sixth shunt acoustic resonator.

17. A bulk acoustic resonator filter, comprising:
a series part comprising at least one series acoustic resonator electrically connected in series between a first radio frequency port and a second radio frequency port; and
a shunt part comprising a plurality of shunt acoustic resonators electrically connected between the series part and a ground,
wherein an antiresonant frequency difference between the plurality of shunt acoustic resonators is less than a resonant frequency difference between the plurality of shunt acoustic resonators, and
wherein each of the plurality of shunt acoustic resonators comprises:
a resonance portion comprising a first electrode, a piezoelectric layer, and a second electrode stacked in a first direction; and an overlap region in which the first electrode, the piezoelectric layer, and the second electrode overlap each other, the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction, a first portion of the plurality of shunt acoustic resonators are electrically connected to the ground through the first electrode, and a second portion of the plurality of shunt acoustic resonators are electrically connected to the ground through the second electrode, and an aspect ratio of the first portion of the plurality of shunt acoustic resonators electrically connected to the ground through the first electrode is different from an aspect ratio of the second portion of the plurality of shunt acoustic resonators electrically connected to the ground through the second electrode.

18. The bulk acoustic resonator filter of claim 17, wherein a difference between the aspect ratio of the first portion of the plurality of shunt acoustic resonators electrically connected to the ground through the first electrode and the aspect ratio of the second portion of the plurality of shunt acoustic resonators electrically connected to the ground through the second electrode generates the antiresonant frequency difference between the plurality of shunt acoustic resonators.

19. The bulk acoustic resonator filter of claim 17, wherein an antiresonant frequency difference between the first portion of the plurality of shunt acoustic resonators electrically connected to the ground through the first electrode and the second portion of the plurality of shunt acoustic resonators electrically connected to the ground through the second electrode is smaller than a resonant frequency difference between the first portion of the plurality of shunt acoustic resonators electrically connected to the ground through the first electrode and the second portion of the plurality of shunt acoustic resonators electrically connected to the ground through the second electrode.

20. The bulk acoustic resonator filter of claim 17, wherein a resonant frequency of the at least one series acoustic resonator is higher than a resonant frequency of each of the plurality of shunt acoustic resonators, and a resonant frequency difference between the first portion of the plurality of shunt acoustic resonators electrically connected to the ground through the first electrode and the second portion of the plurality of shunt acoustic resonators electrically connected to the ground through the second electrode is smaller than a resonant frequency difference between a highest resonant frequency among the resonant frequencies of the plurality of shunt acoustic resonators and the resonant frequency of the at least one series acoustic resonator.

21. The bulk acoustic resonator filter of claim 17, wherein the first portion of the plurality of shunt acoustic resonators electrically connected to the ground through the first electrode and the second portion of the plurality of shunt acoustic resonators electrically connected to the ground through the second electrode are electrically connected between a first node of the series part and a ground port.

22. A bulk acoustic resonator package, comprising:
a substrate;
a cap facing the substrate;
a plurality of acoustic resonators each comprising a first electrode, a piezoelectric layer, and a second electrode stacked in a first direction extending from the substrate toward the cap and disposed between the substrate and the cap;
a metal layer connecting the plurality of acoustic resonators to each other; and
a bonding member surrounding the plurality of acoustic resonators in a circumferential direction perpendicular to the first direction and bonding the cap to the substrate,
wherein an antiresonant frequency difference between the plurality of acoustic resonators is less than a resonant frequency difference between the plurality of acoustic resonators, and
wherein each of the plurality of acoustic resonators comprises:
a resonance portion in which the first electrode, the piezoelectric layer, and the second electrode are stacked in the first direction; and
an overlap region in which the first electrode, the piezoelectric layer, and the second electrode overlap each other,
the overlap region of each of the plurality of acoustic resonators has an aspect ratio equal to a ratio between a longest length of the overlap region in an extension direction of a longest side of the overlap region and a longest length of the overlap region in a direction perpendicular to the extension direction, and
an aspect ratio of an acoustic resonator disposed closer to the bonding member among the plurality of acoustic resonators is lower than aspect ratios of other acoustic resonators disposed farther from the bonding member among the plurality of acoustic resonators.

23. The bulk acoustic resonator package of claim 22, wherein an aspect ratio difference between two acoustic resonators among the plurality of acoustic resonators changes based on a change in a connection length of the metal layer connecting the two acoustic resonators to each other.

24. The bulk acoustic resonator package of claim 22, wherein an aspect ratio difference between two acoustic resonators among the plurality of acoustic resonators changes proportionally based on a change in a separation distance between the metal layer connecting the two acoustic resonators to each other and the bonding member.

25. The bulk acoustic resonator package of claim 22, wherein the plurality of acoustic resonators comprise a first acoustic resonator, a second acoustic resonator, a third acoustic resonator, and a fourth acoustic resonator,
the first and second acoustic resonators are connected to each other through a first portion of the metal layer,
the third and fourth acoustic resonators are connected to each other through a second portion of the metal layer,
a connection length of the first portion of the metal layer connecting the first and second acoustic resonators to each other is longer than a connection length of the second portion of the metal layer connecting the third and fourth acoustic resonators to each other, and
an aspect ratio difference between the first and second acoustic resonators is greater than an aspect ratio difference between the third and fourth acoustic resonators.

26. The bulk acoustic resonator package of claim 22, wherein the plurality of acoustic resonators comprise a first acoustic resonator, a second acoustic resonator, a third acoustic resonator, and a fourth acoustic resonator,
- the first and second acoustic resonators are connected to each other through a first portion of the metal layer,
- the third and fourth acoustic resonators are connected to each other through a second portion of the metal layer,
- a separation distance between the first portion of the metal layer connecting the first and second acoustic resonators to each other and the bonding member is shorter than a separation distance between the second portion of the metal layer connecting the third and fourth acoustic resonators to each other and the bonding member, and
- an aspect ratio difference between the first and second acoustic resonators is greater than an aspect ratio difference between the third and fourth acoustic resonators.

27. The bulk acoustic resonator package of claim 22, wherein the plurality of acoustic resonators comprise a first acoustic resonator, a second acoustic resonator, a third acoustic resonator, and a fourth acoustic resonator,
- the first and second acoustic resonators are connected to each other through a first portion of the metal layer,
- the third and fourth acoustic resonators are connected to each other through a second portion of the metal layer,
- the first portion of the metal layer connecting the first and second acoustic resonators to each other and the second portion of the metal layer connecting the third and fourth acoustic resonators to each other are disposed at different heights relative to the substrate, and
- aspect ratios of the first and second acoustic resonators are different from each other.

28. The bulk acoustic resonator package of claim 22, wherein the plurality of acoustic resonators comprise a first acoustic resonator, a second acoustic resonator, and a third acoustic resonator electrically connected to each other in series,
- the first acoustic resonator is closest to the bonding member among the first acoustic resonator, the second acoustic resonator, and the third acoustic resonator, and
- an aspect ratio difference between the first and second acoustic resonators is greater than an aspect ratio difference between the second and third acoustic resonators.

29. The bulk acoustic resonator package of claim 22, further comprising a first radio frequency port and a second radio frequency port to which the plurality of acoustic resonators are electrically connected by the metal layer,
- wherein the first radio frequency port is disposed near a first side of the substrate,
- the second radio frequency port is disposed near a second side of the substrate, and an acoustic resonator disposed closer to a third side of the substrate among the plurality of acoustic resonators has a lower aspect ratio than other acoustic resonators disposed farther from the third side of the substrate among the plurality of acoustic resonators.

30. The bulk acoustic resonator package of claim 22, further comprising a ground port to which the plurality of acoustic resonators are electrically connected by the metal layer,
- wherein an acoustic resonator having a lower aspect ratio among the plurality of acoustic resonators is electrically connected closer to the ground port than other acoustic resonators electrically connected farther from the ground port among the plurality of acoustic resonators.

31. The bulk acoustic resonator package of claim 22, wherein the bonding member comprises a conductive ring.

32. The bulk acoustic resonator package of claim 31, further comprising a shielding layer disposed on a surface of the cap facing the plurality of acoustic resonators and electrically connected to the bonding member.

33. A bulk acoustic resonator, comprising:
- a series part comprising at least one series acoustic resonator electrically connected in series between a first radio frequency port and a second radio frequency port; and
- a plurality of shunt acoustic resonators electrically connected to each other between a node of the series part and a ground port,
- wherein an antiresonant frequency difference between the plurality of shunt acoustic resonators is less than a resonant frequency difference between the plurality of shunt acoustic resonators, and
- wherein each of the plurality of shunt acoustic resonators comprises:
  - a resonance portion comprising a first electrode, a piezoelectric layer, and a second electrode stacked in a first direction; and
  - an overlap region in which the first electrode, the piezoelectric layer, and the second electrode overlap each other,
- the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction,
- the bulk acoustic resonator further comprises:
  - a first metal layer electrically connected to the first electrodes of the plurality of shunt acoustic resonators; and
  - a second metal layer electrically connected to the second electrodes of the plurality of shunt acoustic resonators,
- the plurality of shunt acoustic resonators comprise a first shunt acoustic resonator and a second shunt acoustic resonator electrically connected to each other in an anti-series connection in which the second metal layer electrically connects the second electrode of the first shunt acoustic resonator to the ground port, and the first metal layer electrically connects the first electrode of the second shunt acoustic resonator to the first electrode of the first shunt acoustic resonator, and
- the aspect ratio of the second shunt acoustic resonator is different from the aspect ratio of the first shunt acoustic resonator.

34. The bulk acoustic resonator filter of claim 33, wherein a difference between the aspect ratios of the first and second shunt acoustic resonators offsets a difference between parasitic impedances of the first and second shunt acoustic resonators.

35. The bulk acoustic resonator of claim 34, wherein the aspect ratio of the second shunt acoustic resonator is higher than the aspect ratio of the first shunt acoustic resonator.

36. The bulk acoustic resonator of claim 34, wherein the aspect ratio of the second shunt acoustic resonator is lower than the aspect ratio of the first shunt acoustic resonator.

37. The bulk acoustic resonator filter of claim 33, wherein the plurality of shunt acoustic resonators further comprise a third shunt acoustic resonator and a fourth shunt acoustic resonator electrically connected to each other in an anti-series connection in which a portion of the first metal layer electrically connects the first electrode of the third shunt acoustic resonator to the second metal layer and the second metal layer electrically connects the portion of the first metal layer to the ground port, and the second metal layer electrically connects the second electrode of the fourth shunt acoustic resonator to the second electrode of the third shunt acoustic resonator.

38. A bulk acoustic resonator, comprising:
- a series part comprising at least one series acoustic resonator electrically connected in series between a first radio frequency port and a second radio frequency port; and
- a plurality of shunt acoustic resonators electrically connected to each other in parallel between a first node of the series part and a first ground port,
- wherein an antiresonant frequency difference between the plurality of shunt acoustic resonators is less than a resonant frequency difference between the plurality of shunt acoustic resonators, and
- wherein each of the plurality of shunt acoustic resonators comprises:
  - a resonance portion comprising a first electrode, a piezoelectric layer, and a second electrode stacked in a first direction; and
  - an overlap region in which the first electrode, the piezoelectric layer, and the second electrode overlap each other,
- the overlap region of each of the plurality of shunt acoustic resonators has an aspect ratio equal to a ratio between a longest length of the overlap region in an extension direction of a longest side of the overlap region and a longest length of the overlap region in a direction perpendicular to the extension direction,
- the bulk acoustic resonator further comprises:
  - a first metal layer electrically connected to the first electrodes of the plurality of shunt acoustic resonators; and
  - a second metal layer electrically connected to the second electrodes of the plurality of shunt acoustic resonators,
  - the plurality of shunt acoustic resonators comprise a first shunt acoustic resonator and a second shunt acoustic resonator electrically connected to each other in an anti-parallel connection in which the second metal layer electrically connects the second electrode of the first shunt acoustic resonator to the first ground port, and a portion of the first metal layer electrically connects the first electrode of the second shunt acoustic resonator to the second metal layer and the second metal layer electrically connects the portion of the first metal layer to the first ground port, and
  - the aspect ratio of the second shunt acoustic resonator is different from the aspect ratio of the first shunt acoustic resonator.

39. The bulk acoustic resonator filter of claim 38, wherein a difference between the aspect ratios of the first and second shunt acoustic resonators offsets a difference between parasitic impedances of the first and second shunt acoustic resonators.

40. The bulk acoustic resonator of claim 39, wherein the aspect ratio of the second shunt acoustic resonator is higher than the aspect ratio of the first shunt acoustic resonator.

41. The bulk acoustic resonator of claim 39, further comprising a second plurality of shunt acoustic resonators electrically connected to each other in series between a second node of the series part and a second ground port,
- wherein each of the second plurality of shunt acoustic resonators comprises:
  - a resonance portion comprising a first electrode, a piezoelectric layer, and a second electrode stacked in the first direction; and
  - an overlap region in which the first electrode, the piezoelectric layer, and the second electrode overlap each other,
- the overlap region of each of the second plurality of shunt acoustic resonators has an aspect ratio equal to a ratio between a longest length of the overlap region in an extension direction of a longest side of the overlap region and a longest length of the overlap region in a direction perpendicular to the extension direction,
- the at least one series acoustic resonator comprises a series acoustic resonator electrically connected between the first and second nodes,
- the first metal layer is further electrically connected to the first electrodes of the second plurality of shunt acoustic resonators,
- the second metal layer is further electrically connected to the second electrodes of the second plurality of shunt acoustic resonators,
- the second plurality of shunt acoustic resonators comprise a third shunt acoustic resonator and a fourth shunt acoustic resonator electrically connected to each other in an anti-series connection in which the second metal layer electrically connects the second electrode of the third shunt acoustic resonator to the second ground port, and the first metal layer electrically connects the first electrode of the fourth shunt acoustic resonator to the first electrode of the third shunt acoustic resonator, and
- the aspect ratio of the fourth shunt acoustic resonator is equal to or substantially equal to the aspect ratio of the third shunt acoustic resonator.

* * * * *